(12) United States Patent
Chang et al.

(10) Patent No.: US 12,513,951 B2
(45) Date of Patent: Dec. 30, 2025

(54) GATE STRUCTURES IN SEMICONDUCTOR DEVICES

(71) Applicant: Taiwan Semiconductor Manufacturing Company, Ltd., Hsinchu (TW)

(72) Inventors: Hsiang-Pi Chang, New Taipei (TW); Huang-Lin Chao, Hillsboro, OR (US); Chung-Liang Cheng, Changhua County (TW); Pinyen Lin, Rochester, NY (US); Chun-Chun Lin, Hsinchu (TW); Tzu-Li Lee, Huwei (TW); Yu-Chia Liang, Hsinchu (TW); Duen-Huei Hou, Hsinchu (TW); Wen-Chung Liu, Hsinchu (TW); Chun-I Wu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 795 days.

(21) Appl. No.: 17/701,402

(22) Filed: Mar. 22, 2022

(65) Prior Publication Data
US 2023/0040346 A1 Feb. 9, 2023

Related U.S. Application Data

(60) Provisional application No. 63/229,207, filed on Aug. 4, 2021.

(51) Int. Cl.
| | |
|---|---|
| H10D 62/10 | (2025.01) |
| H10D 30/01 | (2025.01) |
| H10D 30/67 | (2025.01) |

(52) U.S. Cl.
CPC ........ *H10D 62/118* (2025.01); *H10D 30/031* (2025.01); *H10D 30/6735* (2025.01); *H10D 30/6755* (2025.01); *H10D 30/6757* (2025.01)

(58) Field of Classification Search
None
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |

(Continued)

FOREIGN PATENT DOCUMENTS

TW 202013519 A 4/2020

*Primary Examiner* — Jessica S Manno
*Assistant Examiner* — Christopher A. Schodde
(74) *Attorney, Agent, or Firm* — Sterne, Kessler, Goldstein & Fox P.L.L.C.

(57) ABSTRACT

A semiconductor device with different configurations of gate structures and a method of fabricating the same are disclosed. The semiconductor device includes a first gate structure and a second gate structure. The first gate structure includes a first interfacial oxide (IO) layer, a first high-K (HK) dielectric layer disposed on the first interfacial oxide layer, and a first dipole layer disposed at an interface between the first IL layer and the first HK dielectric layer. The HK dielectric layer includes a rare-earth metal dopant or an alkali metal dopant. The second gate structure includes a second IL layer, a second HK dielectric layer disposed on the second IL layer, and a second dipole layer disposed at an interface between the second IL layer and the second HK dielectric layer. The second HK dielectric layer includes a transition metal dopant and the rare-earth metal dopant or the alkali metal dopant.

20 Claims, 40 Drawing Sheets

FIG. 1F

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 11,502,080 B2 | 11/2022 | Tsai et al. |
| 2009/0302370 A1* | 12/2009 | Guha .................. H10D 64/691 438/591 |
| 2015/0325684 A1 | 11/2015 | Xu et al. |
| 2016/0148934 A1 | 5/2016 | Ji et al. |
| 2016/0240652 A1 | 8/2016 | Ching et al. |
| 2018/0226300 A1* | 8/2018 | Song .................... H01L 29/517 |
| 2020/0119019 A1 | 4/2020 | Tsai et al. |
| 2021/0098457 A1* | 4/2021 | Cheng ................ H10D 84/038 |
| 2021/0126102 A1* | 4/2021 | Nakjin ............... H10D 30/6735 |
| 2022/0093648 A1* | 3/2022 | Lavric ............... H01L 29/66439 |
| 2022/0199796 A1* | 6/2022 | Zhang .................. H10D 84/83 |
| 2022/0238680 A1* | 7/2022 | Hung ................ H10D 30/6735 |
| 2022/0384469 A1* | 12/2022 | Yang ................ H10D 84/0135 |

\* cited by examiner

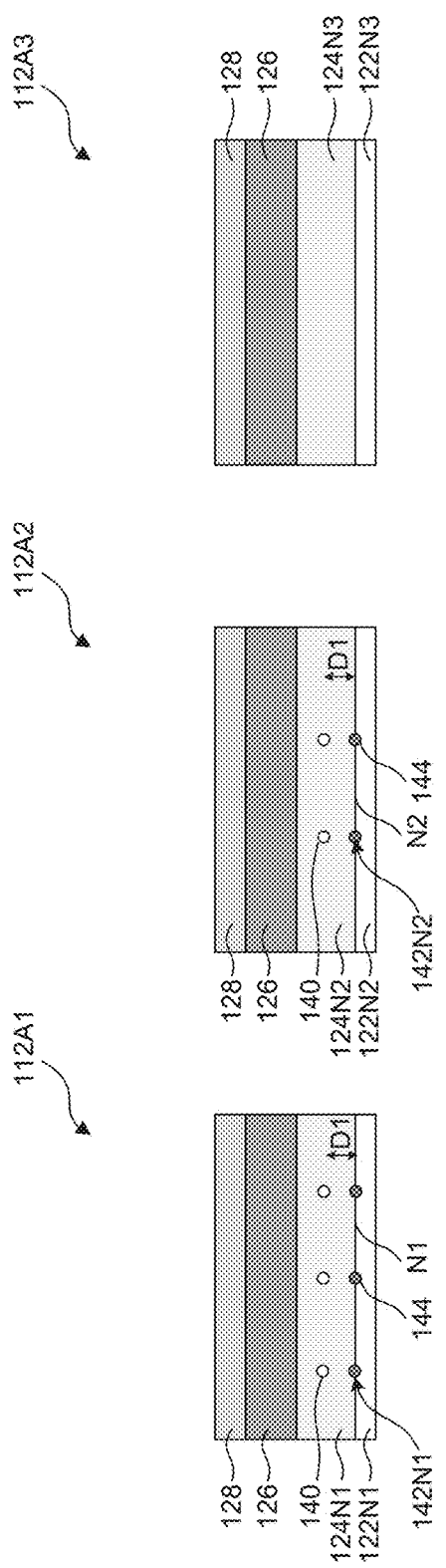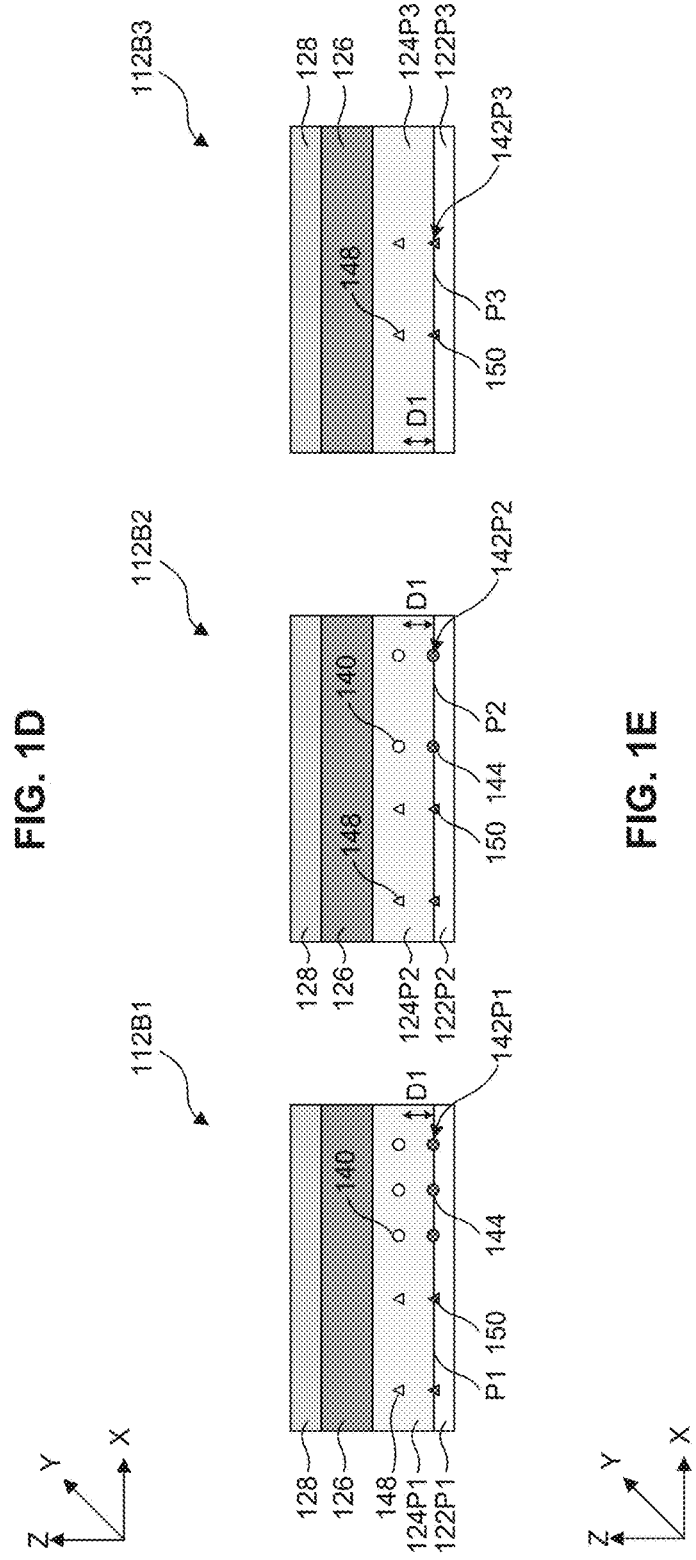
FIG. 1D
FIG. 1E

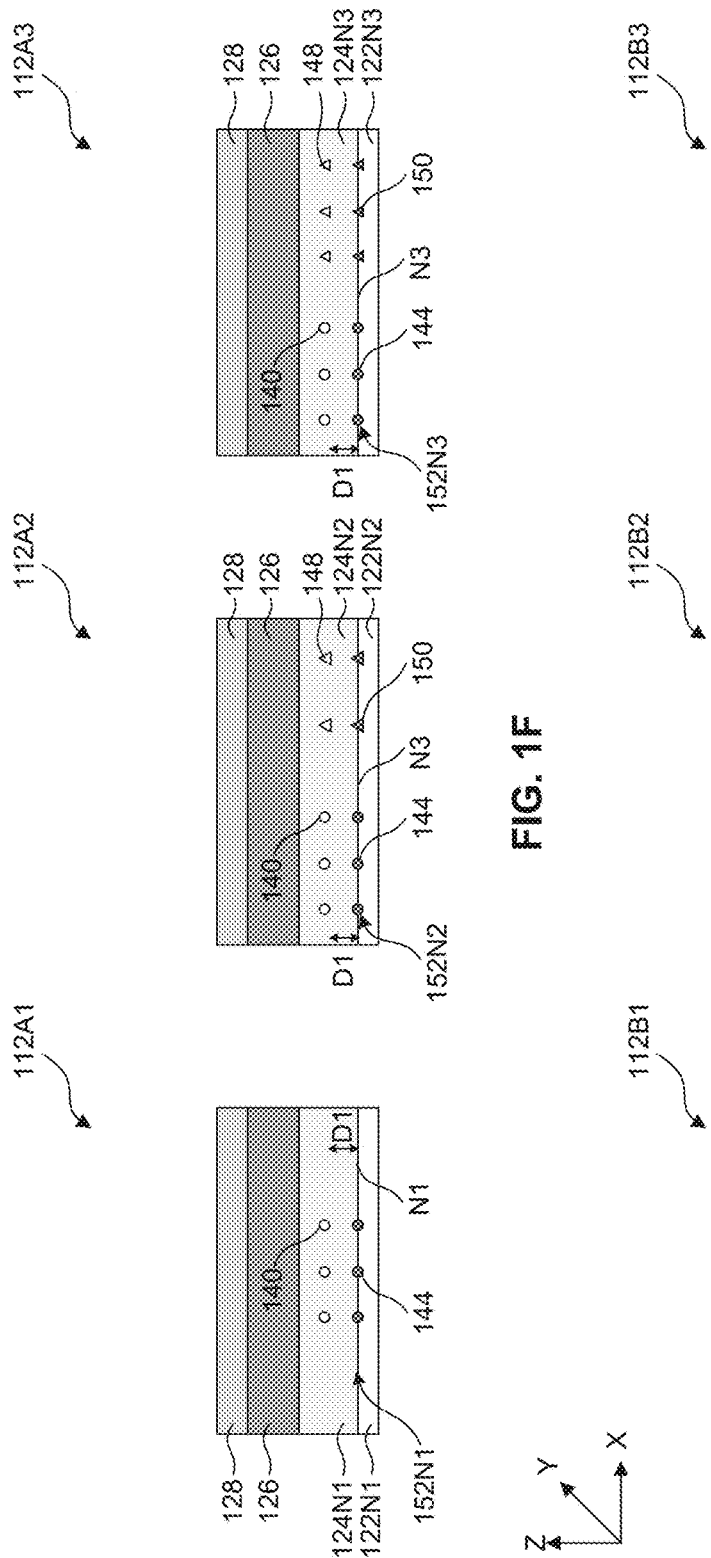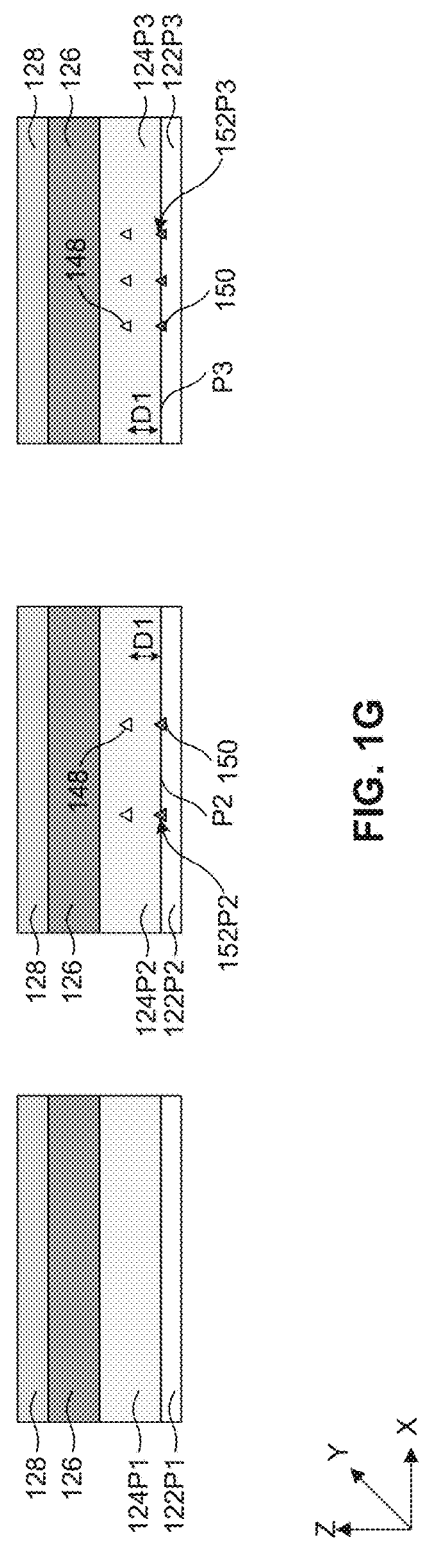

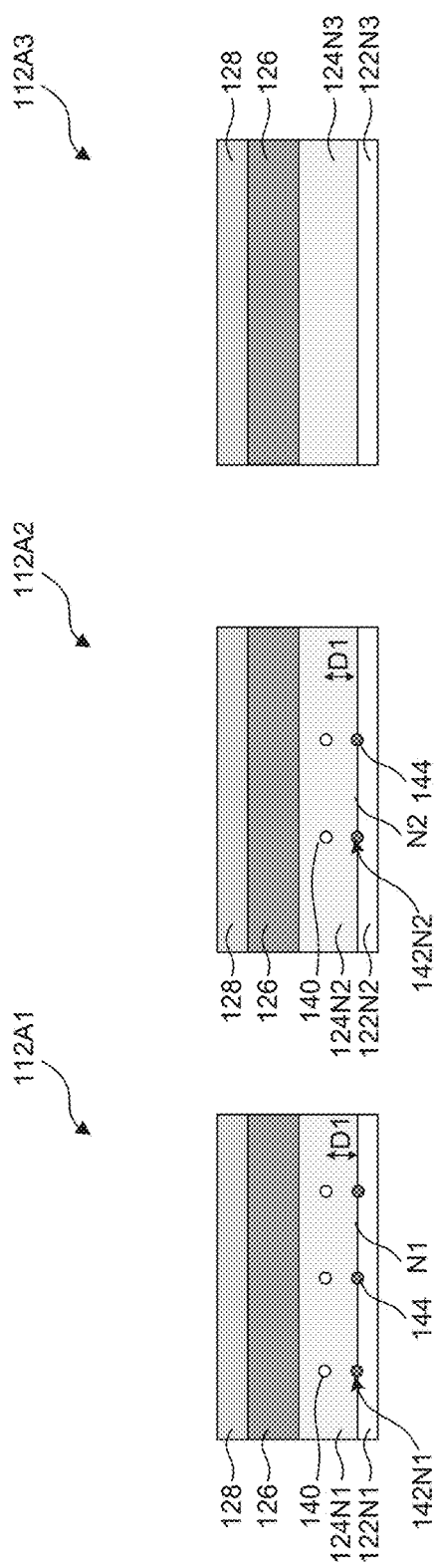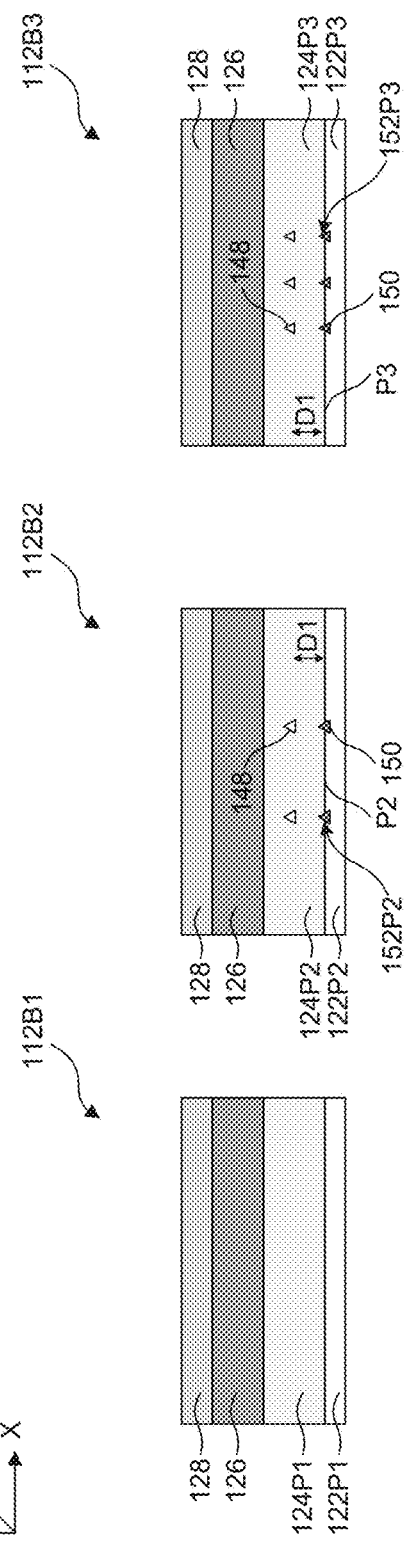

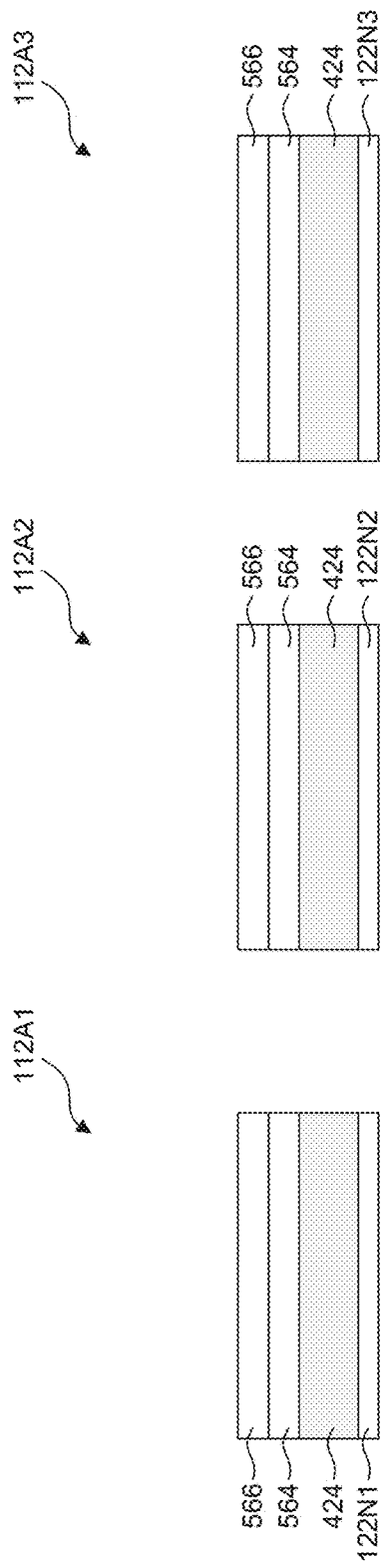
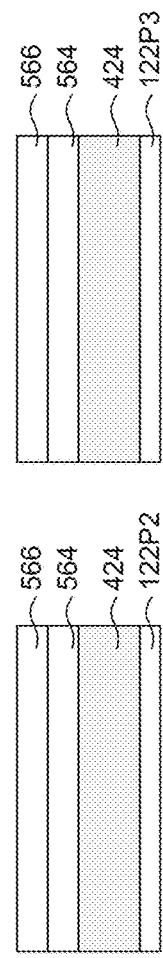
FIG. 5A
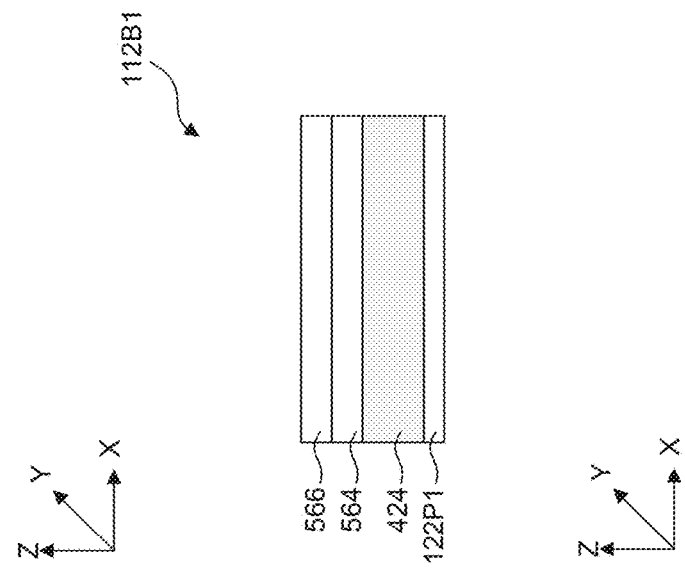
FIG. 5B

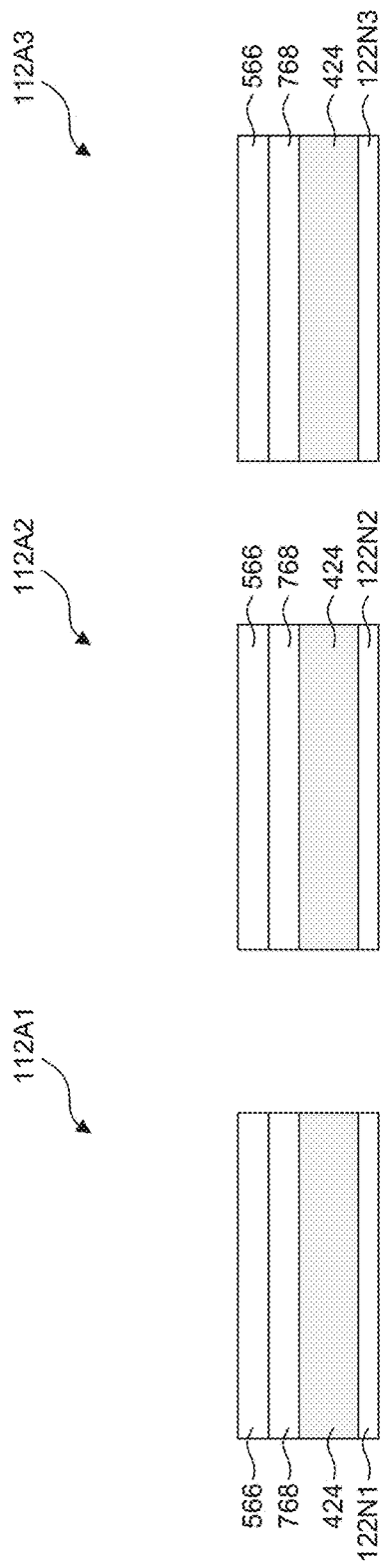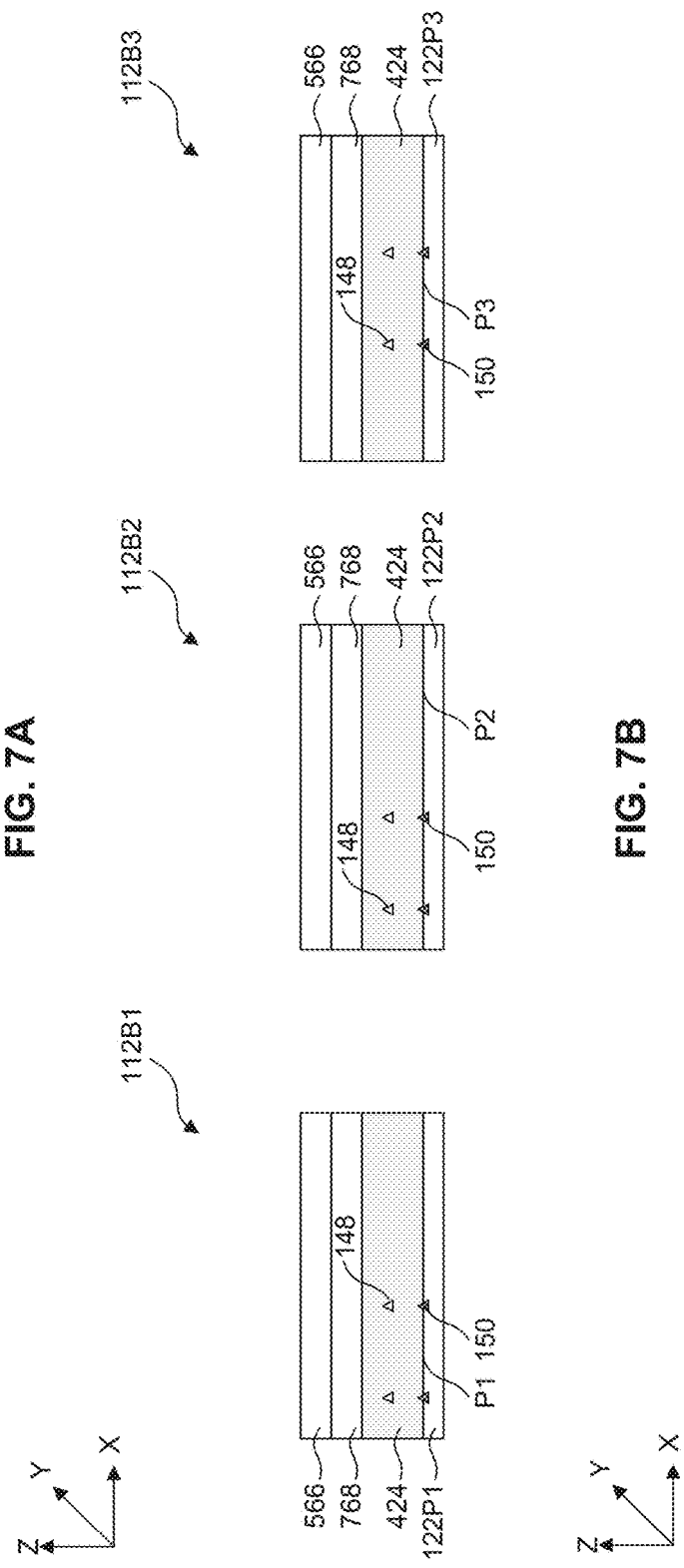
FIG. 7A
FIG. 7B

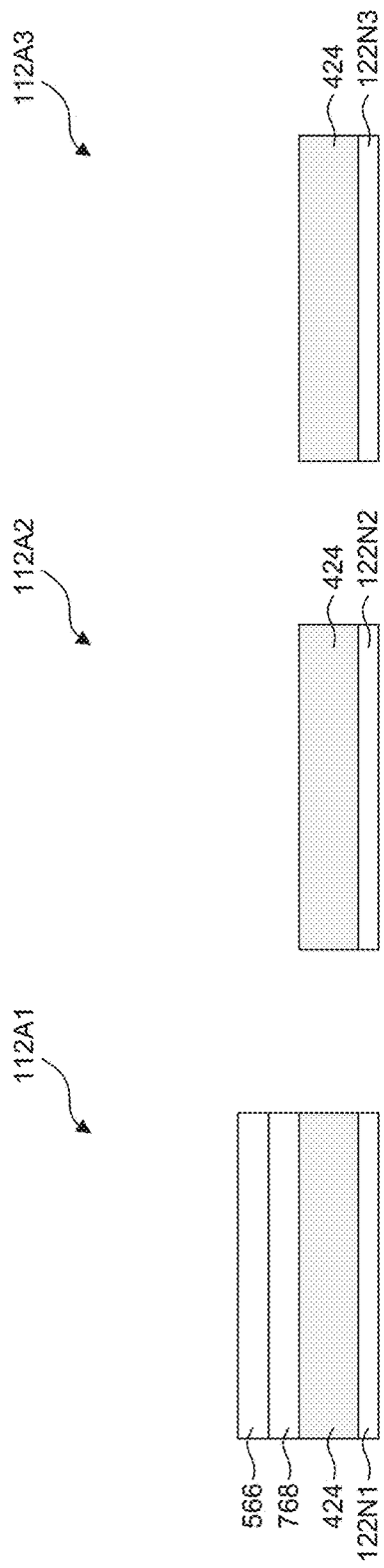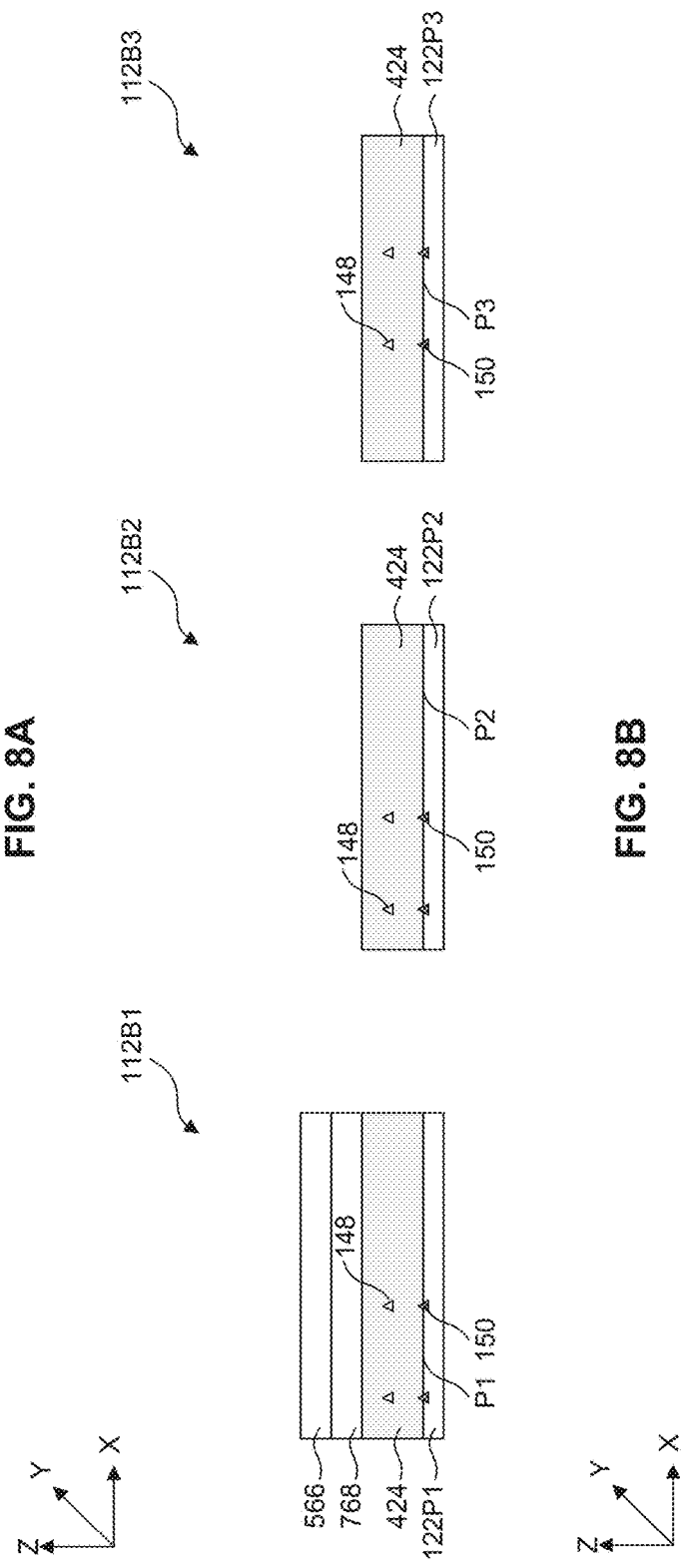
FIG. 8A
FIG. 8B

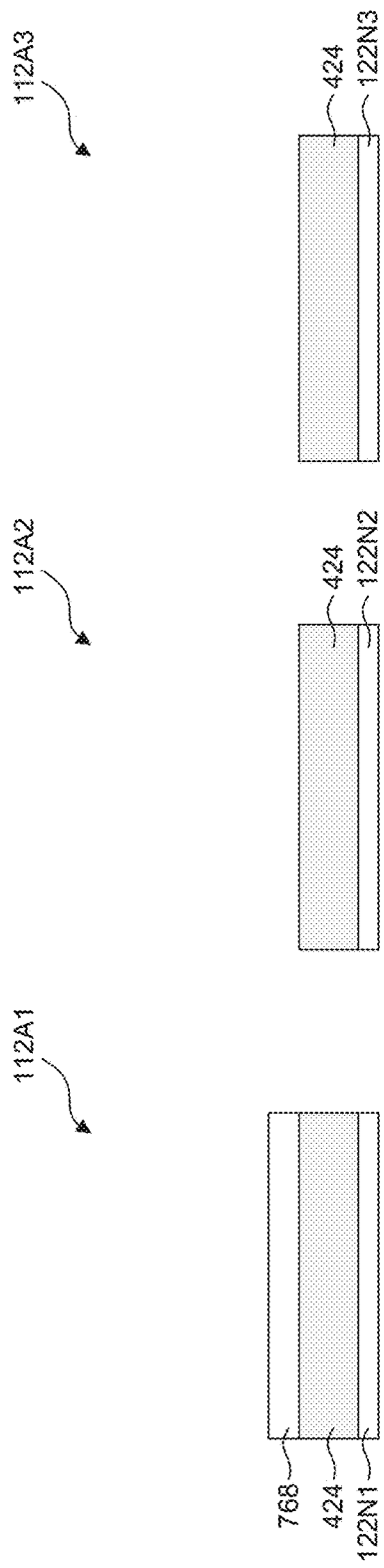
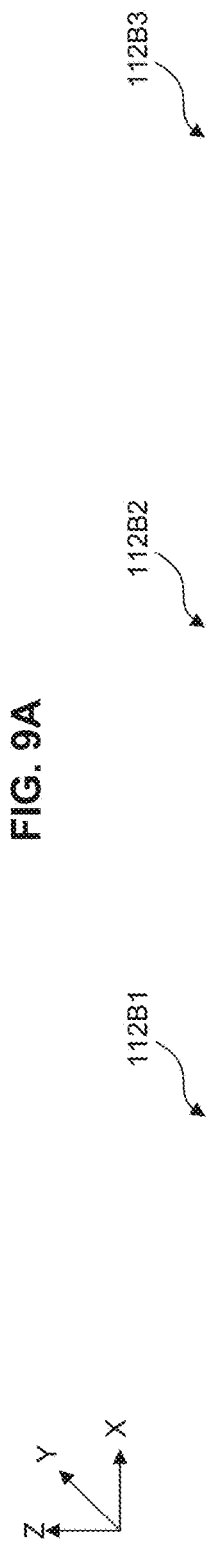
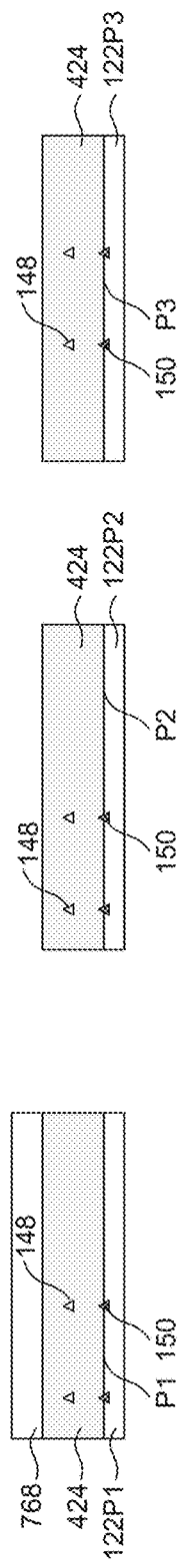
FIG. 9A
FIG. 9B

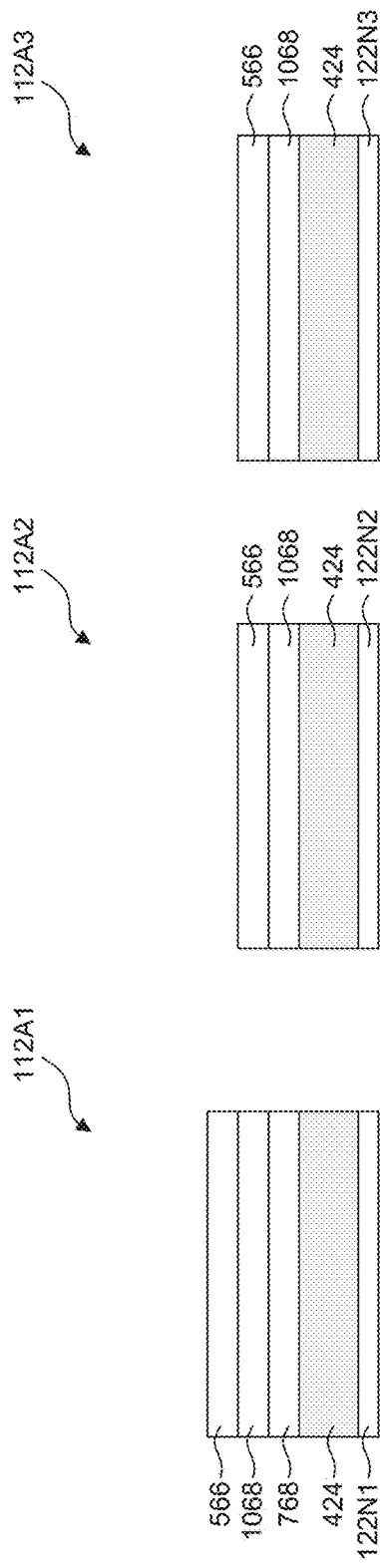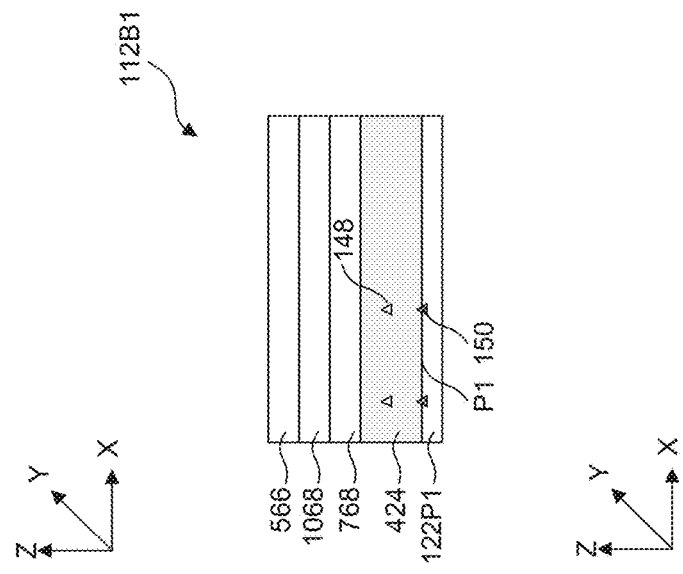
FIG. 10A
FIG. 10B

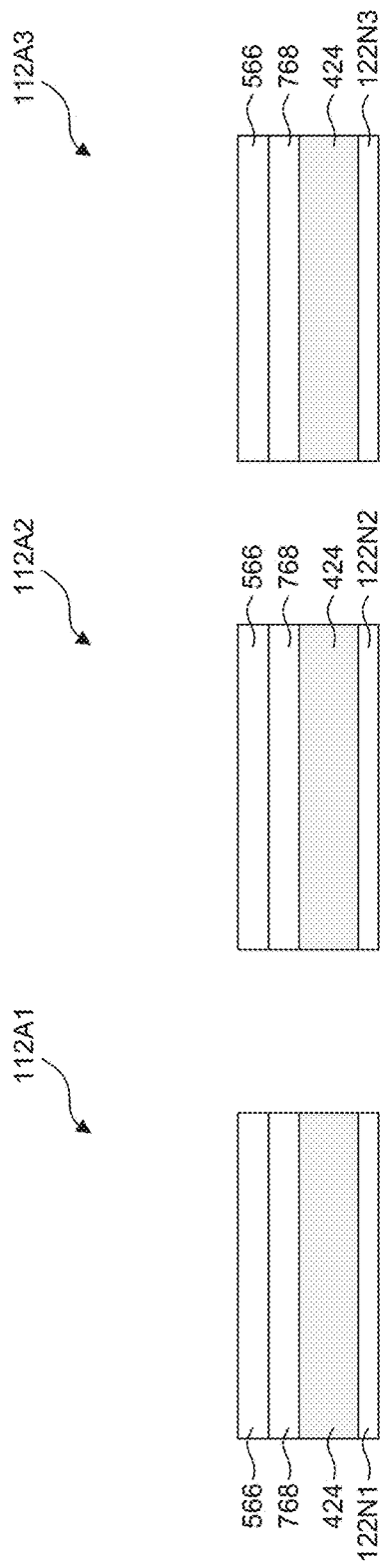
FIG. 17A
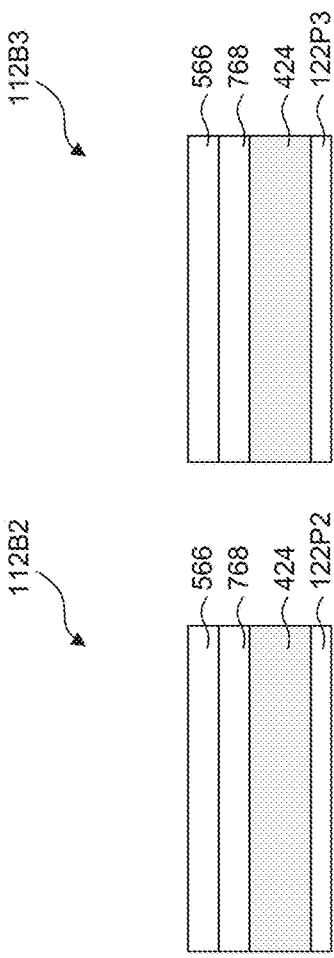
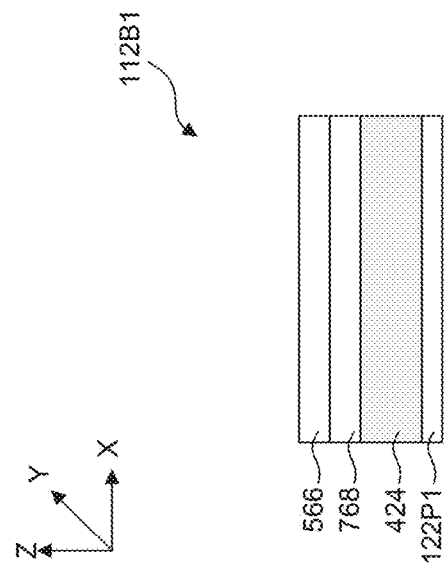
FIG. 17B

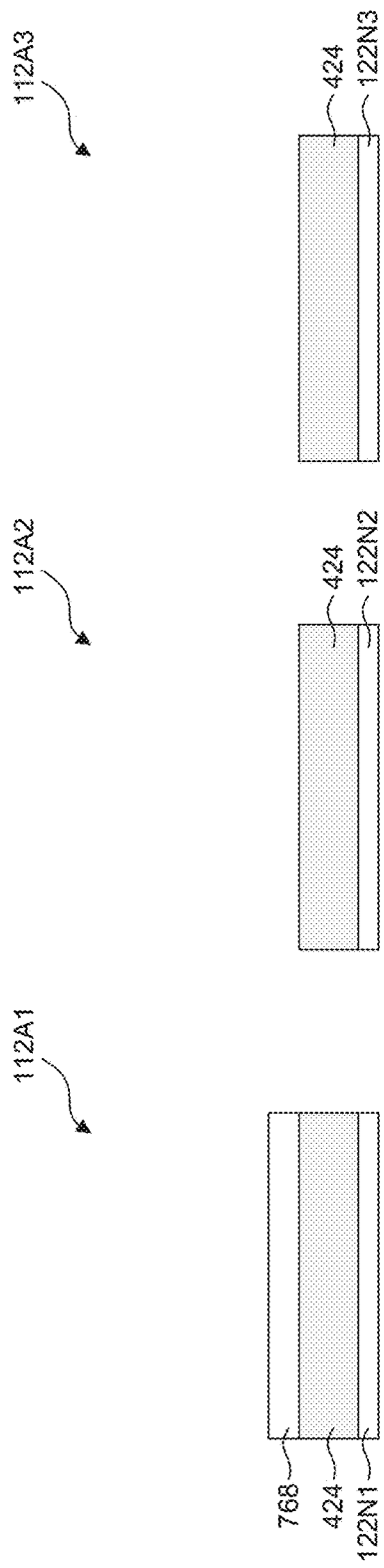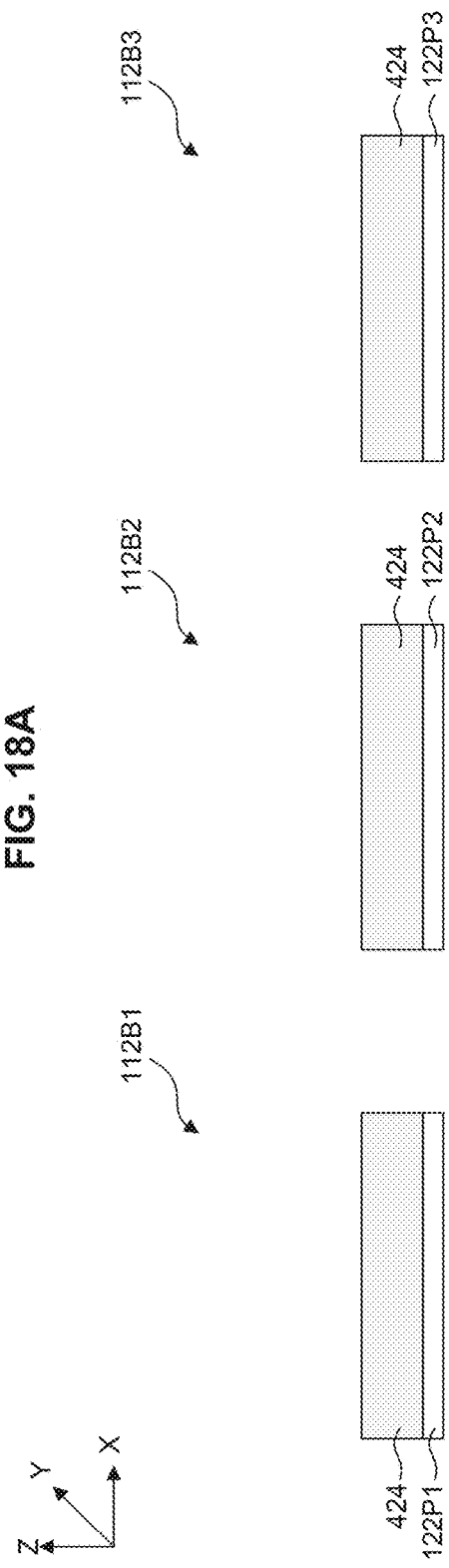
FIG. 18A
FIG. 18B

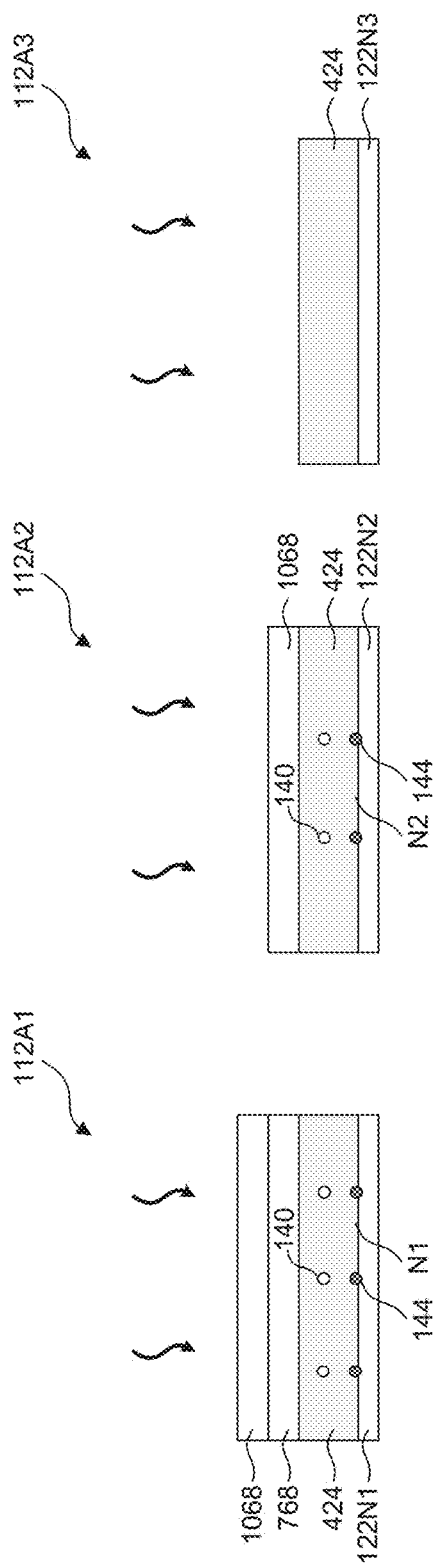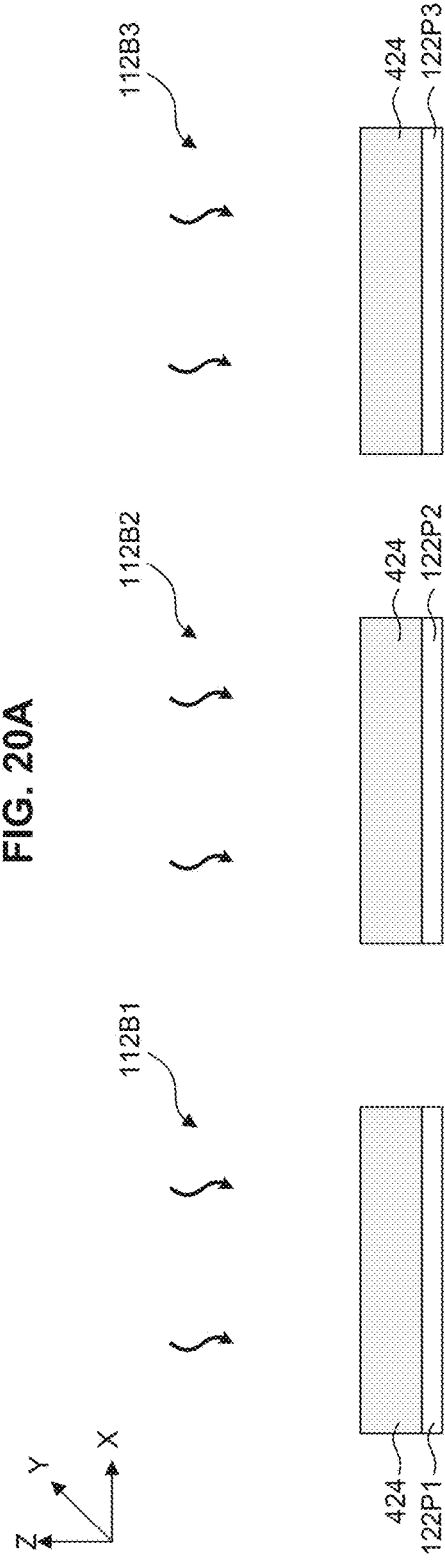

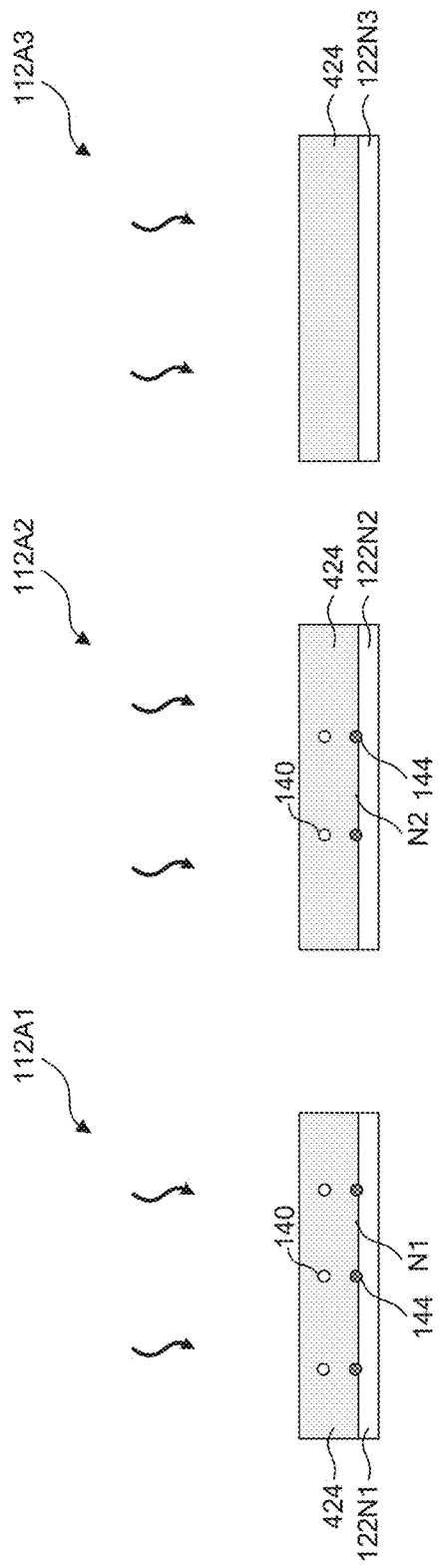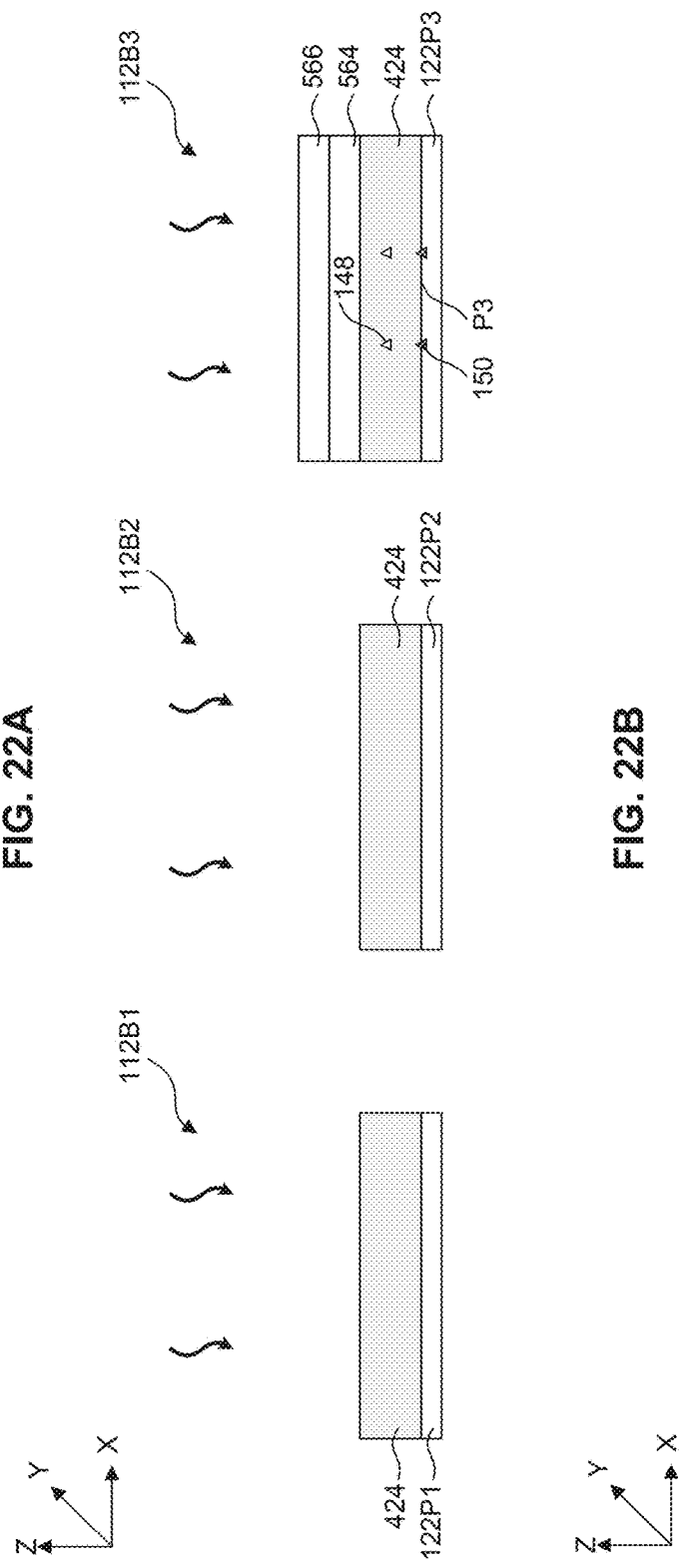
FIG. 22A
FIG. 22B

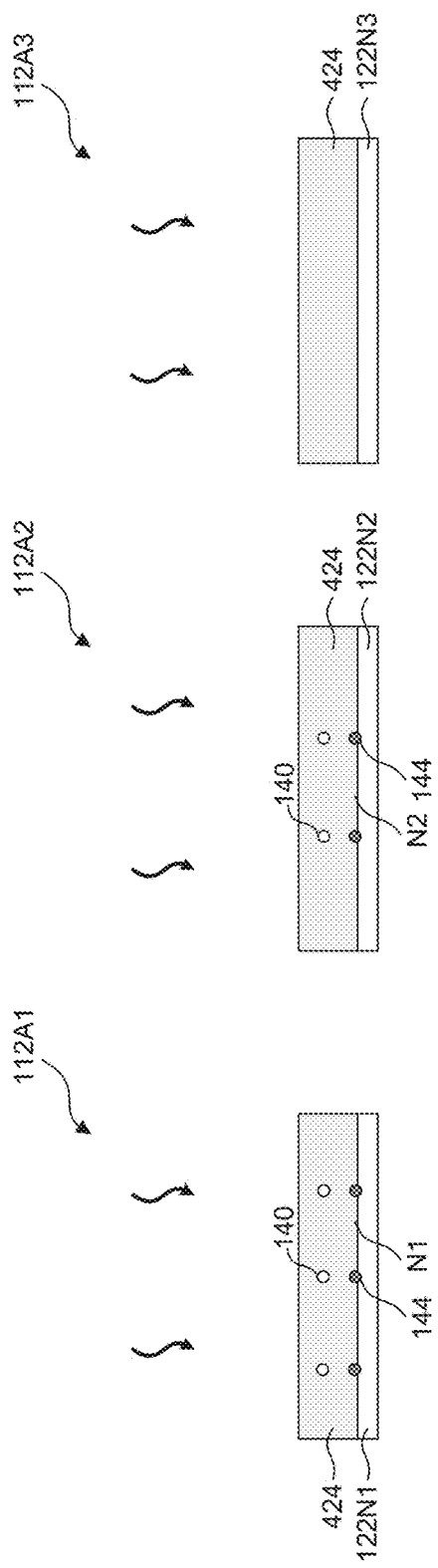
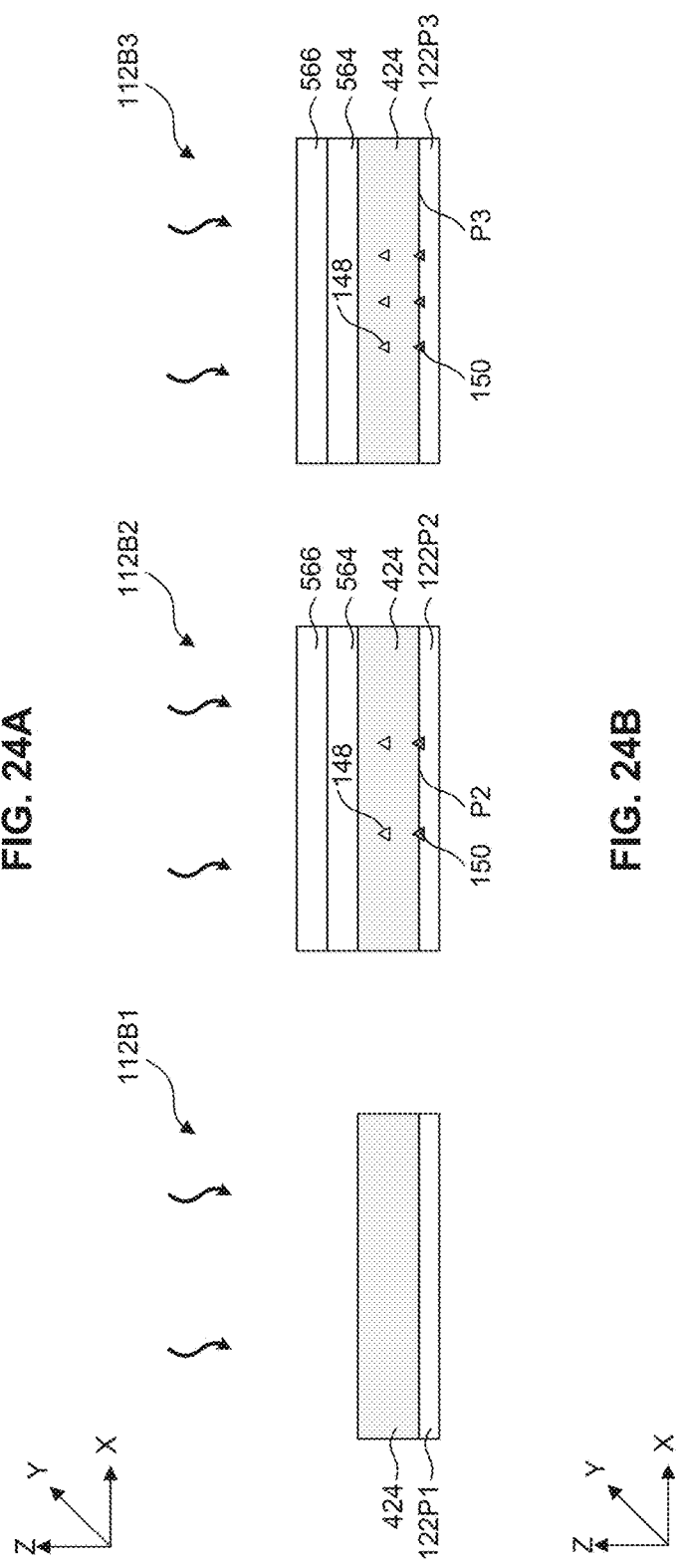
FIG. 24A
FIG. 24B

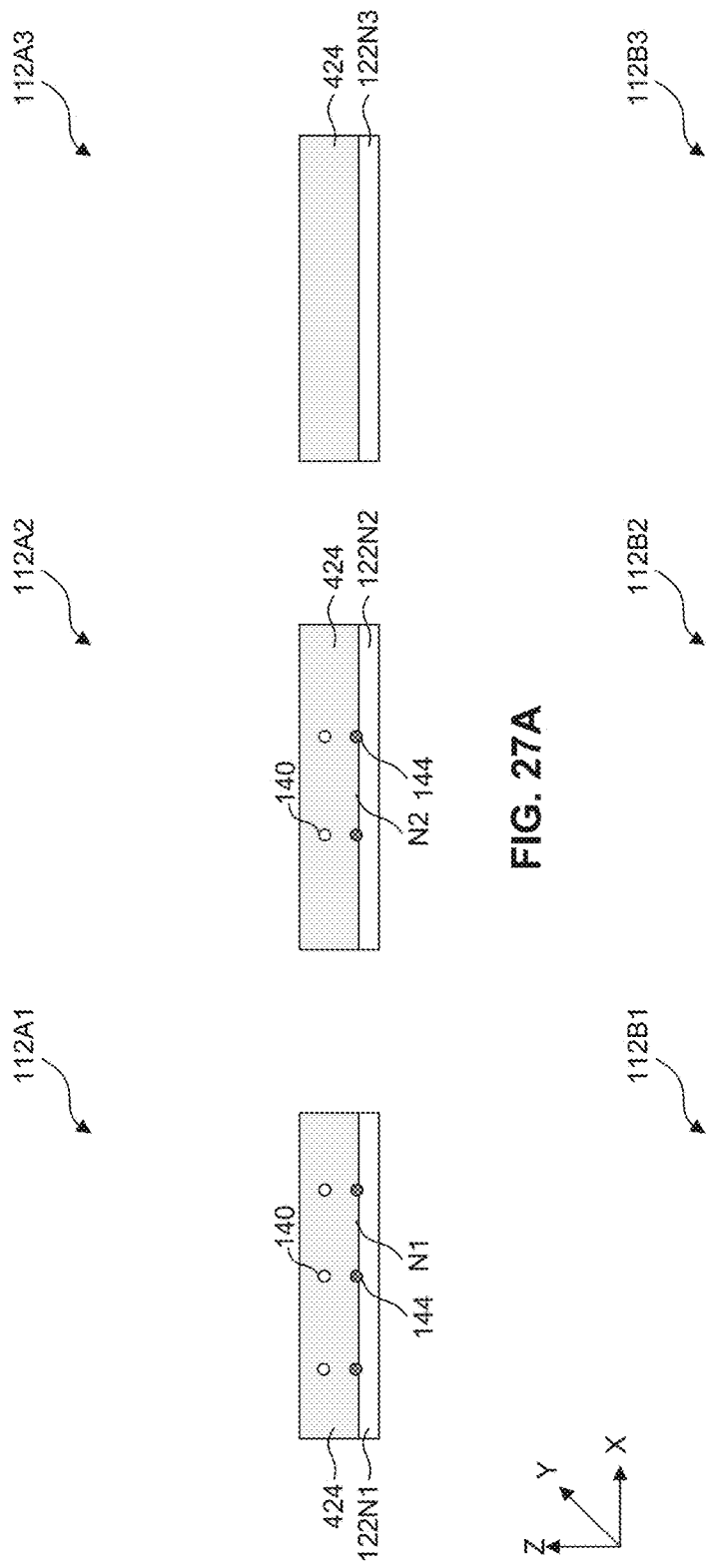
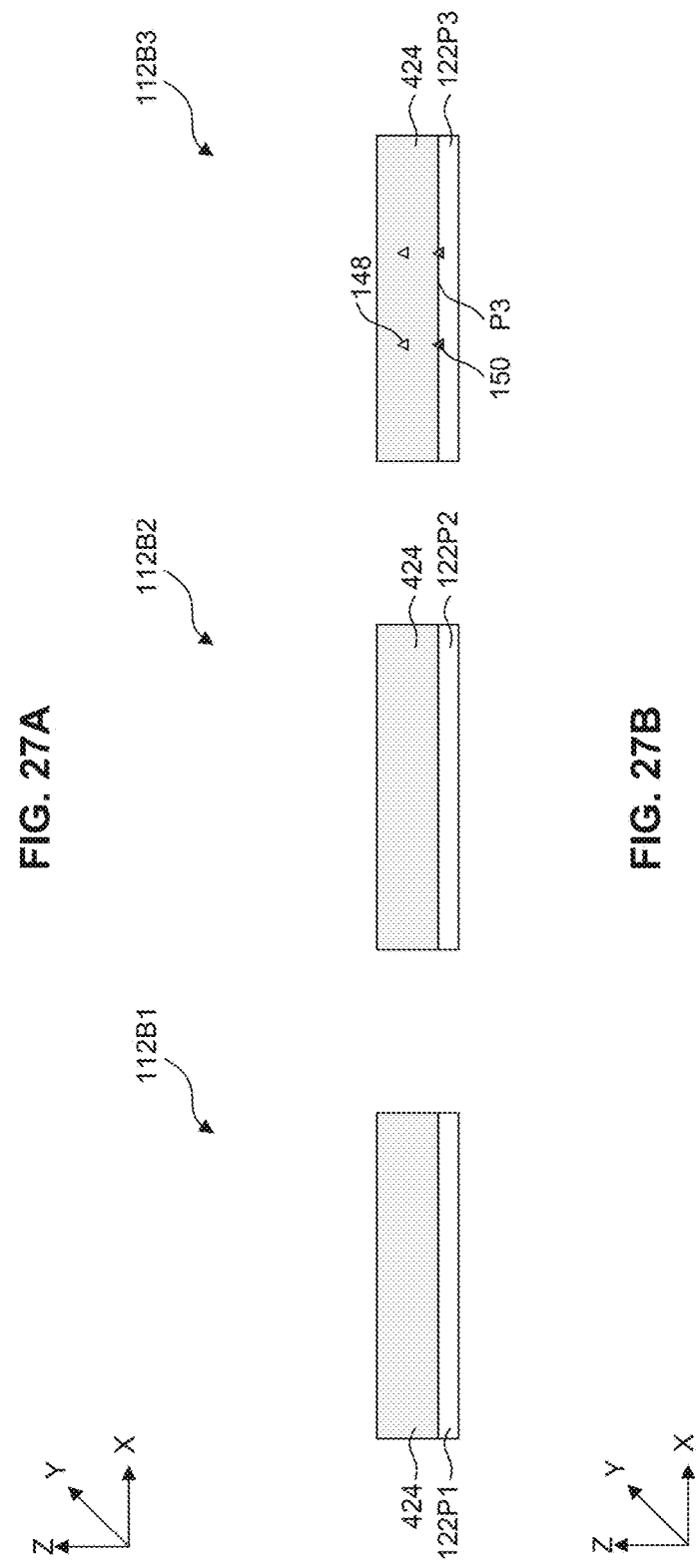
FIG. 27A
FIG. 27B

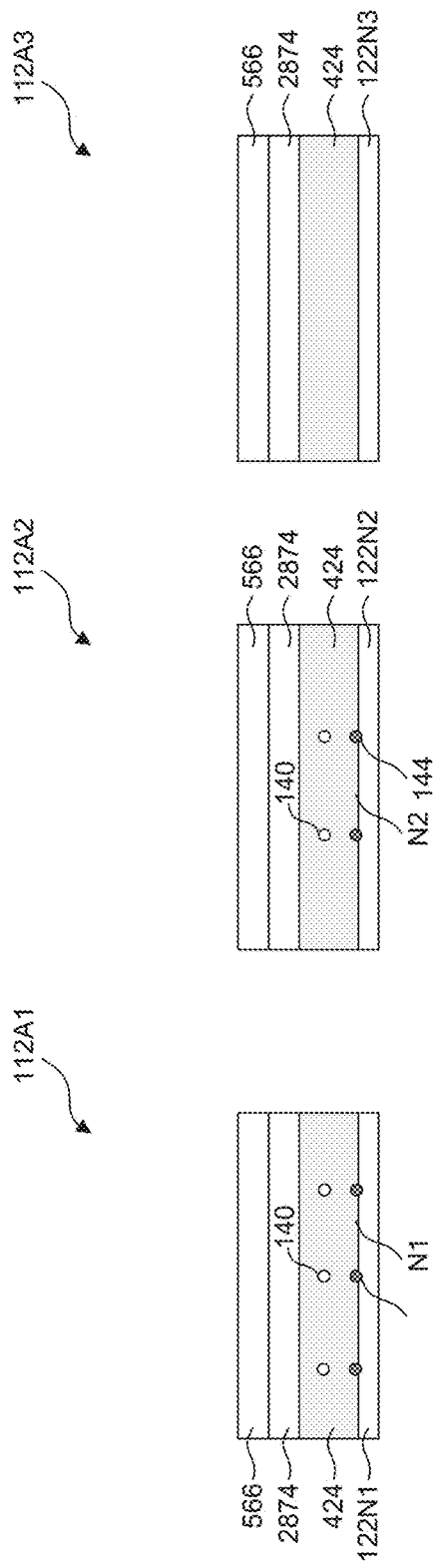
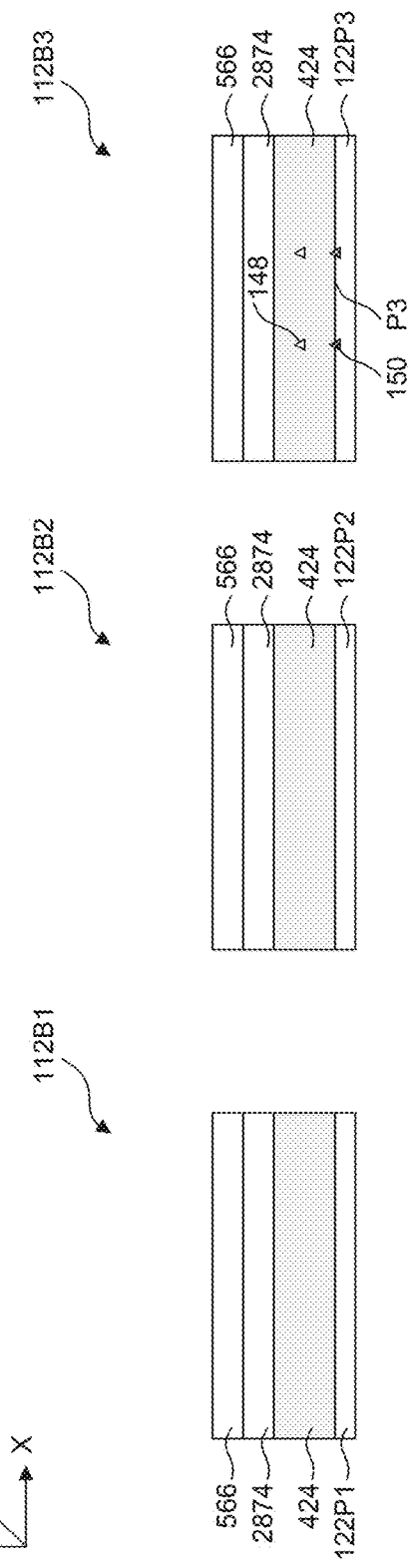
FIG. 28A
FIG. 28B

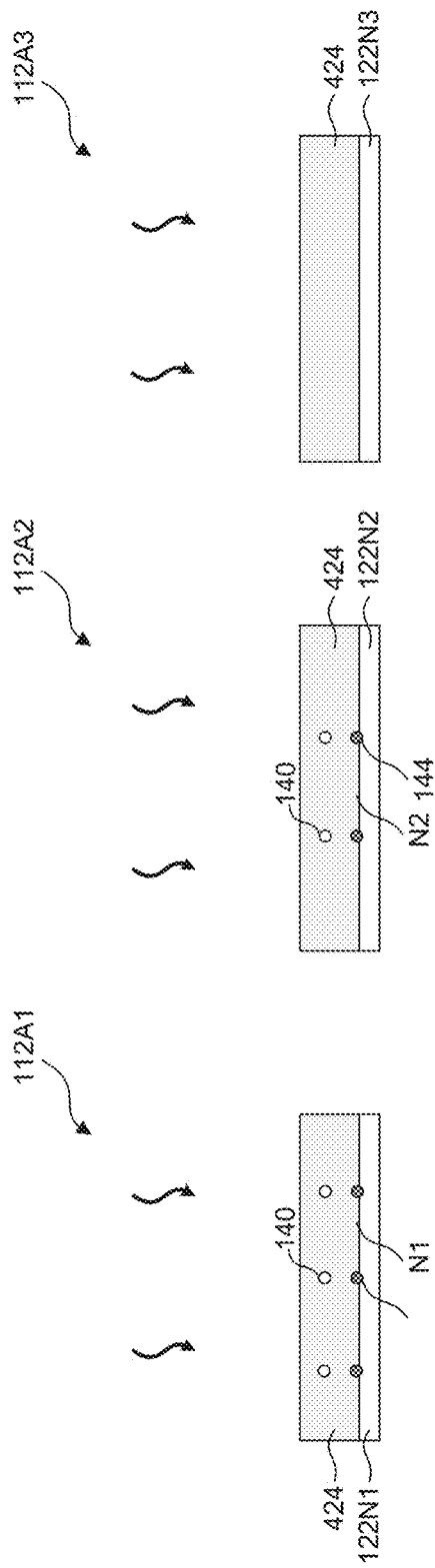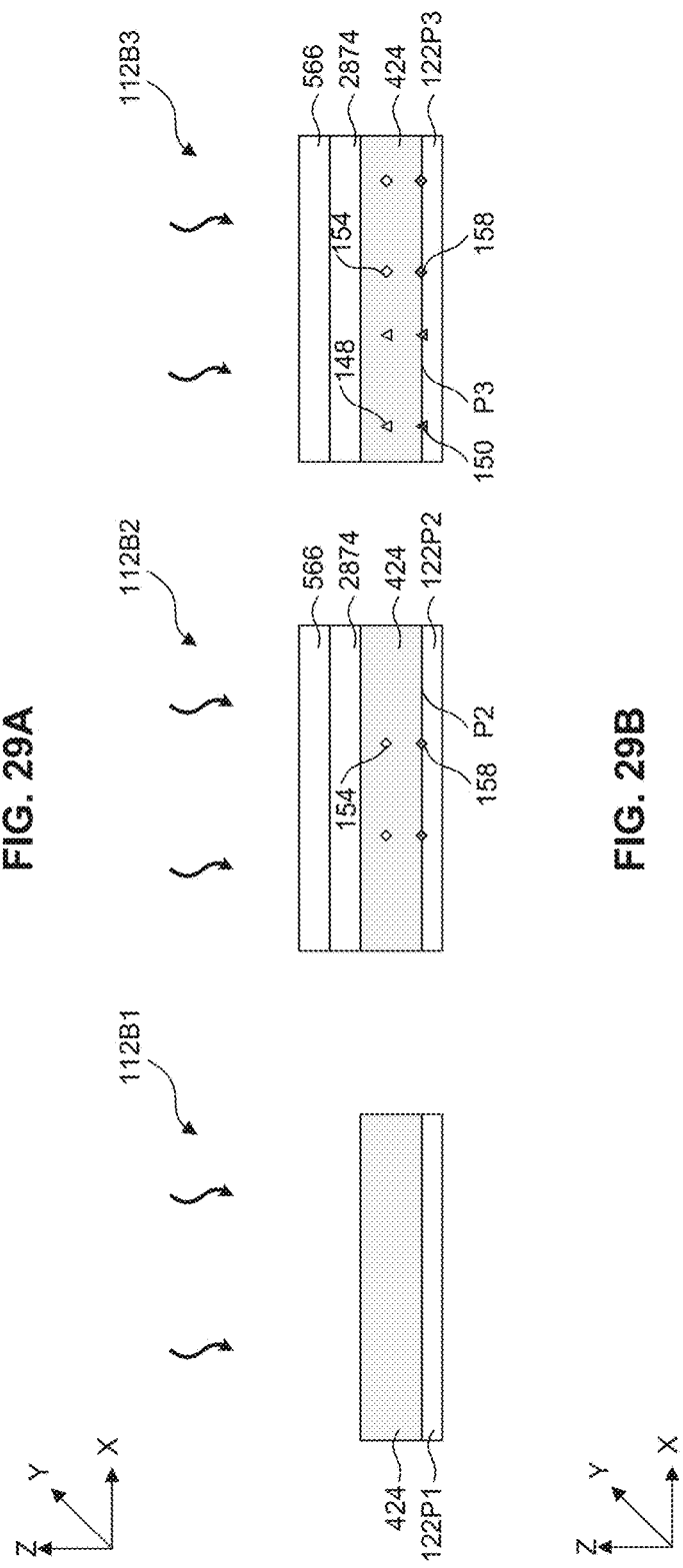
FIG. 29A
FIG. 29B

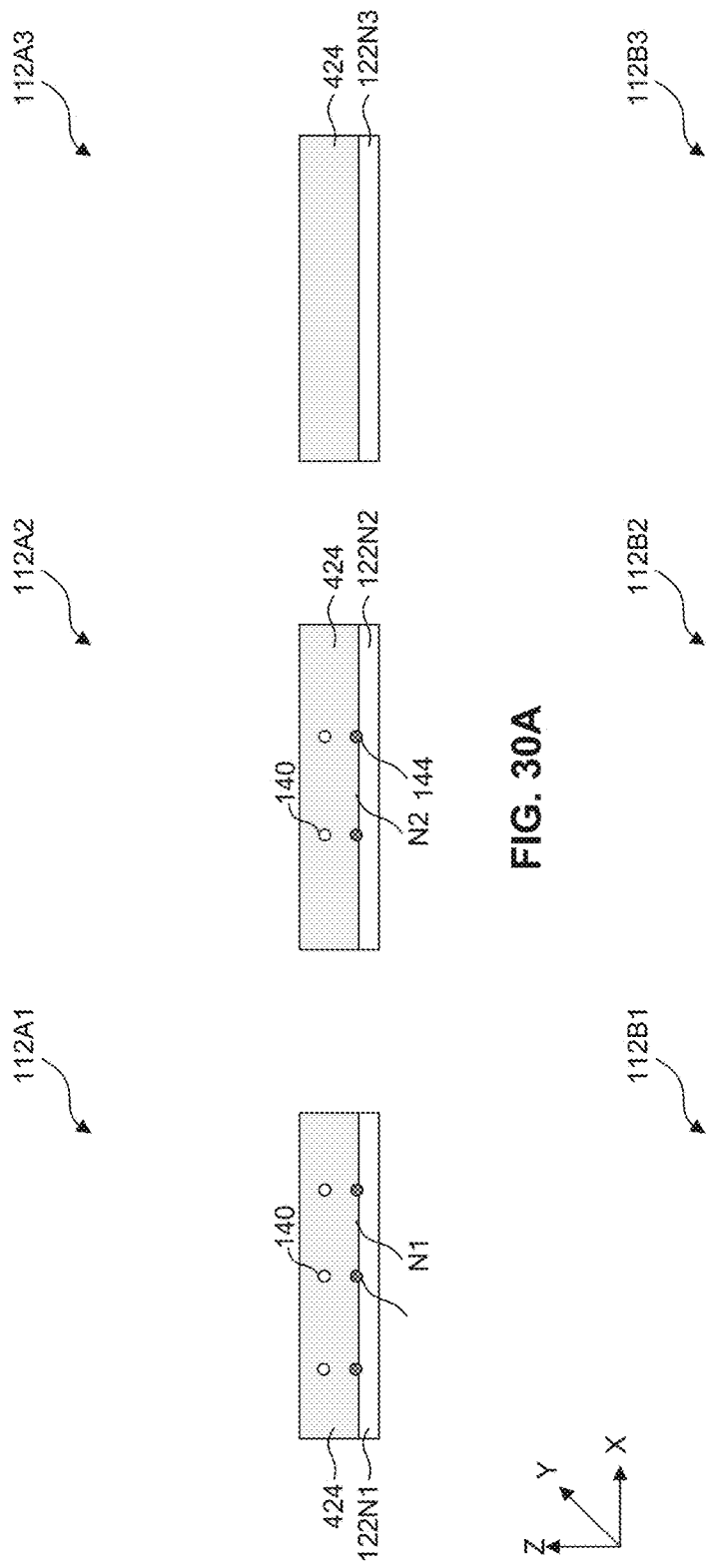
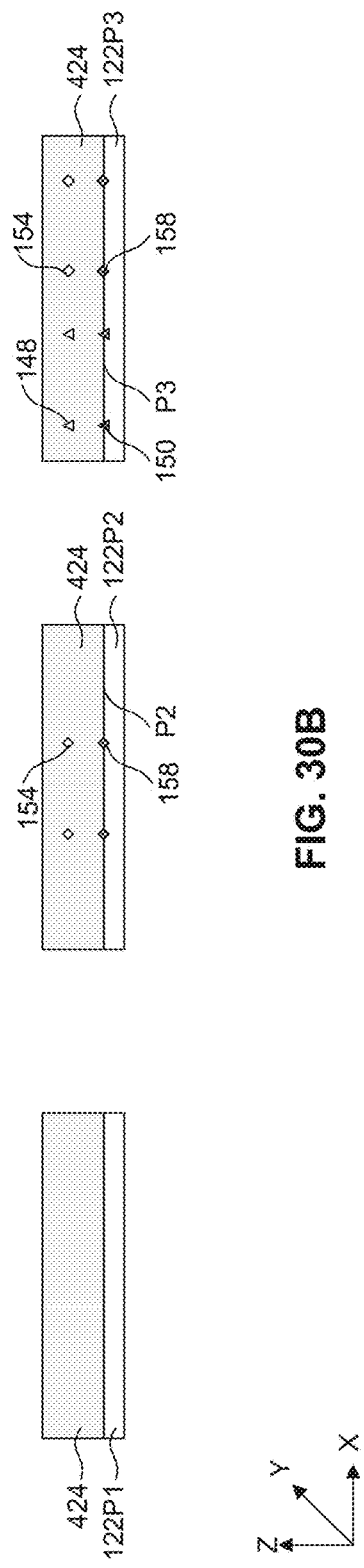
FIG. 30A
FIG. 30B

GATE STRUCTURES IN SEMICONDUCTOR DEVICES

CROSS-REFERENCE TO RELATED APPLICATIONS

This application claims the benefit of U.S. Provisional Patent Application No. 63/229,207, titled "Semiconductor Devices with Multiple Threshold Voltages and Method for Manufacturing the Same," filed Aug. 4, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1B-1M illustrate cross-sectional views of a semiconductor device with different gate structures, in accordance with some embodiments.

FIGS. 3A-15B illustrate cross-sectional views of a semiconductor device with different gate structures at various stages of its fabrication process, in accordance with some embodiments.

FIGS. 17A-25B illustrate cross-sectional views of a semiconductor device with different gate structures at various stages of its fabrication process, in accordance with some embodiments.

FIGS. 27A-30B illustrate cross-sectional views of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
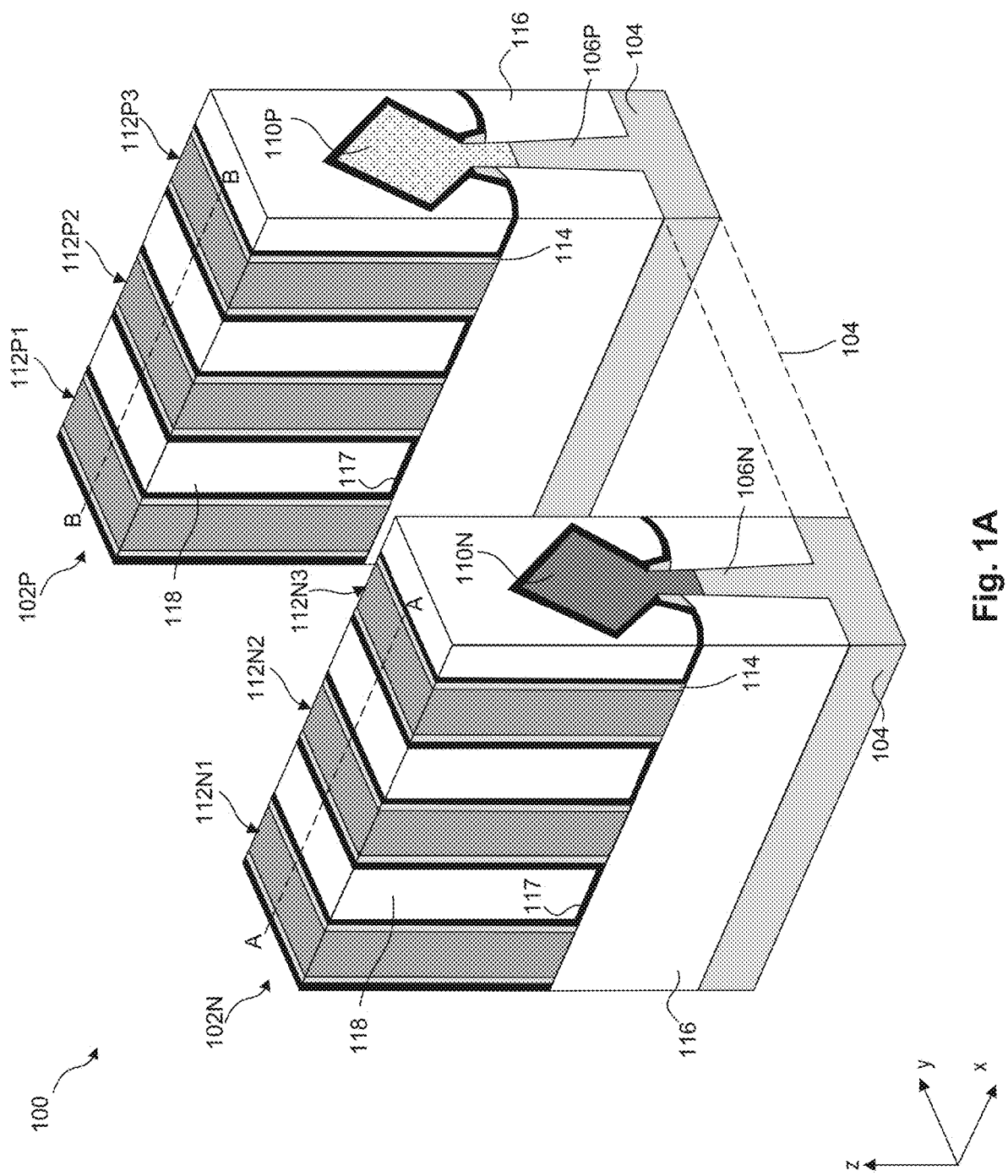
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage (Vt)—to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of each of the layers of the FET gate structure. As such, FETs can be manufactured with different threshold voltages by adjusting the thickness and/or material composition of the FET gate structures.

Due to the increasing demand for multi-functional low power portable devices, there is an increasing demand for FETs with low threshold voltages, such as threshold voltages between 100 mV and 200 mV (referred to as "low threshold voltage") and threshold voltages lower than 100 mV (referred to as "ultra-low threshold voltage"). One way to achieve multi-Vt devices with low and/or ultra-low threshold voltages in FETs can be with different work function metal (WFM) layer thicknesses greater than about 4 nm (e.g., about 5 nm to about 10 nm) in the gate structures. However, the different WFM layer thicknesses can be constrained by the FET gate structure geometries. For example, in gate-all-around (GAA) FETs, the thickness of the WFM layer(s) can be constrained by the spacing between the nanostructured channel regions of the GAA FETs. Also, depositing different WFM layer thicknesses can become increasingly challenging with the continuous scaling down of FETs (e.g., GAA FETs, finFETs, and/or MOSFETs).

The present disclosure provides example structures of FETs (e.g., finFETs or GAA FETs) with different gate structures configured to provide different and/or low threshold voltages, and example methods of forming such multi-Vt FETs on the same substrate. The example methods form NFETs and PFETs with WFM layer of similar thicknesses, but with ultra-low, low, and/or different threshold voltages, on the same substrate. These example methods can be more cost-effective (e.g., reduce cost by about 20% to about 30%) and time-efficient (e.g., reduce time by about 15% to about 20%) in manufacturing reliable FET gate structures with different low and/or ultra-low threshold voltages than other methods of forming FETs with similar dimensions and threshold voltages on the same substrate. In addition, these example methods can form FET gate structures with much smaller dimensions (e.g., thinner gate stacks) than other methods of forming FETs with similar threshold voltages.

In some embodiments, NFETs and PFETs with different gate structure configurations, but with similar WFM layer thicknesses, can be selectively formed on the same substrate to achieve low, ultra-low and/or different threshold voltages. The different gate structures can have high-K (HK) gate dielectric layers doped with metal dopants of different types and/or concentrations. The different types and/or concentrations of metal dopants can induce dipoles of different polarities and/or concentrations at interfaces between the HK gate dielectric layers and interfacial oxide (IO) layers. The dipoles of different polarities and/or concentrations result in gate structures with different EWF values. Since EWF values of gate structures correspond to threshold voltage of FETs, gate structures with different EWF values result in FETs with different threshold voltages on the same substrate. Thus, controlling the types and/or concentrations of metal dopants in the HK gate dielectric layers can tune the EWF values of the NFET and PFET gate structures, and as a result can adjust the threshold voltages of the NFETs and PFETs without varying the WFM layer thicknesses.

Figure 1B:
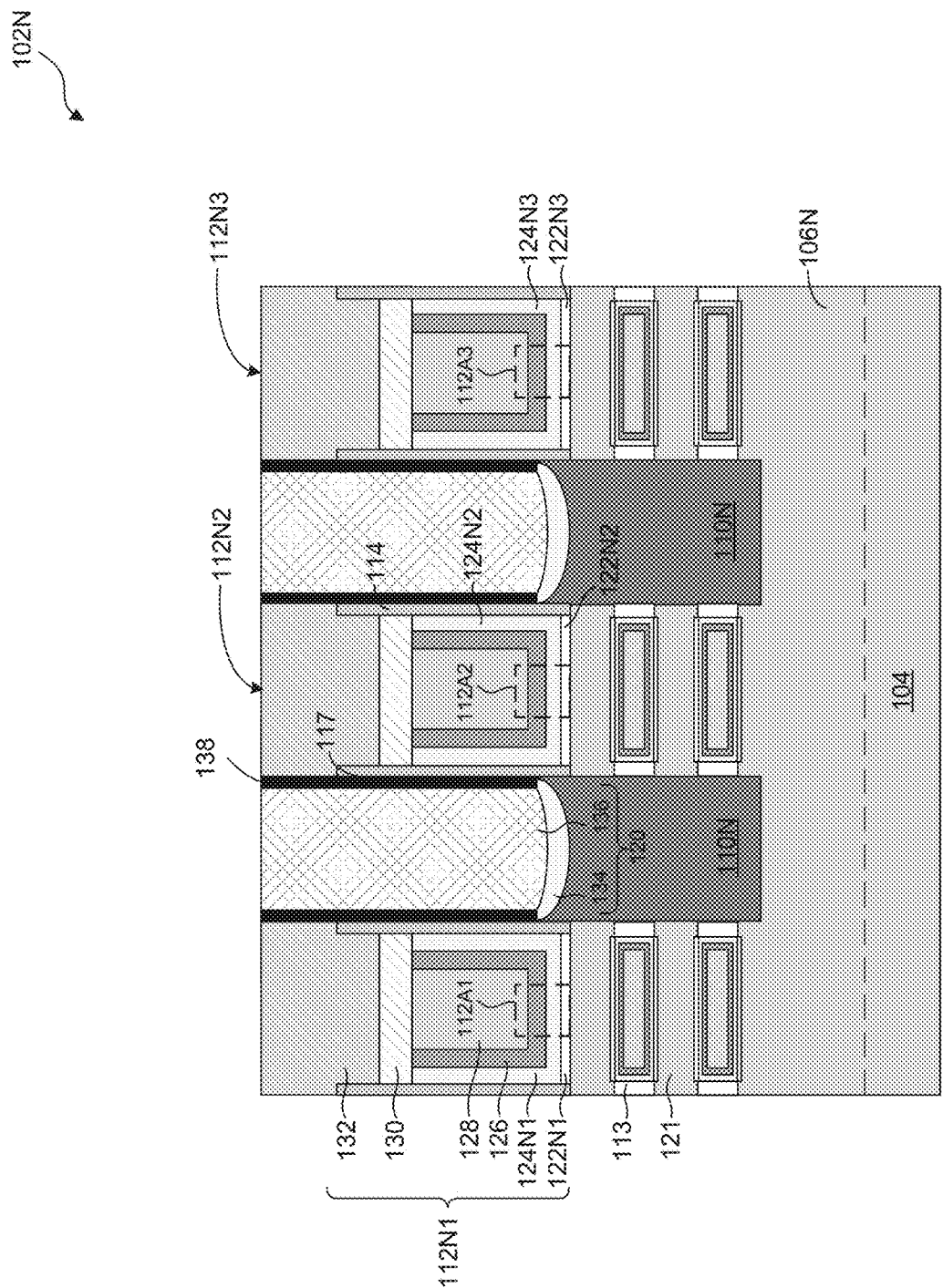
Figure 1C:
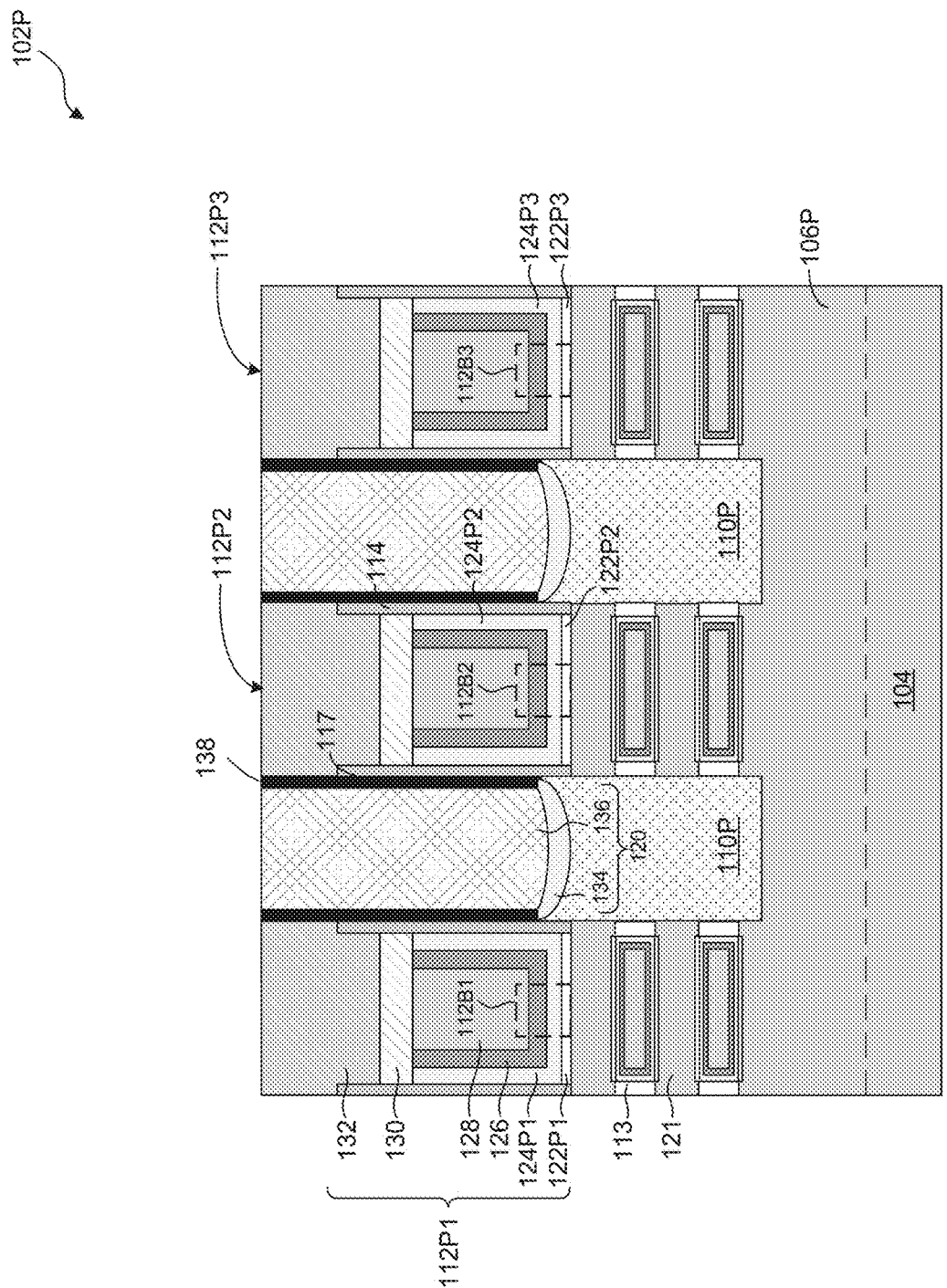

FIG. 1A illustrates an isometric view of a semiconductor device 100 with NFET 102N and PFET 102P, according to some embodiments. FIG. 1B illustrates a cross-sectional view of NFET 102N along line A-A of FIG. 1. FIG. 1C illustrates a cross-sectional views of PFET 102P along line B-B of FIG. 1. FIGS. 1B and 1C illustrate cross-sectional views of semiconductor device 100 with additional structures that are not shown in FIG. 1A for simplicity. FIGS. 1D, 1F, 1H, 1J, and 1L are enlarged views of gate regions 112A1-112A3 of FIG. 1B and illustrate different cross-sectional views of gate regions 112A1-112A3. FIGS. 1E, 1G, 1I, 1K, and 1M are enlarged views of gate regions 112B1-112B3 of FIG. 1C and illustrate different cross-sectional views of gate regions 112B1-112B3. FIGS. 1D-1M illustrate additional structures that are not shown in FIGS. 1B-1C for simplicity. The discussion of elements with the same annotations applies to each other, unless mentioned otherwise.

Referring to FIGS. 1A-1C, NFET 102N can include an array of gate structures 112N1-112N3 disposed on fin structure 106N, and PFET 102P can include an array of gate structures 112P1-112P3 disposed on fin structure 106P. NFET 102N can further include stacks of nanostructured channel regions 121 surrounded by gate structures 112N1-112N3, an array of S/D regions 110N (one of S/D regions 110N visible in FIG. 1A) disposed on portions of fin structure 106N that are not covered by gate structures 112N1-112N3, and S/D contact structures 120N disposed on S/D regions 110N. Similarly, PFET 102P can further include stacks of nanostructured channel regions 121 surrounded by gate structures 112P1-112P3, an array of epitaxial S/D regions 110P (one of S/D regions 110P visible in FIG. 1A) disposed on portions of fin structure 106P that are not covered by gate structures 112P1-112P3, and S/D contact structures 120P disposed on S/D regions 110P. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 121 can have be in the form of nanosheets, nanowires, nanorods, nanotubes, or other suitable nanostructured shapes.

Semiconductor device 100 can further include gate spacers 114, shallow trench isolation (STI) regions 116, etch stop layers (ESLs) 117, and interlayer dielectric (ILD) layers 118. ILD layer 118 can be disposed on ESL 117. ESL 117 can be configured to protect gate structures 112N and 112P and/or S/D regions 110N and 110P. In some embodiments, gate spacers 114, STI regions 116, ESLs 117, and ILD layers 118 can include an insulating material, such as silicon oxide, silicon nitride (SiN), silicon carbon nitride (SiCN), silicon oxycarbon nitride (SiOCN), and silicon germanium oxide.

Semiconductor device 100 can be formed on a substrate 104 with NFET 102N and PFET 102P formed on different regions of substrate 104. There may be other FETs and/or structures (e.g., isolation structures) formed between NFET 102N and PFET 102P on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106N-106P can include a material similar to substrate 104 and extend along an X-axis.

In some embodiments, S/D regions 110N can include an epitaxially-grown semiconductor material, such as Si, and n-type dopants, such as phosphorus and other suitable n-type dopants. In some embodiments, S/D regions 110P can include an epitaxially-grown semiconductor material, such as Si and SiGe, and p-type dopants, such as boron and other suitable p-type dopants. In some embodiments, S/D contact structures 120N-120P can include silicide layers 134, contact plugs 136 disposed on silicide layers 134, and nitride barrier layers 138 along sidewalls of contact plugs. In some embodiments, silicide layers 134 can include titanium silicide ($Ti_xSi_y$), tantalum silicide ($Ta_xSi$), molybdenum silicide ($Mo_xSi_y$), nickel silicide ($Ni_xSi_y$), cobalt silicide ($Co_xSi_y$), tungsten silicide ($W_xSi_y$), or a combination thereof. In some embodiments, contact plugs 136 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof.

In some embodiments, nanostructured channel regions 121 can include semiconductor materials similar to or different from substrate 104. In some embodiments, nanostructured channel regions 121 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 121 are shown, nanostructured channel regions 121 can have cross-sections of other geometric shapes (e.g., circular, elliptical, triangular, or polygonal).

In some embodiments, gate structures 112N1-112N3 and 112P1-112P3 can be multi-layered structures and can surround each of nanostructured channel regions 121 for which gate structures 112N1-112N3 and 112P1-112P3 can be referred to as "gate-all-around (GAA) structures" or "horizontal gate-all-around (HGAA) structures." NFET 102N can be referred to as "GAA FET 102N" or "GAA NFET 102N" and PFET 102N can be referred to as "GAA FET 102P" or "GAA PFET 102P." The portions of gate structures 112N1-112N3 and 112P1-112P3 surrounding nanostructured channel regions 121 can be electrically isolated from adjacent S/D regions 110N and 110P by inner spacers 113. Inner spacers 113 can include a material similar to gate spacers 114. In some embodiments, NFET-PFET 102N-102P can be finFETs and have fin regions (not shown) instead of nanostructured channel regions 121.

In some embodiments, gate structures 112N1-112N3 and 112P1-112P3 can include interfacial oxide (IL) layers 122N1-122N3 and 122P1-122P3, high-k (HK) gate dielectric layers 124N1-124N3 and 124P1-124P3 disposed on IL layers 122N1-122N3 and 122P1-122P3, work function metal (WFM) layers 126 disposed on HK gate dielectric layers 124N1-124N3 and 124P1-124P3, gate metal fill layers 128 disposed on WFM layers 126, conductive capping layers 130 disposed on HK gate dielectric layers 124N1-124N3 and 124P1-124P3, WFM layers 126, and gate metal fill layers 128, and insulating capping layers 132 disposed on conductive capping layers 130.

In some embodiments, IL layers 122N1-122N3 and 122P1-122P3 can include silicon oxide ($SiO_2$), silicon germanium oxide ($SiGeO_x$), or germanium oxide ($GeO_x$) and can have a thickness of about 0.5 nm to about 2 nm. In some embodiments, HK gate dielectric layers 124N1-124N3 and 124P1-124P3 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$) can have a thickness of about 0.5 nm to about 4 nm. Within these thickness ranges of IL layers 122N1-122N3 and 122P1-122P3 and HK gate dielectric layers 124N1-124N3 and 124P1-124P3, adequate electrical isolation between gate structures 112N1-112N3 and 112P1-112P3 and nanostructures channel regions 121 can be provided without compromising device size and manufacturing cost. In some embodiments, one or more of HK gate dielectric layers 124N1-124N3 and 124P1-124P3 can include metal dopants that induce the formation of dipole layers with n-type dipoles (N-dipoles) and/or p-type dipoles (P-dipoles) at interfaces between (i) IL layer 122N1 and HK gate dielectric layer 124N1 ("interface N1), (ii) IL layer 122N2 and HK gate dielectric layer 124N2 ("interface N2), (iii) IL layer 122N3 and HK gate dielectric layer 124N3 ("interface N3), (iv) IL layer 122P1 and HK gate dielectric layer 124P1 ("interface P1), (v) IL layer 122P2 and HK gate dielectric layer 124P2 ("interface P2), and/or (vi) IL layer 122P3 and HK gate dielectric layer 124P3 ("interface P3), as described below with reference to FIGS. 1D-1N.

The one or more of HK gate dielectric layers 124N1-124N3 and 124P1-124P3 can have metal dopants that differ from each other in type and/or concentration. The metal dopants of different types and/or concentrations can induce dipoles of different polarities (e.g., N-dipoles and P-dipoles) and/or concentrations at interfaces N1-N3 and/or P1-P3, which can result in gate structures 112N1-112N3 and 112P1-112P3 with EWF values that are different from each other. As EWF values correspond to threshold voltage, gate structures 112N1-112N3 and 112P1-112P3 with different EWF values result in gate structures 112N1-112N3 and 112P1-112P3 with different threshold voltages on the same substrate. In some embodiments, the types and/or concentrations of metal dopants in HK gate dielectric layers 124N1-124N3 are configured to form gate structure 112N1 with a threshold voltage smaller than that of gate structures 112N2-112N3 and to form gate structure 112N2 with a threshold voltage smaller than that of gate structure 112N3, as described below with reference to FIGS. 1D, 1F, 1H, 1J, and 1L. Similarly, in some embodiments, the types and/or concentrations of metal dopants in HK gate dielectric layers 124P1-124P3 are configured to form gate structure 112P3 with a threshold voltage smaller than that of gate structures 112P1-112P2 and to form gate structure 112P2 with a threshold voltage smaller than that of gate structure 112P1, as described below with reference to FIGS. 1E, 1G, 1I, 1K, and 1M.

In some embodiments, WFM layers 126 of gate structures 112N1-112N3 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. In some embodiments, WFM layers 126 of gate structures 112P1-112P3 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu) alloy, and a combination thereof. In some embodiments, gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Insulating capping layers 132 protects the underlying conductive capping layers 130 from structural and/or compositional degradation during subsequent processing of the semiconductor device. In some embodiments, insulating capping layer 132 can include a nitride material, such as silicon nitride, and can have a thickness of about 5 nm to about 10 nm for adequate protection of the underlying conductive capping layer 130. Conductive capping layers 130 provide conductive interfaces between gate metal fill layers 128 and gate contact structures (not shown) to electrically connect gate metal fill layers 128 to gate contact structures without forming gate contact structures directly on or within gate metal fill layers 128. In some embodiments, conductive capping layer 130 can include a metallic material, such as W, Ru, Ir, Mo, other suitable metallic materials, and a combination thereof.

FIGS. 1D-1E, 1F-1G, 1H-1I, 1J-1K, and 1L-1M illustrate metal dopant configurations in HK gate dielectric layers 124N1-124N3 and 124P1-124P3 that induces dipole configurations at interfaces N1-N3 and P1-P3 to form (i) gate structure 112N1 with a threshold voltage smaller than that of gate structures 112N2-112N3, (ii) gate structure 112N2 with a threshold voltage smaller than that of gate structure 112N3, (iii) gate structure 112P3 with a threshold voltage smaller than that of gate structures 112P1-112P2, and (iv) gate structure 112P2 with a threshold voltage smaller than that of gate structure 112P1, according to some embodiments.

Referring to Fig, 1D, in some embodiments, HK gate dielectric layer 124N3 can be undoped and HK gate dielectric layers 124N1-124N2 can include the same type and different concentrations of metal dopants 140 that can induce dipole layers 142N1-142N2 with the same type and different concentrations of N-dipoles 144 at interfaces N1-N2. Metal dopants 140 can include rare-earth metals (REMs), such as lanthanum (La), yttrium (Y), cerium (Ce), ytterbium (Yb), and erbium (Er), or alkaline metals (ALMs), such as magnesium (Mg), calcium (Ca), strontium (Sr), and barium (Ba). In some embodiments, N-dipoles 144 can include metal ions from metal dopants 140 and oxygen ions from IL layer 122N1-122N2. REM dopants 140 can induce REM-based N-dipoles 144 and ALM dopants 140 can induce ALM-based N-dipoles 144. In some embodiments, N-dipoles 144 can include REM-based N-dipoles 144 or ALM-based N-dipoles 144. In some embodiments, REM-based N-dipoles 144 can include La—O dipoles when metal dopants 140 include La. In some embodiments, ALM-based N-dipoles 144 can include Mg—O dipoles when metal dopants 140 include Mg.

As metal dopant concentration is directly proportional to N-dipole concentration, which is inversely proportional to threshold voltage of an NFET gate structure, (i) HK gate dielectric layer 124N1 has a higher concentration of metal dopants 140 than that in HK gate dielectric layers 124N2-124N3 to form gate structure 112N1 with a threshold voltage smaller than that of gate structures 112N2-112N3, and (ii) HK gate dielectric layer 124N2 has a higher concentration of metal dopants 140 than that in HK gate dielectric layer 124N3 to form gate structure 112N2 with a threshold voltage smaller than that of gate structure 112N3. Thus, in some embodiments, threshold voltages across different NFET gate structures (e.g., gate structures 112N1-112N3) can be varied with different concentrations of the same polarity dipoles (e.g., N-dipoles 144).

Figure 1J:
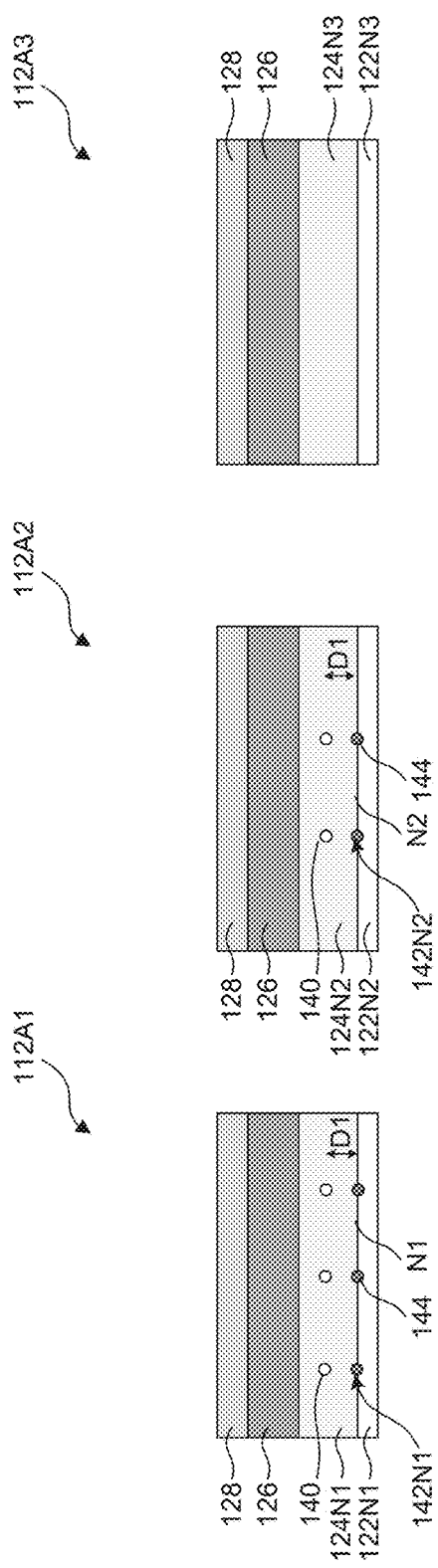
Figure 1K:
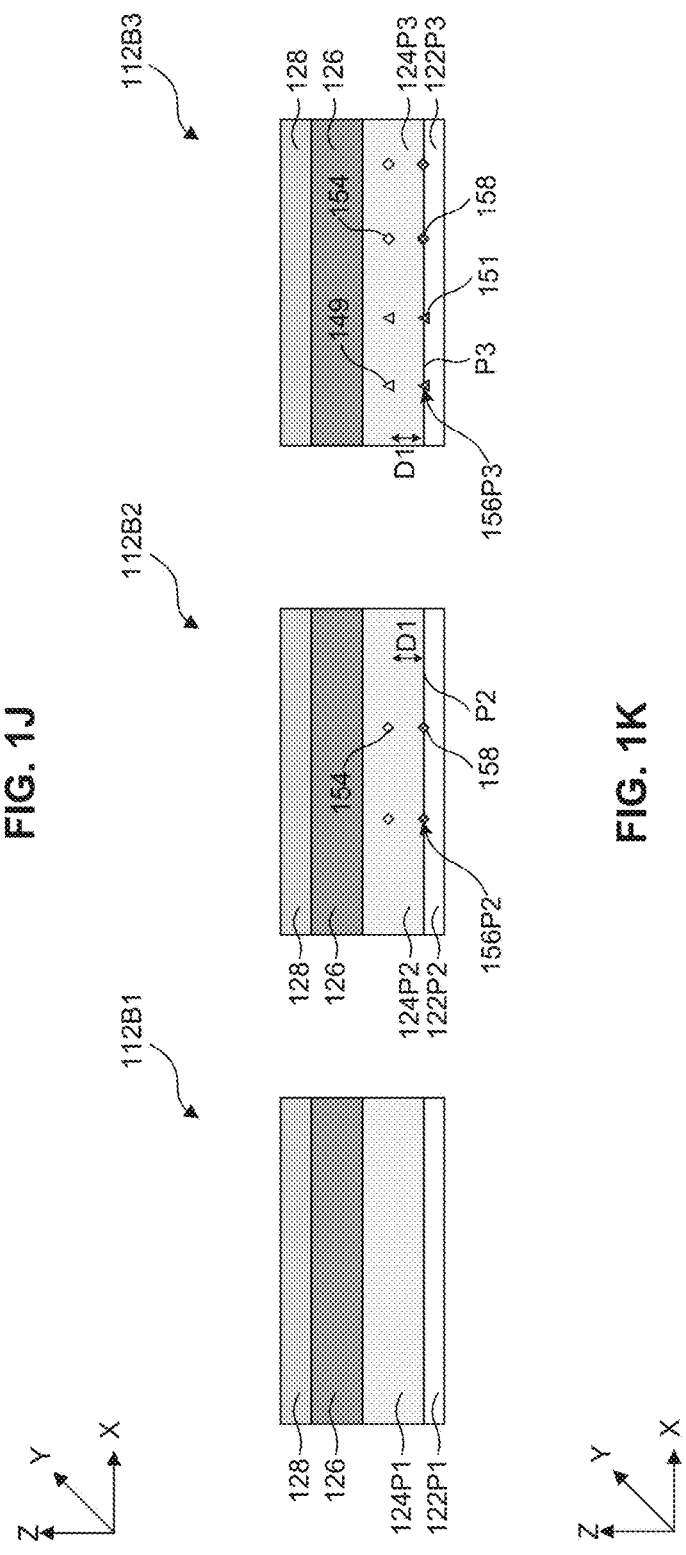
Figure 1L:
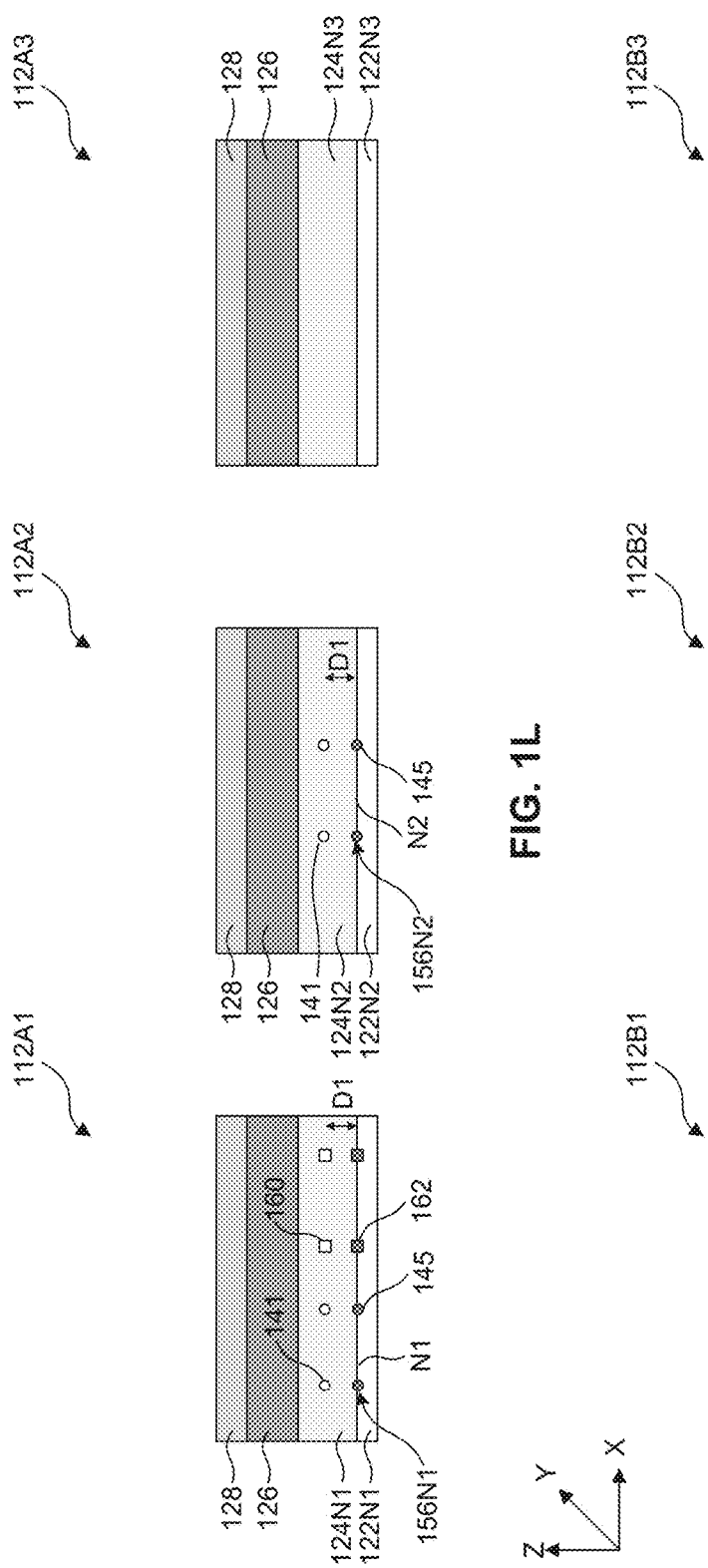
Figure 1M:
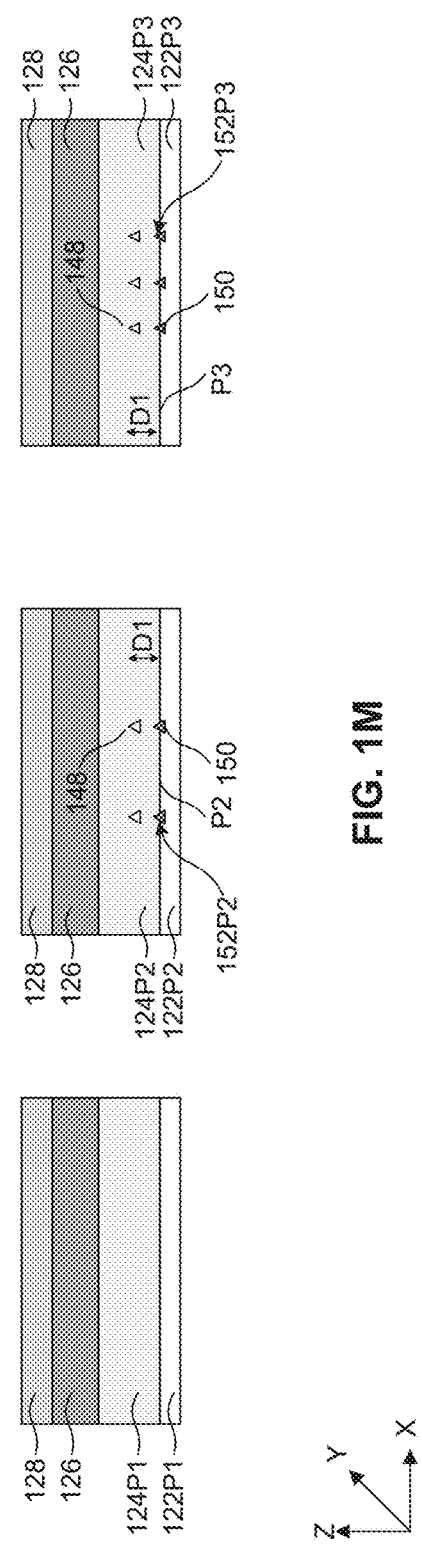
Figure 1N:
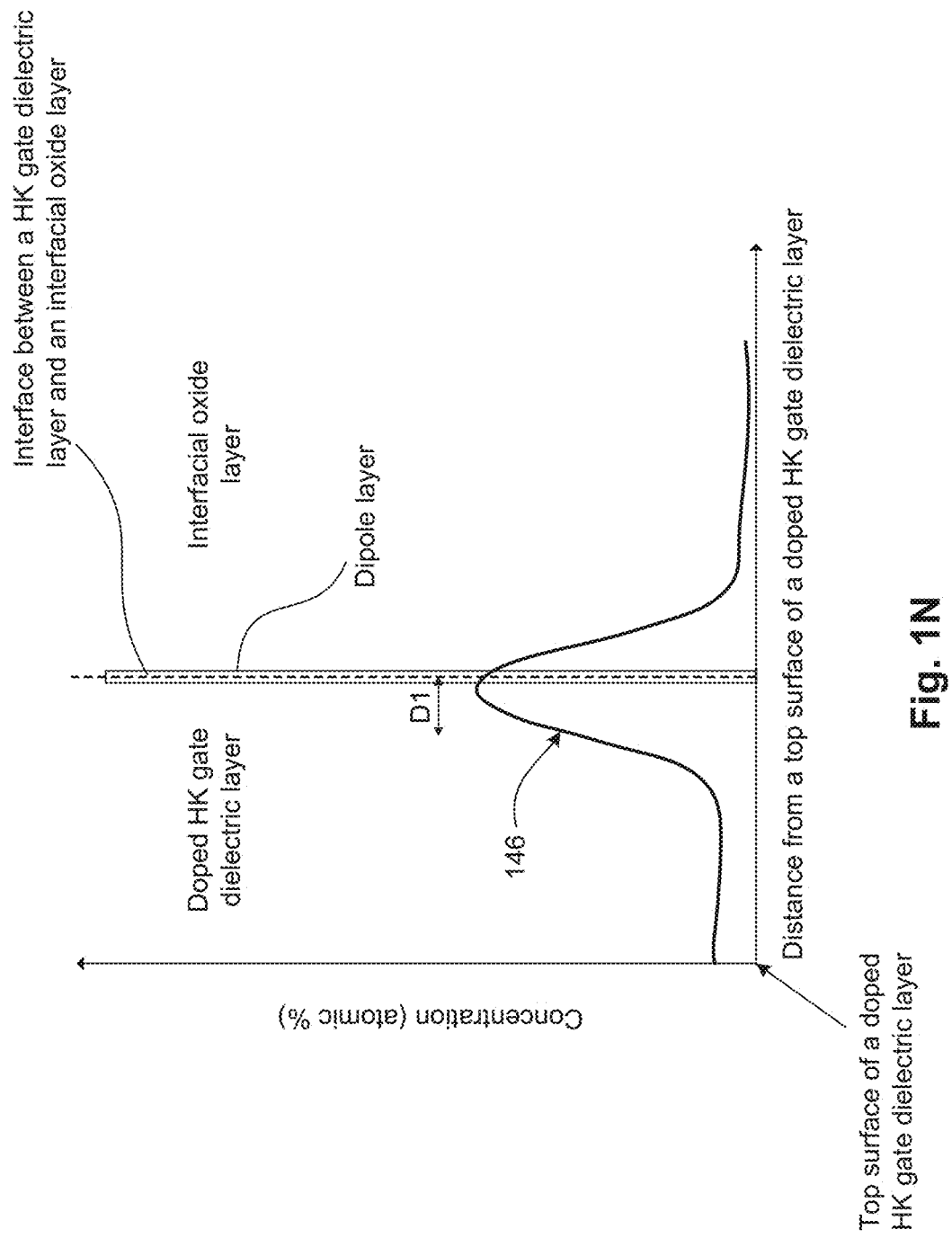
FIG. 1N illustrates a device characteristic of a semiconductor device with different gate structures, in accordance with some embodiments.

In some embodiments, the peak concentrations of metal dopants 140 in HK gate dielectric layer 124N1 can be at interface N1 or within distance D1 from interface N1 and the peak concentrations of metal dopants 140 in HK gate dielectric layer 124N2 can be at interface N2 or within distance D1 from interface N2, as illustrated by metal dopant concentration profile 146 in FIG. 1N. In some embodiments, distance D1 can be about 0.1 nm to about 1 nm. If distance D1 is greater than 1 nm, the concentration of N-dipoles 144 may not be directly proportional to the concentration of metal dopant 140, and as a result, the concentration of N-dipoles 144 may not be adequately controlled to adjust the threshold voltage. In some embodiments, the peak concentration of metal dopants 140 in HK gate dielectric layer 124N1 can be about 70 atomic % to about 80 atomic % to form gate structure 112N1 with an ultra-low threshold voltage. In some embodiments, the peak concentration of metal dopants 140 in HK gate dielectric layer 124N2 can be about 40 atomic % to about 60 atomic % to form gate structure 112N2 with a low threshold voltage.

Referring to FIG. 1E, in some embodiments, HK gate dielectric layers 124P1-124P3 can include the same type and substantially equal concentration of metal dopants 148 that can induce dipole layers 142P1-142P3 with the same type and substantially equal concentration of P-dipoles 150 at interfaces P1-P3. Metal dopants 148 can include group 13 metals (GTMs) of the periodic table, such as gallium (Ga), aluminum (Al), and indium (In), or transition metals (TRMs), such as zinc (Zn), niobium (Nb), molybdenum (Mo), tungsten (W), and tantalum (Ta). In some embodiments, P-dipoles 150 can include metal ions from metal dopants 148 and oxygen ions from IL layers 122P1-122P3. GTM dopants 148 can induce GTM-based P-dipoles 150 and TRM dopants 148 can induce TRM-based P-dipoles 150. In some embodiments, P-dipoles 150 can include GTM-based P-dipoles 150 or TRM-based P-dipoles 150. In some embodiments, GTM-based P-dipoles 150 can include Ga-O dipoles when metal dopants 148 include Ga. In some embodiments, TRM-based P-dipoles 150 can include Zn-O dipoles when metal dopants 148 include Zn.

In some embodiments, HK gate dielectric layers 124P1-124P2 can further include the same type and different concentrations of metal dopants 140 that can induce the same type and different concentrations of N-dipoles 144 in dipole layers 142P1-142P2. The same type and substantially equal concentration of P-dipoles 150 may form gate structures 112P1-112P3 with substantially equal threshold voltages. The presence of different concentrations of N-dipoles 144 along with P-dipoles 150 can adjust the threshold voltages to be different from each other. As metal dopant concentration is directly proportional to N-dipole concentration, which is directly proportional to threshold voltage of a PFET gate structure, (i) HK gate dielectric layer 124P1 has a higher concentration of metal dopants 140 than that in HK gate dielectric layers 124P2-124P3 to form gate structure 112P1 with a threshold voltage greater than that of gate structures 112P2-112P3, and (ii) HK gate dielectric layer 124P2 has a higher concentration of metal dopants 140 than that in HK gate dielectric layers 124P3 to form gate structure 112P2 with a threshold voltage greater than that of gate structure 112P3. Thus, in some embodiments, threshold voltages across different PFET gate structures (e.g., gate structures 112P1-112P3) can be varied with different concentrations of mixed polarity dipoles (e.g., N-dipoles 144 and P-dipoles 150).

In some embodiments, the peak concentrations of metal dopants 140 and 148 in HK gate dielectric layer 124P1 can be at interface P1 or within distance D1 from interface P1, as illustrated by metal dopant concentration profile 146 in FIG. 1N. In some embodiments, the peak concentrations of metal dopants 140 and 148 in HK gate dielectric layer 124P2 can be at interface P2 or within distance D1 from interface P2, as illustrated by metal dopant concentration profile 146 in FIG. 1N. In some embodiments, the peak concentrations of metal dopants 148 in HK gate dielectric layer 124P3 can be at interface P3 or within distance D1 from interface P3, as illustrated by metal dopant concentration profile 146 in FIG. 1N. In some embodiments, the peak concentration of metal dopants 148 in HK gate dielectric layers 124P3 can be about 50 atomic % to about 80 atomic % to form gate structure 112P3 with an ultra-low threshold voltage. In some embodiments, the peak concentrations of metal dopants 140 in HK gate dielectric layer 124P2 can be about 5 atomic % to about 30 atomic % to form gate structure 112P2 with a low threshold voltage. In some embodiments, the peak concentrations of metal dopants 140 in HK gate dielectric layer 124P1 can be about 10 atomic % to about 40 atomic % to form gate structure 112P1 with a threshold voltage greater than about 200 mV.

Referring to FIG. 1F, in some embodiments, HK gate dielectric layers 124N1-124N3 can include the same type and substantially equal concentration of metal dopants 140 that can induce dipole layers 152N1-152N3 with the same type and substantially equal concentration of N-dipoles 144 at interfaces N1-N3. In some embodiments, HK gate dielectric layers 124N2-124N3 can further include the same type and different concentrations of metal dopants 148 that can induce the same type and different concentrations of P-dipoles 150 in dipole layers 152P1-152P2. The same type and substantially equal concentration of N-dipoles 144 may form gate structures 112N1-112N3 with substantially equal threshold voltages. The presence of different concentrations of P-dipoles 150 along with N-dipoles 144 can adjust the threshold voltages to be different from each other.

As metal dopant concentration is directly proportional to P-dipole concentration, which is directly proportional to threshold voltage of an NFET gate structure, (i) HK gate dielectric layer 124N3 has a higher concentration of metal dopants 148 than that in HK gate dielectric layers 124N1-124N2 to form gate structure 112N3 with a threshold voltage greater than that of gate structures 124N1-124N2, and (ii) HK gate dielectric layer 124N2 has a higher concentration of metal dopants 148 than that in HK gate dielectric layer 124N1 to form gate structure 112N2 with a threshold voltage greater than that of gate structure 112N1. Thus, in some embodiments, threshold voltages across different NFET gate structures (e.g., gate structures 11NP1-112N3) can be varied with different concentrations of mixed polarity dipoles (e.g., N-dipoles 144 and P-dipoles 150).

In some embodiments, the peak concentration of metal dopants 140 in HK gate dielectric layers 124N1 can be about 50 atomic % to about 80 atomic % to form gate structure 112N1 with an ultra-low threshold voltage. In some embodiments, the peak concentration of metal dopants 148 in HK gate dielectric layer 124N2 can be about 5 atomic % to about 30 atomic % to form gate structure 112N2 with a low threshold voltage. In some embodiments, the peak concentration of metal dopants 148 in HK gate dielectric layer 124N3 can be about 10 atomic % to about 40 atomic % to form gate structure 112N3 with a threshold voltage greater than about 200 mV.

Referring to FIG. 1G, in some embodiments, HK gate dielectric layer 124P1 can be undoped and HK gate dielectric layers 124P2-124P3 can include the same type and different concentrations of metal dopants 148 that can induce dipole layers 152P2-152P3 with the same type and different concentrations of P-dipoles 150 at interfaces P2-P3. As metal dopant concentration is directly proportional to P-dipole concentration, which is inversely proportional to threshold voltage of a PFET gate structure, (i) HK gate dielectric layer 124P3 has a higher concentration of metal dopants 148 than that in HK gate dielectric layers 124P1-124P2 to form gate structure 112P3 with a threshold voltage smaller than that of gate structures 112P1-112P2, and (ii) HK gate dielectric layer 124P2 has a higher concentration of metal dopants 148 than that in HK gate dielectric layer 124P1 to form gate structure 112P2 with a threshold voltage smaller than that of gate structure 112P1. Thus, in some embodiments, threshold voltages across different PFET gate structures (e.g., gate structures 112P1-112P3) can be varied with different concentrations of the same polarity dipoles (e.g., P-dipoles 150).

In some embodiments, the peak concentrations of metal dopants 148 in HK gate dielectric layers 124P2-124P3 can be at interfaces P2-P3 or within distance D1 from interfaces P2-P3, as illustrated by metal dopant concentration profile 146 in FIG. 1N. In some embodiments, the peak concentration of metal dopants 148 in HK gate dielectric layer 124P3 can be about 70 atomic % to about 80 atomic % to form gate structure 112P3 with an ultra-low threshold voltage. In some embodiments, the peak concentration of metal dopants 148 in HK gate dielectric layer 124N2 can be about 40 atomic % to about 60 atomic % to form gate structure 112P2 with a low threshold voltage.

Referring to FIG. 1H, the discussion of gate regions 112A1-112A3 of FIG. 1D applies to gate regions 112A1-112A3 of FIG. 1H. Referring to FIG. 1I, the discussion of gate regions 112B1-112B3 of FIG. 1G applies to gate regions 112B1-112B3 of FIG. 1I.

Referring to FIG. 1J, the discussion of gate regions 112A1-112A3 of FIG. 1D applies to gate regions 112A1-112A3 of FIG. 1J. Referring to FIG. 1K, in some embodiments, HK gate dielectric layer 124P1 can be undoped and HK gate dielectric layers 124P2-124P3 can include different types of metal dopants 149 and 154 that can induce dipole layers 156P2-156P3 with the same type of P-dipoles 151 and 158 at interfaces P2-P3. Metal dopants 149 can include GTMs of the periodic table, such as Ga, Al, and In. Metal dopants 154 can include TRMs, such as Zn, Nb, Mo, W, and Ta. P-dipoles 151 can include metal ions from metal dopants 149 and oxygen ions from IL layer 122P3. P-dipoles 158 can include metal ions from metal dopants 154 and oxygen ions from IL layers 122P2-122P3. GTM dopants 149 can induce GTM-based P-dipoles 151 and TRM dopants 154 can induce TRM-based P-dipoles 158. In some embodiments, GTM-based P-dipoles 151 can include Ga-O dipoles when metal dopants 149 include Ga. In some embodiments, TRM-based P-dipoles 158 can include Zn-O dipoles when metal dopants 154 include Zn.

Similar to gate regions 112B1-112B3 of FIG. 1G, threshold voltages across gate regions 112B1-112B3 of FIG. 1K are varied with different concentrations of P-dipoles and the concentration of P-dipoles (e.g., combined concentration of P-dipoles 151 and 158) in gate region 112B3 is greater than that in gate region 112B2. Unlike gate region 112B3 of FIG.

1G, the P-dipoles (e.g., P-dipoles 151 and 158) of gate region 112B3 of FIG. 1K are induced by different types of metal dopants (e.g., metal dopants 149 and 154).

In some embodiments, the peak concentrations of metal dopants 149 and 154 in HK gate dielectric layers 124P2-124P3 can be at interfaces P2-P3 or within distance D1 from interfaces P2-P3, as illustrated by metal dopant concentration profile 146 in FIG. 1N. In some embodiments, the total peak concentrations of metal dopants 149 and 154 in HK gate dielectric layer 124P3 can be about 70 atomic % to about 80 atomic % to form gate structure 112P3 with an ultra-low threshold voltage. In some embodiments, the peak concentration of metal dopants 154 in HK gate dielectric layer 124P2 can be about 40 atomic % to about 60 atomic % to form gate structure 112P2 with a low threshold voltage.

Referring to FIG. 1L, in some embodiments, HK gate dielectric layer 124N3 can be undoped and HK gate dielectric layers 124N1-124N2 can include different types of metal dopants 141 and 160 that can induce dipole layers 156N1-156N2 with the same type of N-dipoles 145 and 162 at interfaces N1-N2. Metal dopants 141 can include REMs, such as La, Y, Ce, Yb, and Er. Metal dopants 160 can include ALMs, such as Mg, Ca, Sr, and Ba. N-dipoles 145 can include metal ions from metal dopants 141 and oxygen ions from IL layers 122N1-122N2. N-dipoles 162 can include metal ions from metal dopants 160 and oxygen ions from IL layer 122N1. REM dopants 141 can induce REM-based N-dipoles 145 and ALM dopants 160 can induce ALM-based N-dipoles 162. In some embodiments, REM-based N-dipoles 145 can include La—O dipoles when metal dopants 141 include La. In some embodiments, ALM-based N-dipoles 162 can include Mg—O dipoles when metal dopants 160 include Mg.

Similar to gate regions 112A1-112A3 of FIG. 1D, threshold voltages across gate regions 112A1-112A3 of FIG. 1L are varied with different concentrations of N-dipoles and the concentration of N-dipoles (e.g., combined concentration of N-dipoles 145 and 162) in gate region 112N1 is greater than that in gate region 112N2. Unlike gate region 112N1 of FIG. 1D, the N-dipoles (e.g., N-dipoles 145 and 162) of gate region 112N1 of FIG. 1L are induced by different types of metal dopants (e.g., metal dopants 141 and 160).

In some embodiments, the peak concentrations of metal dopants 141 and 160 in HK gate dielectric layer 124N1 can be at interface N1 or within distance D1 from interface N1, as illustrated by metal dopant concentration profile 146 in FIG. 1N. In some embodiments, the peak concentrations of metal dopants 141 in HK gate dielectric layer 124N2 can be at interface N2 or within distance D1 from interface N2, as illustrated by metal dopant concentration profile 146 in FIG. 1N. In some embodiments, the total peak concentrations of metal dopants 149 and 154 in HK gate dielectric layer 124P3 can be about 70 atomic % to about 80 atomic % to form gate structure 112P3 with an ultra-low threshold voltage. In some embodiments, the peak concentration of metal dopants 154 in HK gate dielectric layer 124P2 can be about 40 atomic % to about 60 atomic % to form gate structure 112P2 with a low threshold voltage.

Referring to FIG. 1M, the discussion of gate regions 112B1-112B3 of FIG. 1G applies to gate regions 112B1-112B3 of FIG. 1M.

Figure 2:
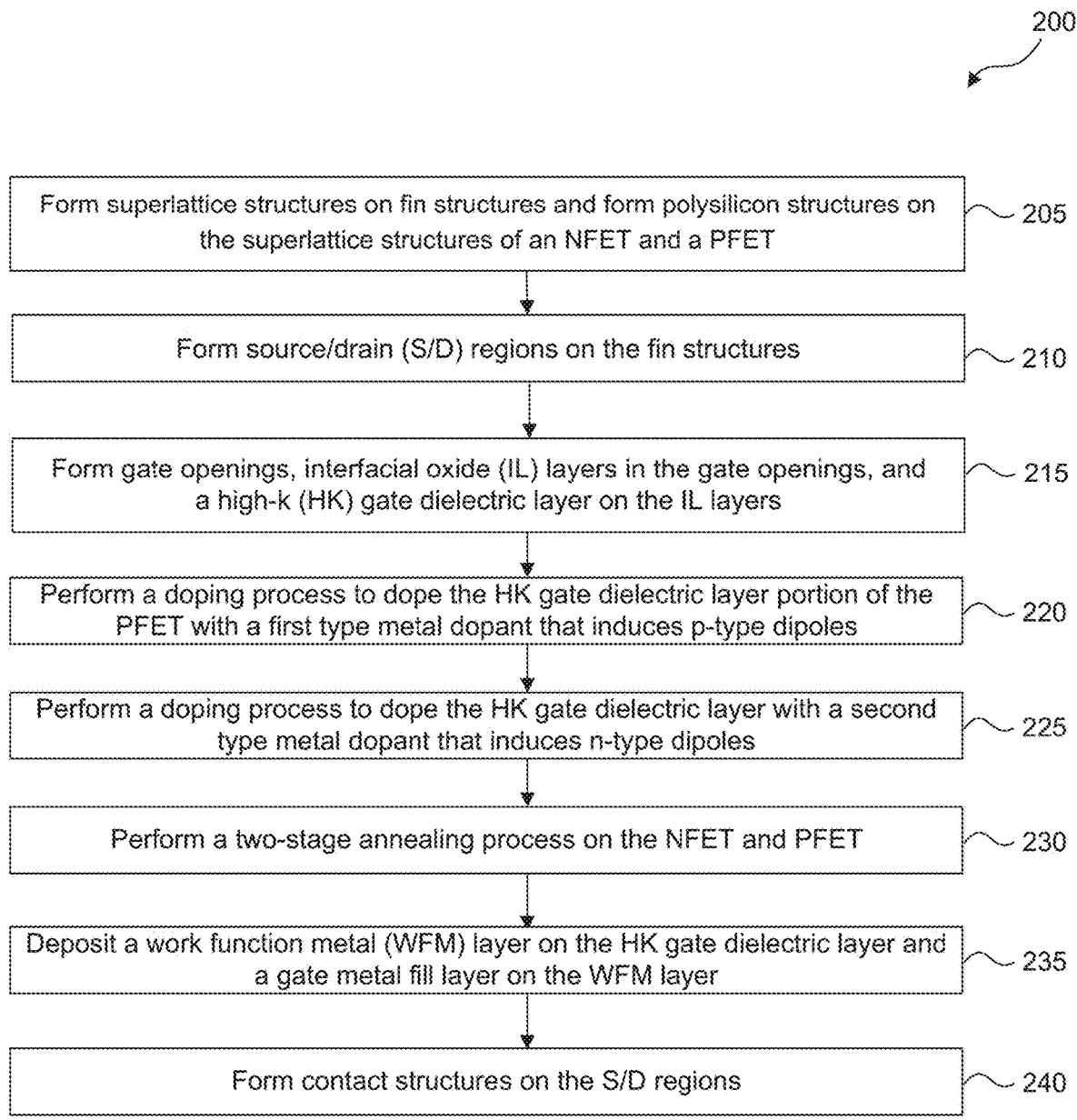
FIG. 2 is a flow diagram of a method for fabricating a semiconductor device with different gate structures, in accordance with some embodiments.

FIG. 2 is a flow diagram of an example method 200 for fabricating NFET 102N and PFET 102P with cross-sectional views shown in FIGS. 1D and 1E, according to some embodiments. For illustrative purposes, the operations illustrated in FIG. 2 will be described with reference to the example fabrication process for fabricating NFET 102N and PFET 102P as illustrated in FIGS. 3A-15B. FIGS. 3A-15A are cross-sectional views of NFET 102N along line A-A of FIG. 1A, and FIGS. 3B-15B are cross-sectional views of PFET 102P along line B-B of FIG. 1A at various stages of fabrication, according to some embodiments. Operations can be performed in a different order or not performed depending on specific applications. It should be noted that method 200 may not produce a complete NFET 102N and PFET 102P. Accordingly, it is understood that additional processes can be provided before, during, and after method 200, and that some other processes may only be briefly described herein. Elements in FIGS. 3A-15B with the same annotations as elements in FIGS. 1A-1E are described above.

Figure 3A:
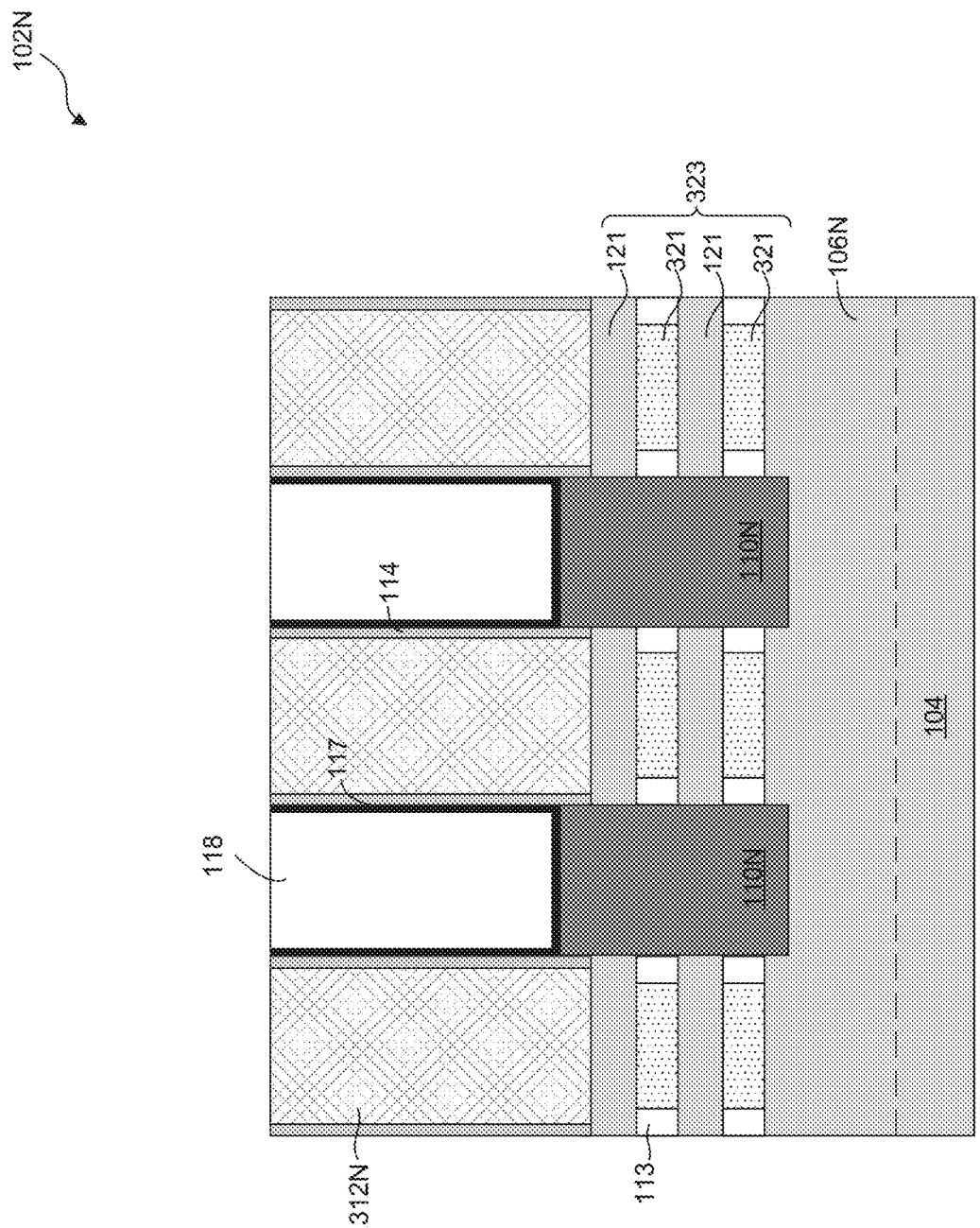
Figure 3B:
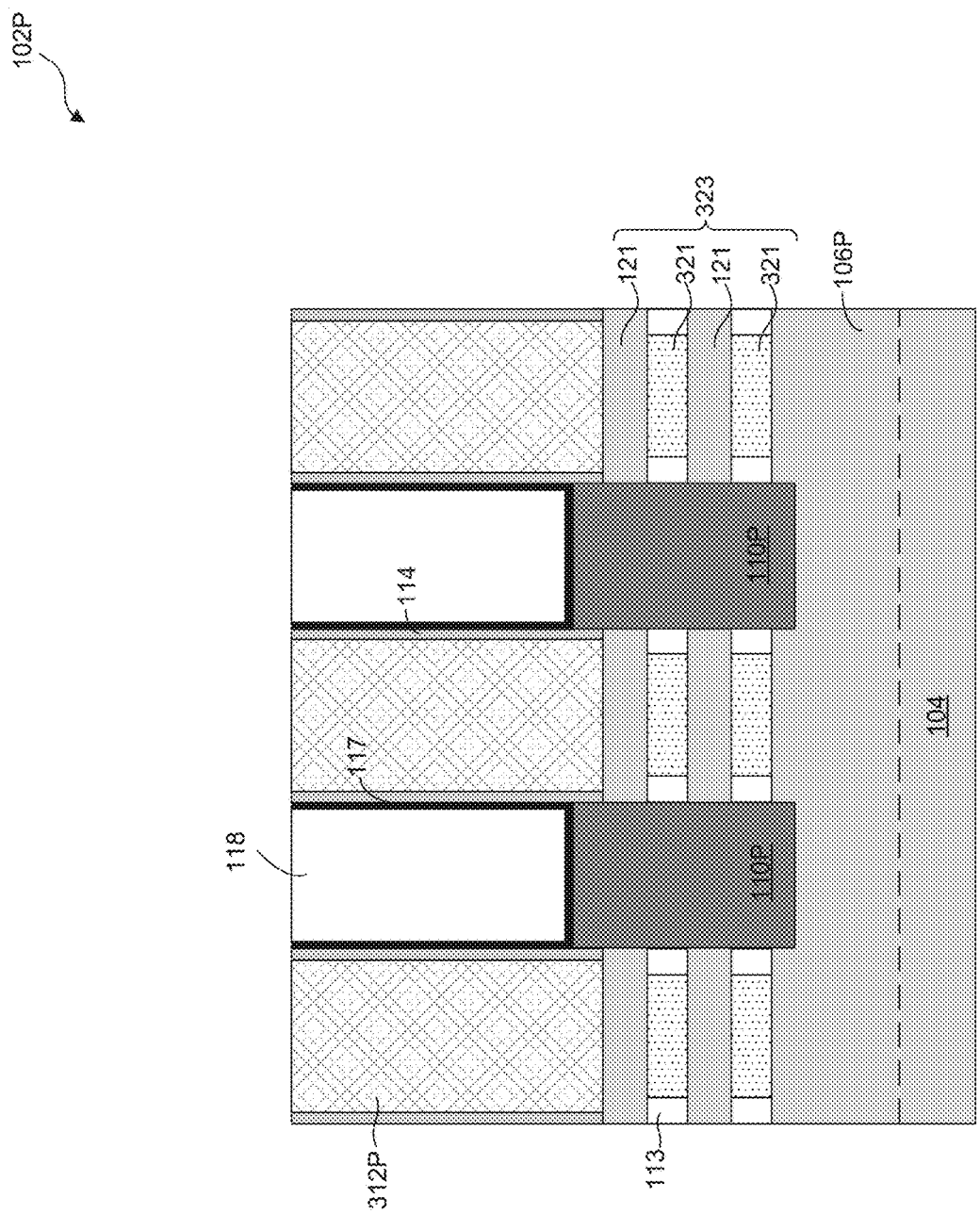

Referring to FIG. 2, in operation 205, superlattice structures are formed on fin structures, and polysilicon structures are formed on the superlattice structures for an NFET and a PFET. For example, as shown in FIGS. 3A-3B, superlattice structures 323 are formed on fin structures 106N-106P, and polysilicon structures 312N-312P are formed on superlattice structures 323. Superlattice structures 323 can include nanostructured layers 121 and 321 arranged in an alternating configuration. In some embodiments, nanostructured layers 121 and 321 include materials different from each other. Nanostructured layers 321 are also referred to as sacrificial layers 321. During subsequent processing, polysilicon structures 312N-312P and sacrificial layers 321 can be replaced in a gate replacement process to form gate structures 112N1-112N3 and 112P1-112P3.

Referring to FIG. 2, in operation 210, S/D regions are formed on the fin structures. For example as shown in FIGS. 3A-3B, S/D regions 110N-110P are formed on fin structures 106N-106P. In some embodiments, S/D regions 110N-110P can be epitaxially grown on fin structures 106N-106P. Prior to the formation of S/D regions 110N-110P, inner spacers 113 can be formed in superlattice structures 323, as shown in FIGS. 3A-3B. After the formation of S/D regions 110N-110P, ESL 117 and ILD layer 118 can be formed, as shown in FIGS. 3A-3B.

Figure 4A:
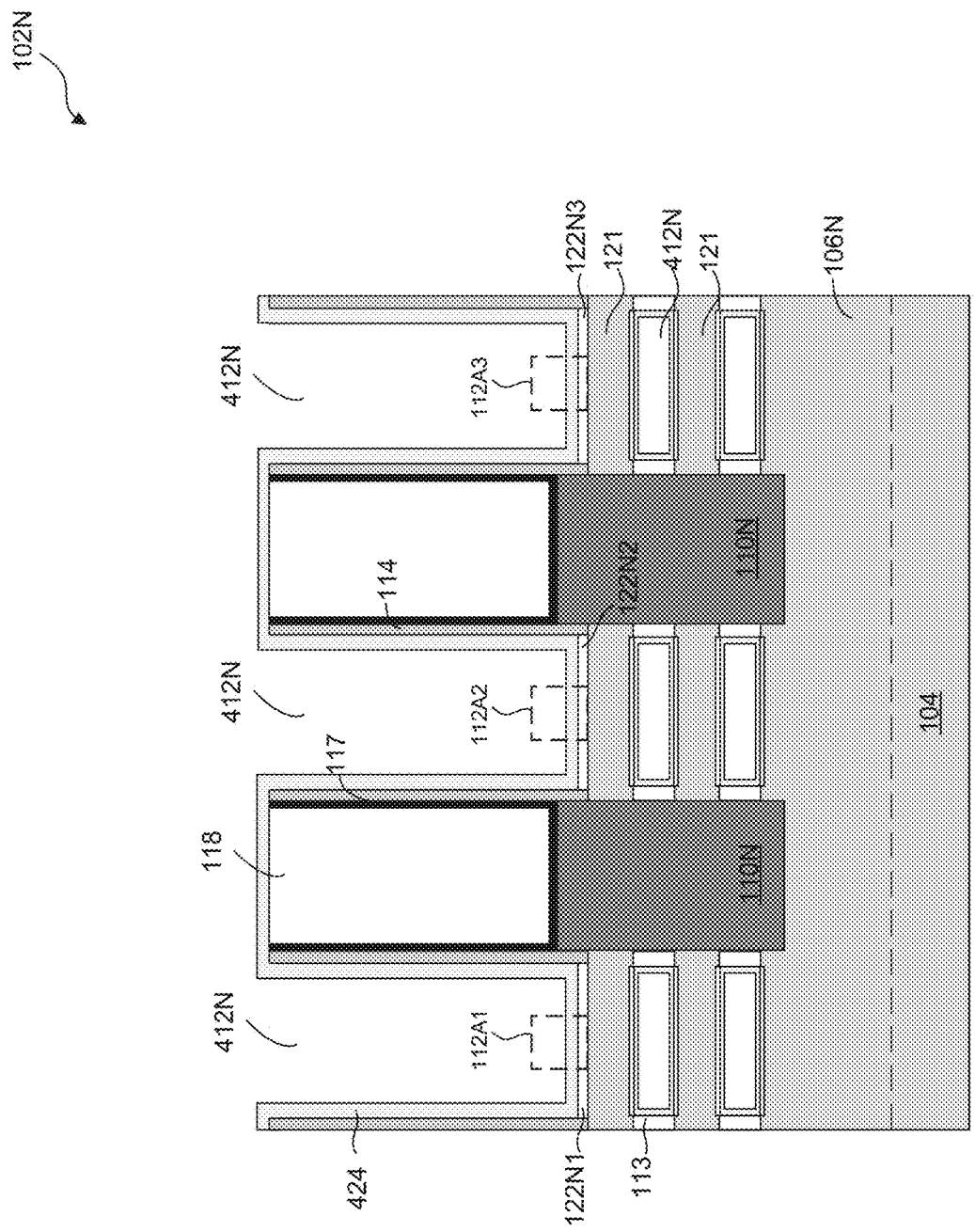
Figure 4B:
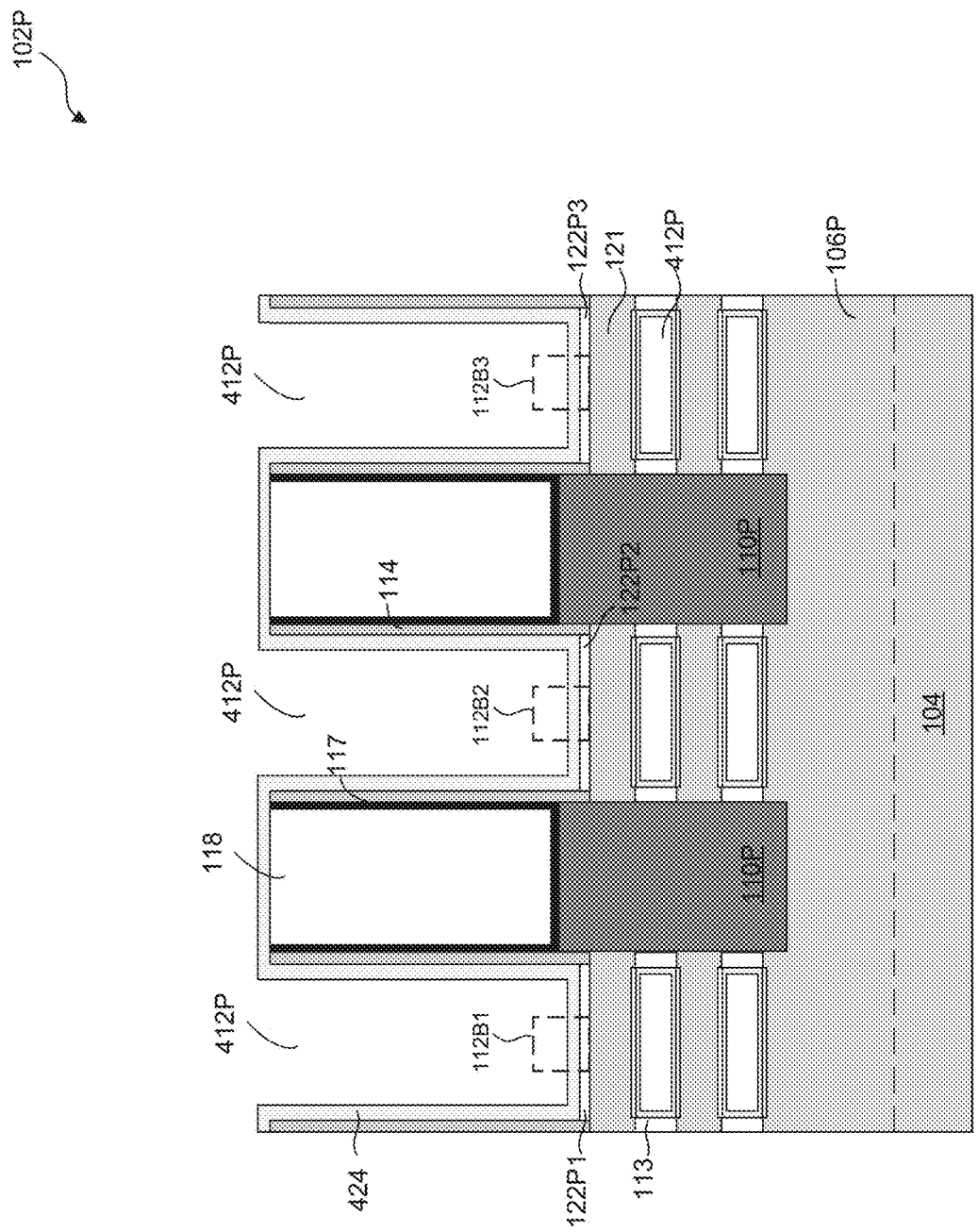

Referring to FIG. 2, in operation 215, gate openings are formed, IL layers are formed in the gate openings, and a HK gate dielectric layer is formed on the IL layers. For example, as shown in FIGS. 4A-4B, gate openings 412N-412P are formed by removing polysilicon structures 312N-312P and sacrificial layers 321, IL layers 122N1-122N3 and 122P1-122P3 are formed in gate openings 412N-412P, and a HK gate dielectric layer 424 is formed on IL layers 122N1-122N3 and 122P1-122P3.

The subsequent processing on the structures of FIGS. 4A-4B in operations 220-235 are described with reference to FIGS. 5A-15B. FIGS. 5A-15A are enlarged views of gate regions 112A1-112A3 of FIG. 4A and FIGS. 5B-15B are enlarged views of gate regions 112B1-112B3 of FIG. 4B.

Figure 6A:
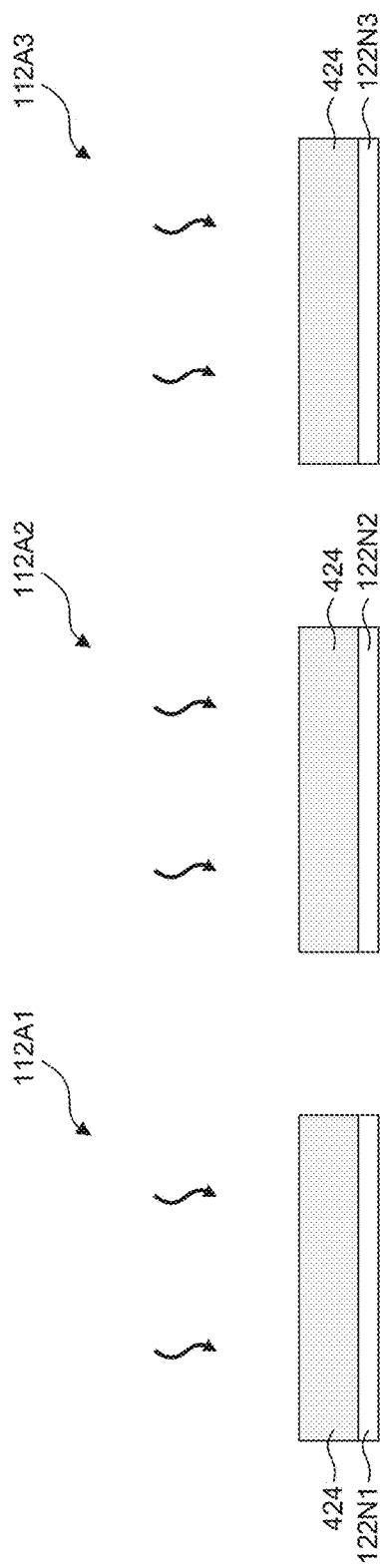
Figure 6B:
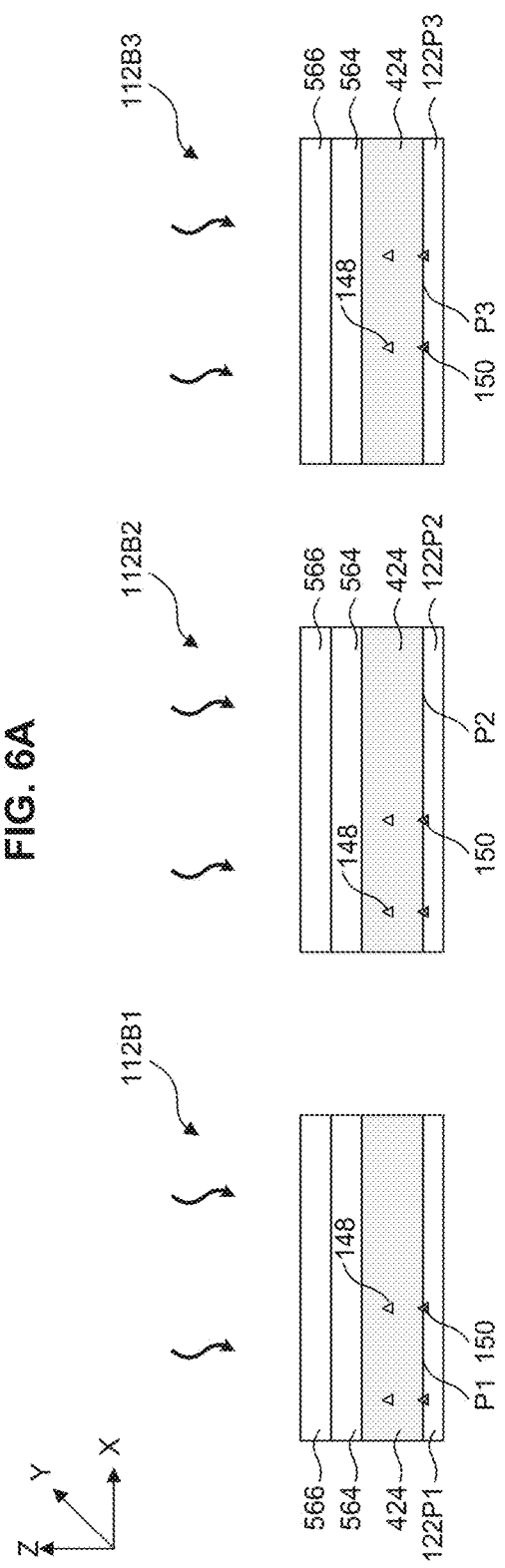

Referring to FIG. 2, in operation 220, a doping process is performed to dope the HK gate dielectric layer portion of the PFET with a first type metal dopant that induces P-dipoles. For example, as described with reference to FIGS. 5A-6B, a doping process is performed to dope portions of HK gate dielectric layer 424 in gate regions 112B1-112B3 with metal dopants 148 that induces P-dipoles 150. The doping process can include sequential operations of (i) depositing a dopant source layer 564 on HK gate dielectric layer 424, as shown in FIGS. 5A-5B, (ii) depositing a capping layer 566 on dopant source layer 564, as shown in FIGS. 5A-5B, (iii) selectively removing portions of dopant source layer 564 and capping layer 566 from gate regions 112A1-112A3 by using lithographic patterning and etching processes to form the structures of FIGS. 6A-6B, (iv) performing a drive-in anneal process on the structures of FIGS. 6A-6B to implant metal dopants 148 into portions of HK gate dielectric layer 424 in gate regions 112B1-112B3, as shown in FIG. 6B, and (iv) removing dopant source layer 564 and capping layer 566 from the structures of FIG. 6B.

The deposition of dopant source layer 564 can include depositing a layer of GTM oxide, such as gallium oxide ($Ga_2O_3$), aluminum oxide ($Al_2O_3$), and indium oxide ($In_2O_3$), or a layer of TRM oxide, such as zinc oxide ($ZnO_2$), niobium oxide ($NbO_2$), molybdenum oxide ($MoO_2$), tungsten oxide ($WO_3$), and tantalum oxide ($Ta_2O_5$) in a chemical vapor deposition (CVD) process or an atomic layer deposition (ALD) process. In some embodiments, dopant source layer 564 can be deposited with a thickness of about 0.1 nm to about 5 nm to adequately perform the doping process without compromising manufacturing cost.

The deposition of capping layer 566 can include depositing a layer of aluminum oxide ($Al_2O_3$) or other suitable metal oxide in a CVD process or an ALD process with a thickness of about 0.1 nm to about 5 nm. In some embodiments, capping layer 566 can prevent the material of dopant source layer 564 from evaporating during the drive-in anneal process.

The drive-in anneal process can implant metal dopants 148 into HK gate dielectric layer 424 through diffusion of metal atoms from dopant source layer 564 into HK gate dielectric layer 424. The drive-in anneal process can include annealing the structures of FIGS. 6A-6B at a temperature from about 500° C. to about 850° C. and at a pressure from about 1 torr to about 50 torr for a time period ranging from about 0.1 second to about 3 minutes. In some embodiments, the drive-in anneal process can include two anneal processes: (i) a soak anneal process at a temperature from about 500° C. to about 850° C. for a time period ranging from about 2 sec to about 60 sec, and (ii) a spike anneal process at a temperature from about 700° C. to about 850° C. for a time period ranging from about 0.1 second to about 2 seconds.

Figure 11A:
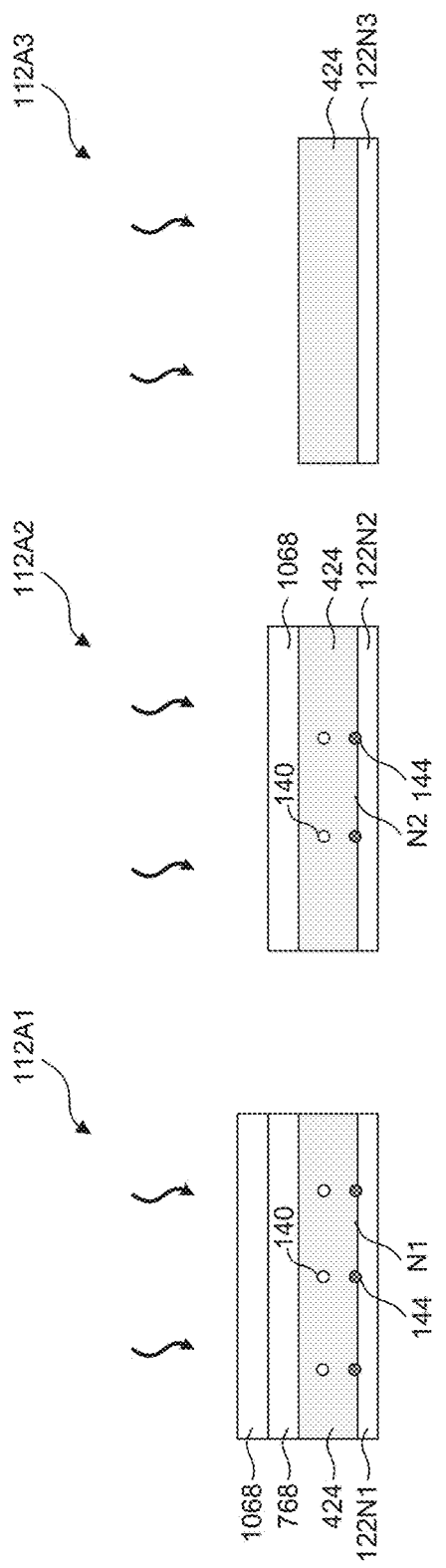
Figure 11B:
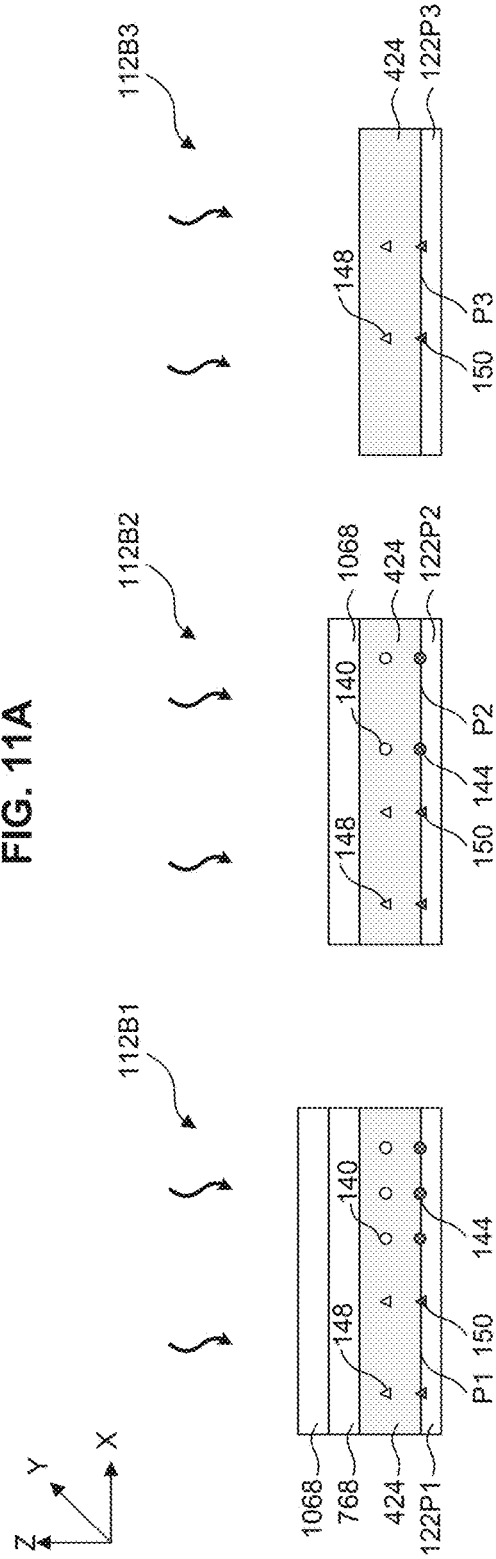
Figure 12A:
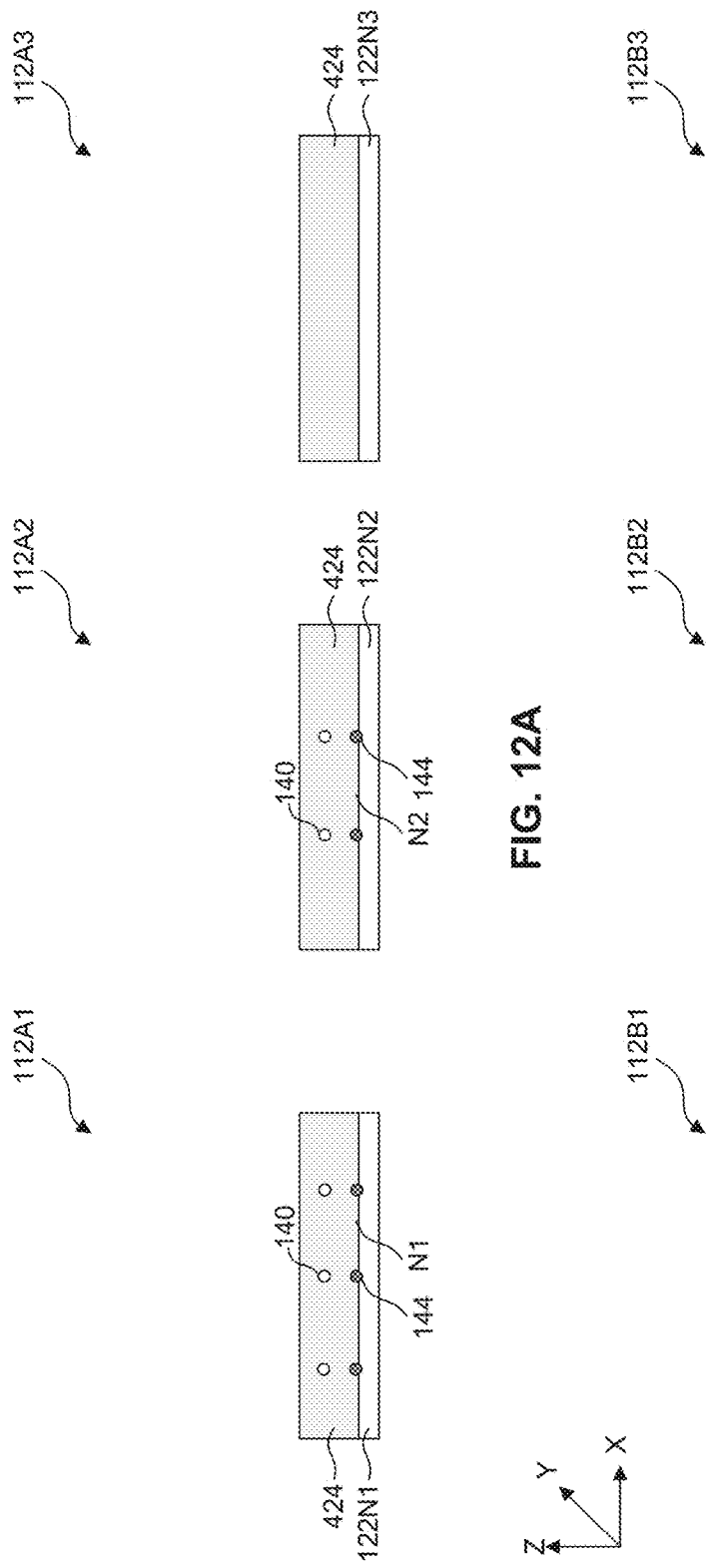
Figure 12B:
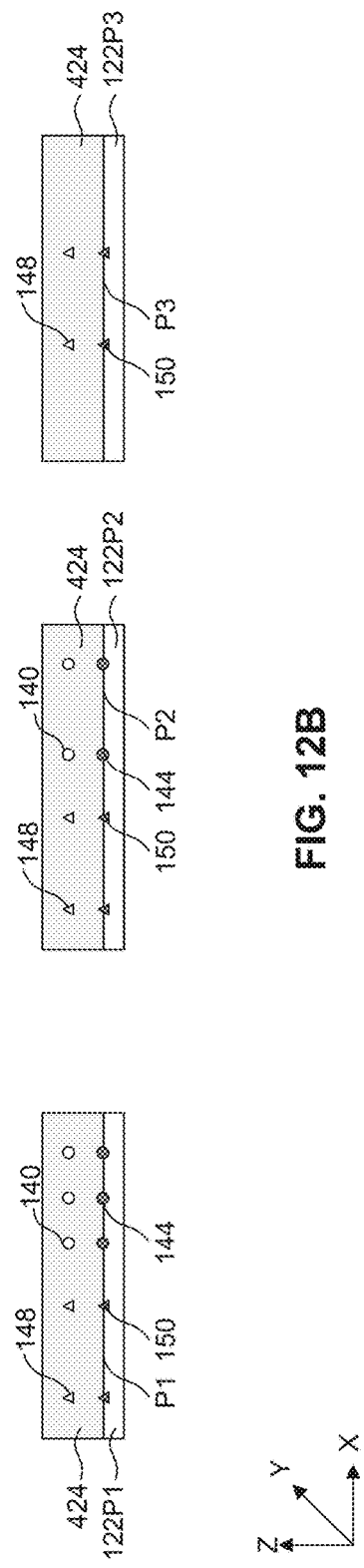

Referring to FIG. 2, in operation 225, a doping process is performed to dope the HK gate dielectric layer with a second type metal dopant that induces N-dipoles. For example, as described with reference to FIGS. 7A-12B, a doping process is performed to dope portions of HK gate dielectric layer 424 in gate regions 112A1-112A2 and 112B1-112B2 with metal dopants 140 that induces P-dipoles 144. The doping process can include sequential operations of (i) depositing a dopant source layer 768 on HK gate dielectric layer 424, as shown in FIGS. 7A-7B, (ii) depositing capping layer 566 on dopant source layer 768, as shown in FIGS. 7A-7B, (iii) selectively removing portions of dopant source layer 564 and capping layer 566 from gate regions 112A2-112A3 and 112B2-112B3 by using lithographic patterning and etching processes to form the structures of FIGS. 8A-8B, (iv) selectively removing portions of capping layer 566 from gate regions 112A1 and 112B1 by using lithographic patterning and etching processes to form the structures of FIGS. 9A-9B, (v) depositing a dopant source layer 1068 on the structures of FIGS. 9A-9B, as shown in FIGS. 10A-10B, (vi) depositing capping layer 566 on dopant source layer 1068 to form the structures of FIGS. 10A-10B, (vii) selectively removing portions of dopant source layer 1068 and capping layer 566 from gate regions 112A3 and 112B3 by using lithographic patterning and etching processes, as shown in FIGS. 11A-11B, (viii) removing portions of capping layer 566 from gate regions 112A1-112A2 and 112B1-112B2 to form the structures of FIGS. 11A-11B, (ix) performing a drive-in anneal process on the structures of FIGS. 11A-1B to implant metal dopants 140 into portions of HK gate dielectric layers 424 in gate regions 112A1-112A2 and 112B1-112B2, as shown in FIGS. 11A-11B, and (iv) removing dopant source layers 768 and 1068, and capping layer 566 from the structures of FIGS. 11A-11B to form the structures of FIGS. 12A-12B.

The deposition of dopant source layer 768 can include depositing a layer of REM oxide, such as lanthanum oxide ($La_2O_3$), yttrium oxide ($Y_2O_3$), cerium oxide ($CeO_2$), ytterbium oxide ($Yb_2O_3$), and erbium oxide ($Er_2O_3$), or a layer of ALM oxide, such as such as magnesium oxide (MgO), calcium oxide (CaO), strontium oxide (SrO), and barium oxide (BaO) in a CVD process or ALD process. In some embodiments, dopant source layer 768 can be deposited with a thickness of about 0.1 nm to about 5 nm to adequately perform the doping process without compromising manufacturing cost. In some embodiments, the discussion of dopant source layer 768 applies to dopant source layer 1068, unless mentioned otherwise. The two layers of dopant source layers 768 and 1068 implant a higher concentration of dopants 140 into portions of HK gate dielectric layer 424 in gate regions 112A1-112B1 than that implanted from dopant source 1068 layer into portions of HK gate dielectric layer 424 in gate regions 112A2-112B2.

The drive-in anneal process can implant metal dopants 140 into HK gate dielectric layer 424 through diffusion of metal atoms from dopant source layers 768 and 1068 into HK gate dielectric layer 424. The drive-in anneal process can be similar to the drive-in anneal process described in operation 220.

Figure 13A:
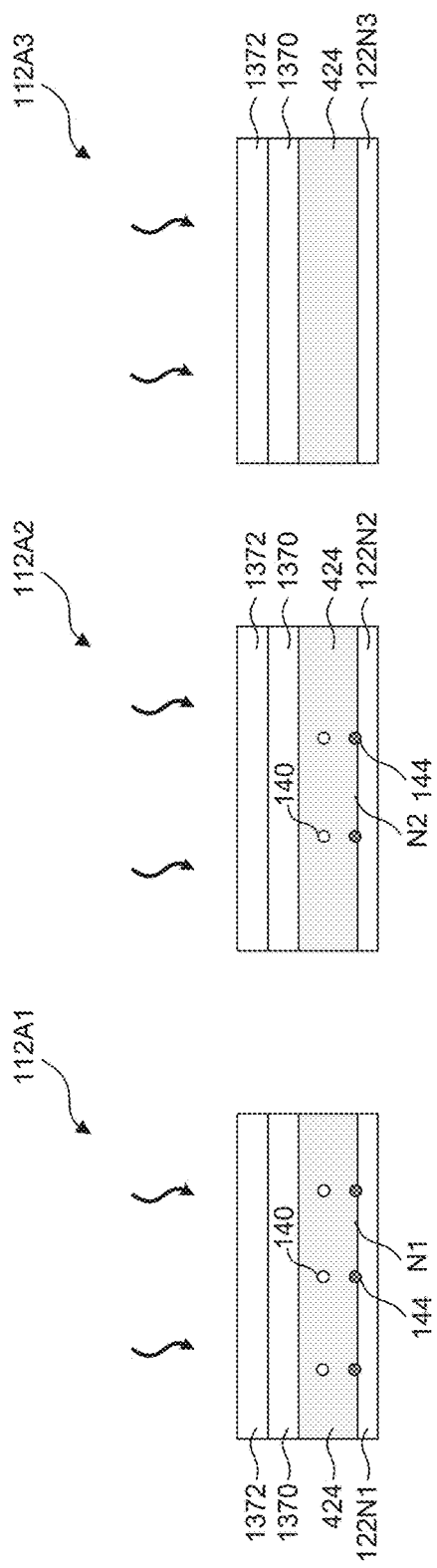
Figure 13B:
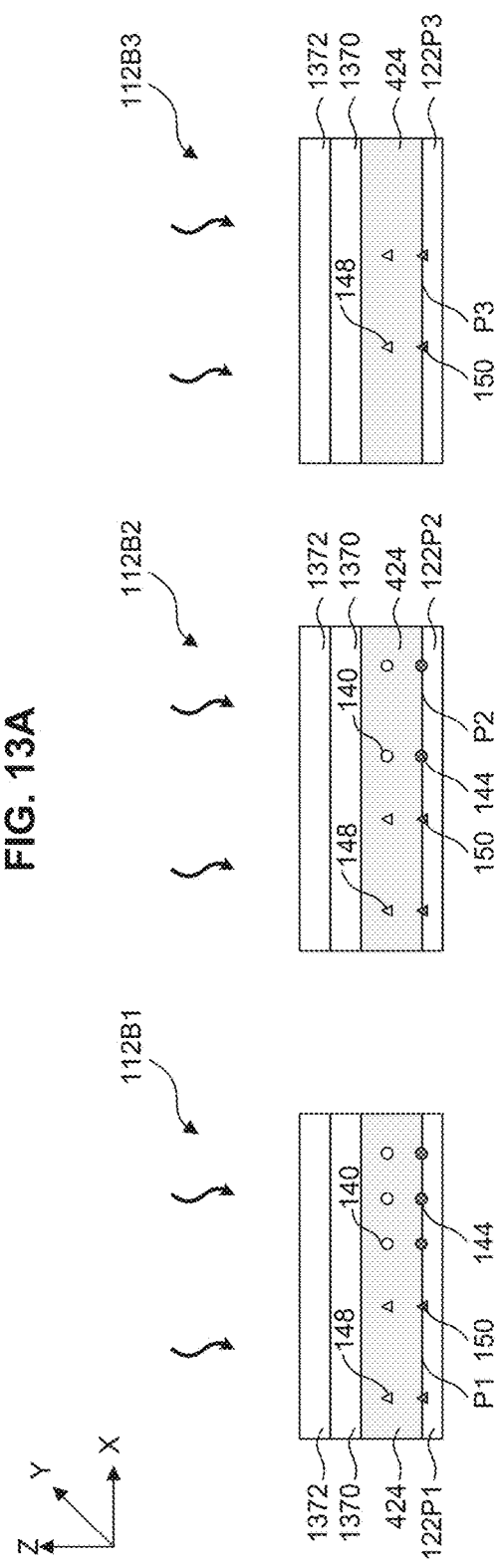

Referring to FIG. 2, in operation 230, a two-stage annealing process is performed on the NFET and PFET. For example, as described with reference to FIGS. 13A-14B, a two-stage annealing process is performed on the structures of FIGS. 12A-12B to improve the electrical characteristics and/or reliability of IL layers 122N1-122N3 and 122P1-122P3 and/or HK gate dielectric layer 424. The first-stage annealing process can include sequential operations of (i) depositing a metal nitride capping layer 1370 on HK gate dielectric layer 424, as shown in FIGS. 13A-13B, (ii) in-situ depositing a Si capping layer 1372 on metal nitride capping layer 1370, as shown in FIGS. 13A-13B, and (iii) performing a first spike annealing process on the structures of FIGS. 13A-13B.

In some embodiments, metal nitride capping layer 1370 can include TiSiN or TiN and can be deposited by an ALD or a CVD process using titanium tetrachloride ($TiCl_4$), silane ($SiH_4$), and ammonia ($NH_3$) as precursors at a temperature of about 400° C. to about 500° C. The in-situ deposition of Si capping layer 1372 can include an ALD, a CVD, or a PVD process. In some embodiments, the in-situ deposition of Si capping layer 1372 can include a soaking process with $TiCl_4$ and $SiH_4$ gases at a temperature of about 400° C. to about 500° C. The soaking process can include flowing $TiCl_4$ gas for a time period ranging from about 80 seconds to about 100 seconds and then flowing $SiH_4$ gas for a time period of about 100 seconds to about 200 seconds on metal nitride capping layer 1370. In some embodiments, Si capping layer 1356 can include Si or its compound and/or can include amorphous or polycrystalline Si. Si capping layer 1372 can prevent oxidation of IL layers 122N1-122N3 and 122P1-122P3 and/or HK gate dielectric layer 424 during subsequent annealing process. The first spike annealing process can include performing an annealing process in a nitrogen ambient at an annealing temperature of about 600° C. to about 1000° C. for a time period of about 1 second to about 60 seconds.

Figure 14A:
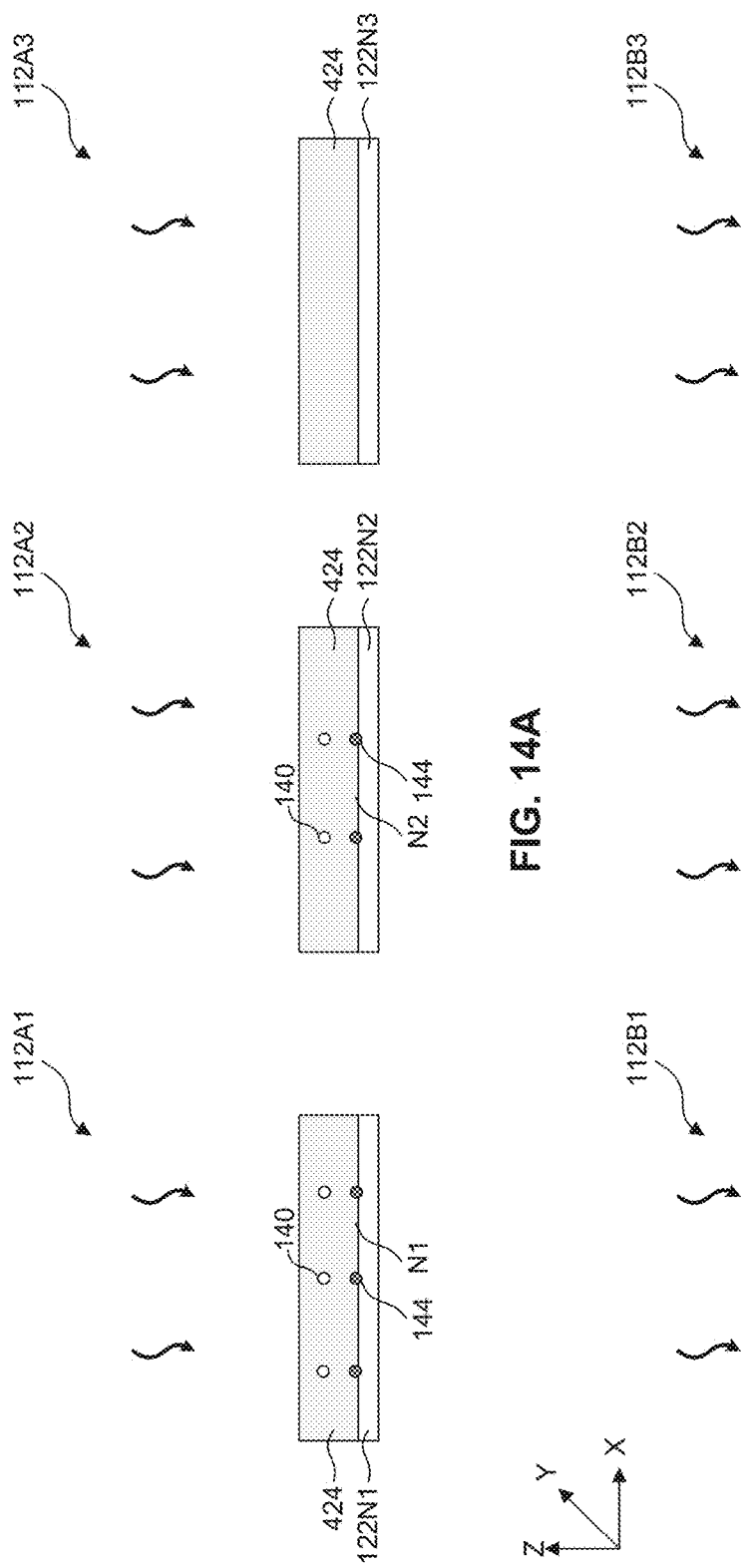
Figure 14B:
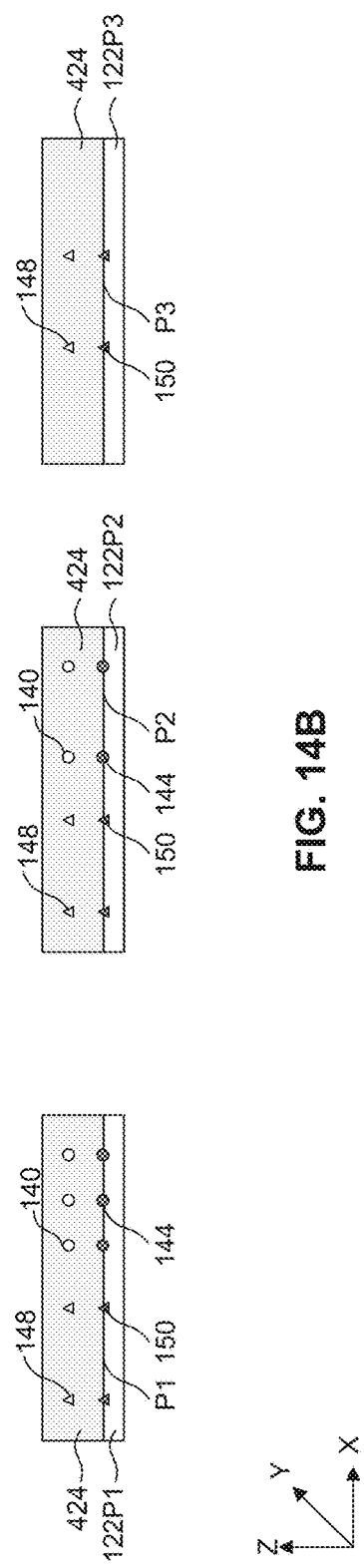

The second-stage annealing process can include sequential steps of (i) removing metal nitride layer 1370 and in-situ Si capping layer 1372 after the first-stage annealing process, as shown in FIGS. 14A-14B, and (ii) performing a second spike annealing process on the structures of FIGS. 14A-14B. Metal nitride layer 1370 and in-situ Si capping layer 1372 can be removed by a wet etching process. In some embodiments, the wet etching process can include etching in DHF, KOH solution, SCl solution, or a combinations thereof. The second spike annealing process can be performed in an NH3 ambient at an annealing temperature ranging from about 600° C. to about 1000° C. for a time period of about 1 second to about 60 seconds. In some embodiments, the annealing temperatures of the first and second spike annealing processes can be similar to or different from each other.

Figure 15A:
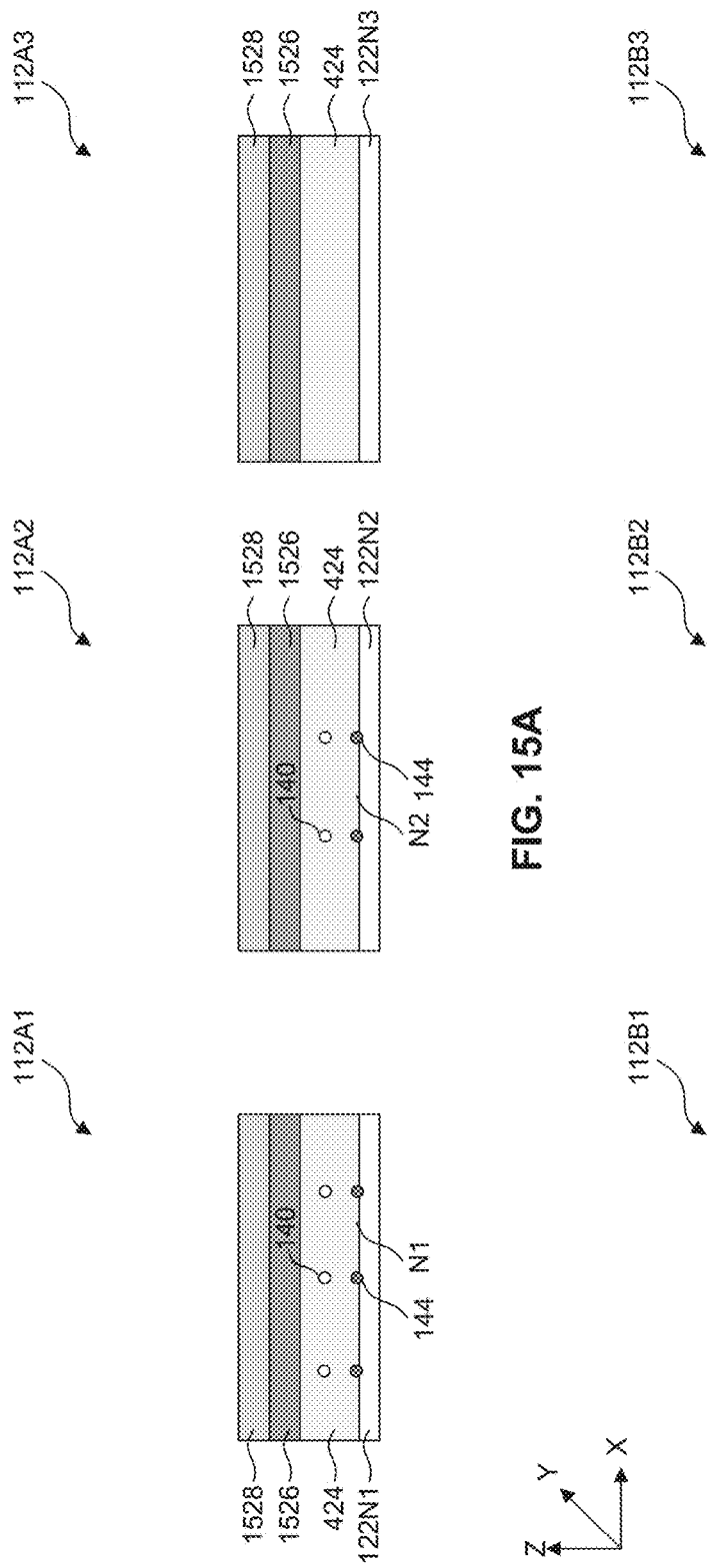
Figure 15B:
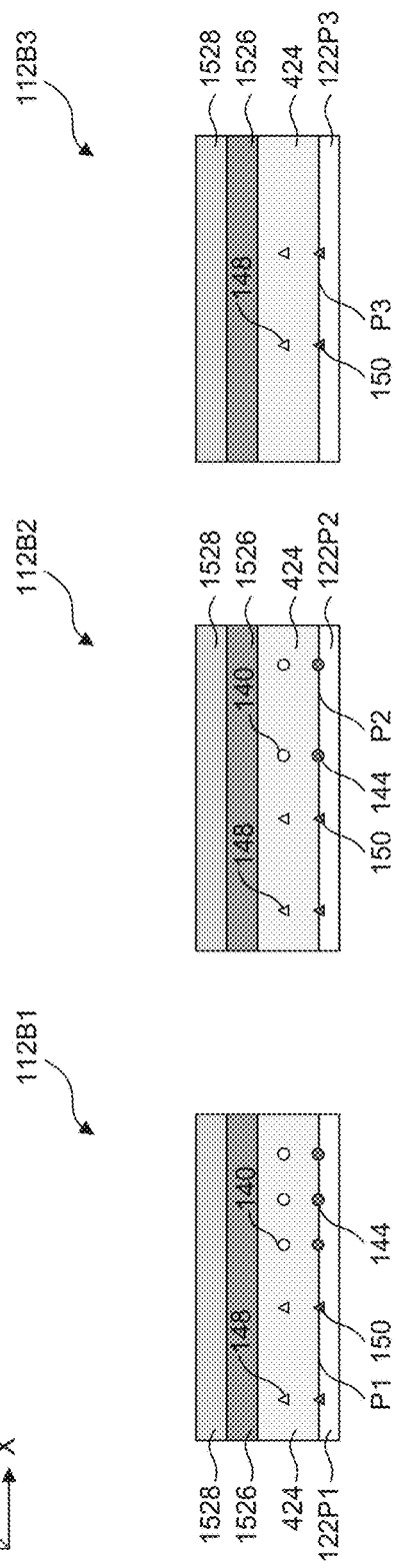

Referring to FIG. 2, in operation 235, a WFM layer is deposited on the HK gate dielectric layer and a gate metal fill layer is deposited on the WFM layer. For example, as shown in FIGS. 15A-15B, a WFM layer 1526 is deposited on HK gate dielectric layer 424 and a gate metal fill layer 1528 is deposited on WFM layer 1526. The deposition of gate metal fill layer 1528 can be followed by a chemical mechanical polishing (CMP) process and an etching process on the structures of FIGS. 15A-15B to form HK gate dielectric layers 124N1-124N2 and 124P1-124P2, WFM layers 126, and gate metal fill layers 128, as shown in FIGS. 1B-1C. The etching process can be followed by the formation of conductive capping layers 130 and insulating capping layers 132.

Referring to FIG. 2, in operation 240, contact structures are formed on the S/D regions. For example, as shown in FIGS. 1B-1C, contact structures 120 can be formed on S/D regions 110N-110P.

Figure 16:
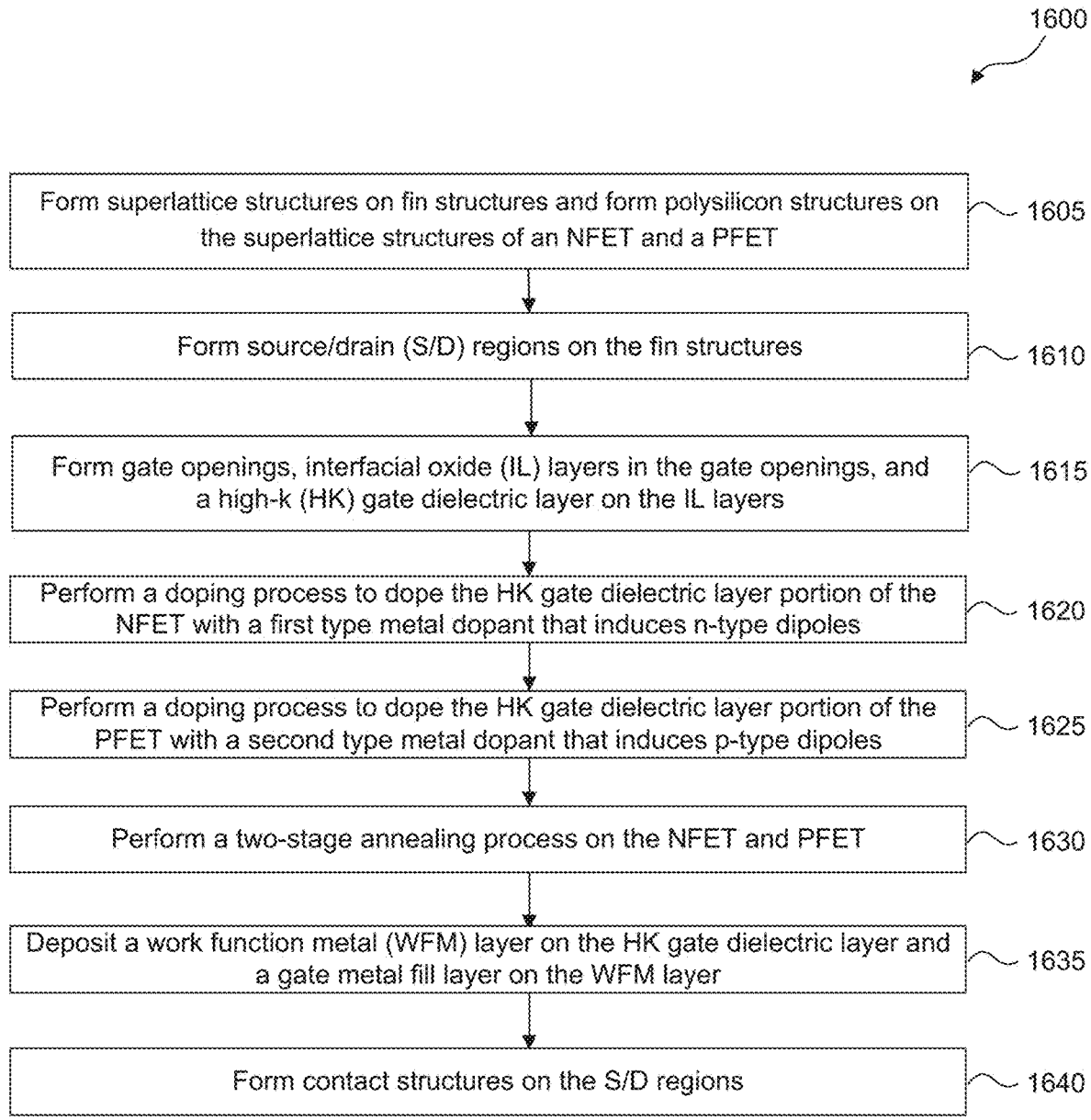
FIG. 16 is a flow diagram of another method for fabricating a semiconductor device with different gate structures, in accordance with some embodiments.

FIG. 16 is a flow diagram of an example method 1600 for fabricating NFET 102N and PFET 102P with cross-sectional views shown in FIGS. 1H and 1I, according to some embodiments. For illustrative purposes, the operations illustrated in FIG. 16 will be described with reference to the example fabrication process for fabricating NFET 102N and PFET 102P as illustrated in FIGS. 17A-25B. FIGS. 17A-25A are cross-sectional views of NFET 102N along line A-A of FIG. 1A, and FIGS. 17B-25B are cross-sectional views of PFET 102P along line B-B of FIG. 1A at various stages of fabrication, according to some embodiments. Operations can be performed in a different order or not performed depending on specific applications. It should be noted that method 1600 may not produce a complete NFET 102N and PFET 102P. Accordingly, it is understood that additional processes can be provided before, during, and after method 1600, and that some other processes may only be briefly described herein. Elements in FIGS. 17A-25B with the same annotations as elements in FIGS. 1A-1I are described above.

Referring to FIG. 16, operations 1605-1615 are similar to operations 205-215 of FIG. 2. After operation 1615, structures similar to the structures of FIGS. 4A-4B are formed. The subsequent processing on the structures of FIGS. 4A-4B in operations 1620-1635 are described with reference to FIGS. 17A-25B. FIGS. 17A-25A are enlarged views of gate regions 112A1-112A3 of FIG. 4A and FIGS. 17B-25B are enlarged views of gate regions 112B1-112B3 of FIG. 4B.

Figure 19A:
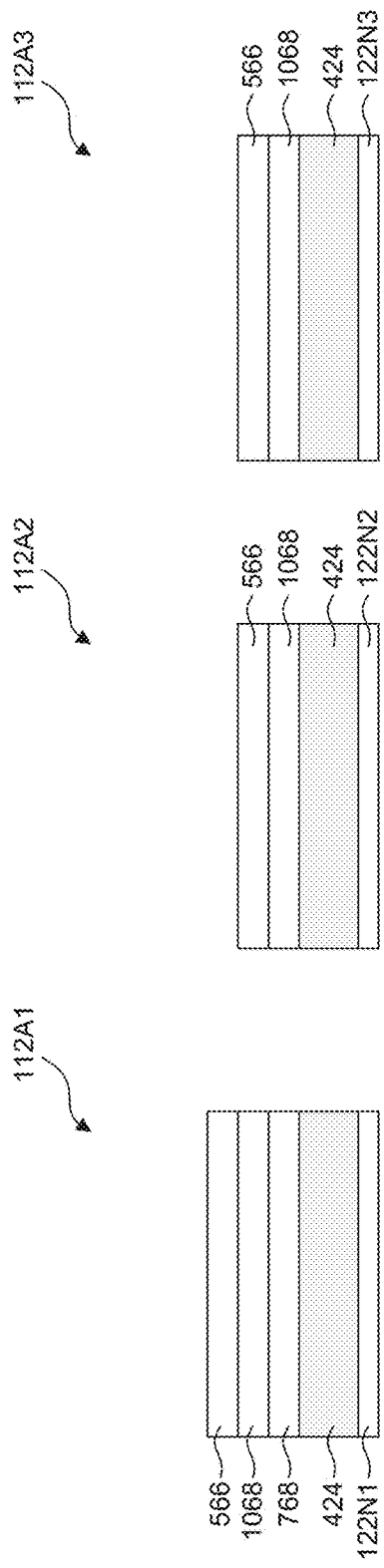
Figure 19B:
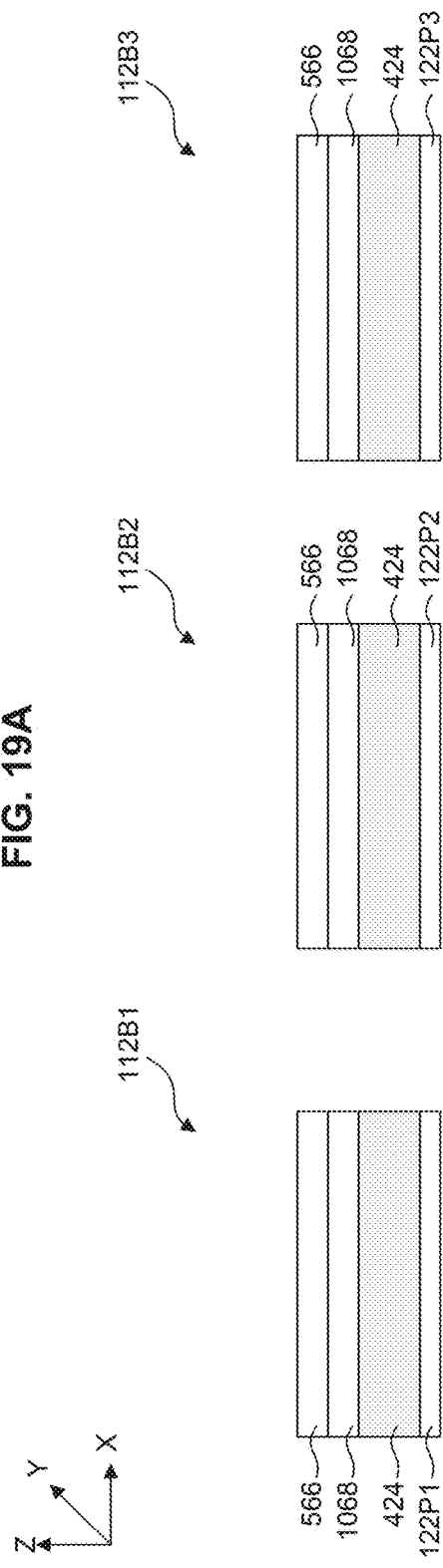

Referring to FIG. 16, in operation 1620, a doping process is performed to dope the HK gate dielectric layer portion of the NFET with a first type metal dopant that induces N-dipoles. For example, as described with reference to FIGS. 17A-20B, a doping process is performed to dope portions of HK gate dielectric layer 424 in gate regions 112A1-112A2 with metal dopants 140 that induces N-dipoles 144. The doping process can include sequential operations of (i) depositing a dopant source layer 768 on HK gate dielectric layer 424, as shown in FIGS. 17A-17B, (ii) depositing a capping layer 566 on dopant source layer 768, as shown in FIGS. 17A-17B, (iii) selectively removing portions of dopant source layer 768 and capping layer 566 from gate regions 112A2-112A3 and 112B1-112B3 by using lithographic patterning and etching processes to form the structures of FIGS. 18A-18B, (iv) depositing a dopant source layer 1068 on the structures of FIGS. 18A-18B, as shown in FIGS. 19A-19B, (v) depositing capping layer 566 on dopant source layer 1068 to form the structures of FIGS. 19A-19B, (vi) selectively removing portions of dopant source layer 1068 and capping layer 566 from gate regions 112A3 and 112B1-112B3 by using lithographic patterning and etching processes, as shown in FIGS. 20A-20B, (vii) removing portions of capping layer 566 from gate region 112A1-112A2 to form the structures of FIGS. 20A-20B, (viii) performing a drive-in anneal process on the structures of FIGS. 20A-20B to implant metal dopants 140 into portions of HK gate dielectric layer 424 in gate regions 112A1-112A2, as shown in FIG. 20A, and (iv) removing dopant source layers 768 and 1068, and capping layer 566 from the structures of FIG. 20A.

The drive-in anneal process can implant metal dopants 140 into HK gate dielectric layer 424 through diffusion of metal atoms from dopant source layers 768 and 1068 into HK gate dielectric layer 424. The drive-in anneal process can be similar to the drive-in anneal process described in operation 220.

Figure 21A:
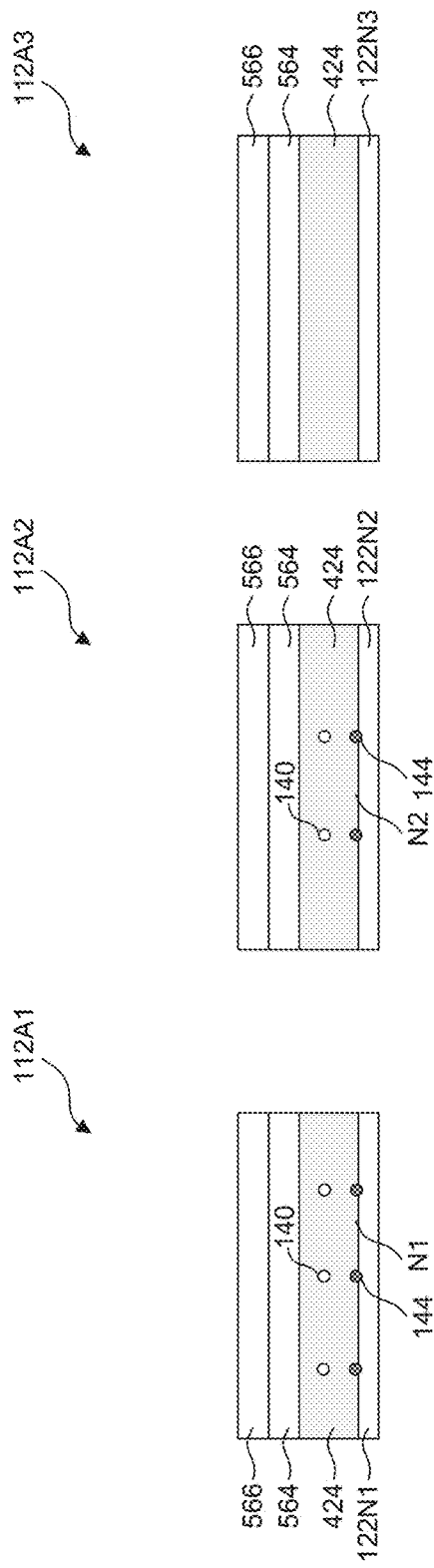
Figure 21B:
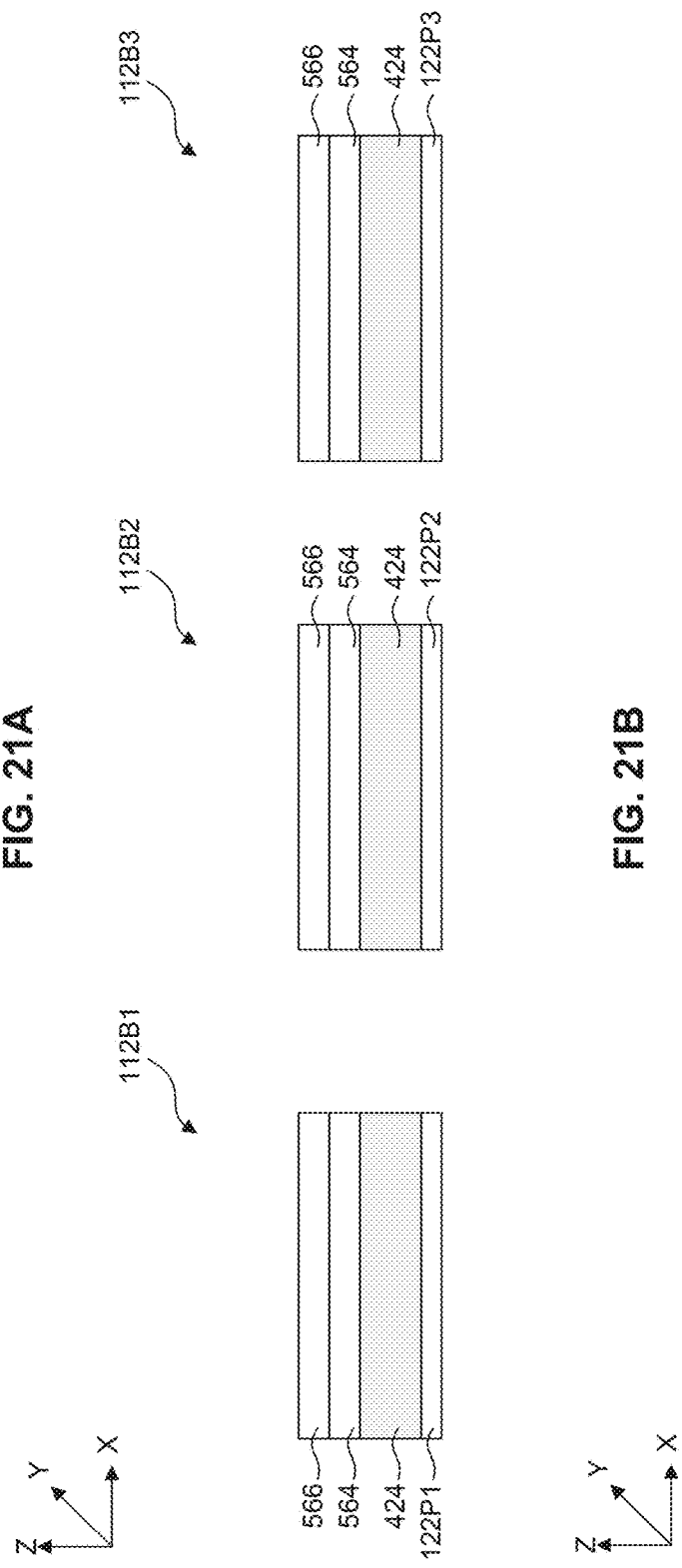
Figure 23A:
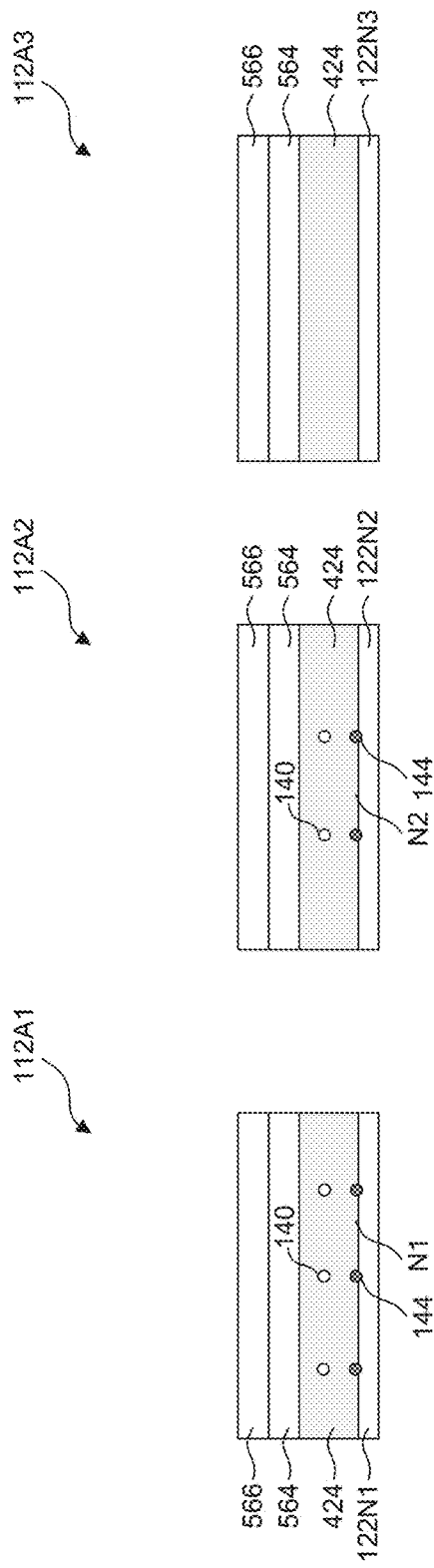
Figure 23B:
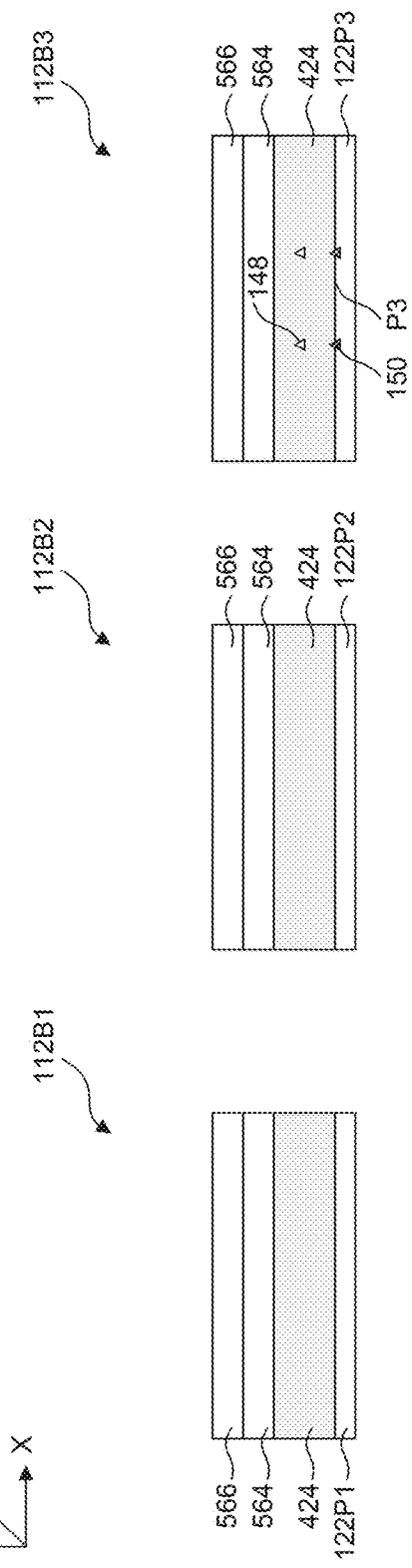

Referring to FIG. 16, in operation 1625, a doping process is performed to dope the HK gate dielectric layer portion of the PFET with a second type metal dopant that induces P-dipoles. For example, as described with reference to FIGS. 21A-24B, a doping process is performed to dope portions of HK gate dielectric layer 424 in gate regions 112B2-112B3 with metal dopants 148 that induces P-dipoles 150. The doping process can include sequential operations of (i) depositing dopant source layer 564 on HK gate dielectric layer 424, as shown in FIGS. 21A-21B, (ii) depositing capping layer 566 on dopant source layer 564, as shown in FIGS. 21A-21B, (iii) selectively removing portions of dopant source layer 564 and capping layer 566 from gate regions 112A1-112A3 and 112B1-112B2 by using lithographic patterning and etching processes to form the structures of FIGS. 22A-22B, (iv) performing a first drive-in anneal process on the structures of FIGS. 22A-22B to implant metal dopants 148 into portions of HK gate dielectric layer 424 in gate region 112B3, as shown in FIGS. 22A-22B, (iv) removing dopant source layer 564 and capping layer 566 from the structures of FIG. 22B, (v) repeating operations (i) and (ii) to form the structures of FIGS. 23A-23B, (vi) selectively removing portions of dopant source layer 564 and capping layer 566 from gate regions 112A1-112A3 and 112B1 by using lithographic patterning and etching processes to form the structures of FIGS. 24A-24B, (vii) performing a second drive-in anneal process on the structures of FIGS. 24A-24B to implant metal dopants 148 into portions of HK gate dielectric layer 424 in gate region 112B2-112B3, as shown in FIG. 24B, and (iv) removing dopant source layer 564 and capping layer 566 from the structures of FIG. 24B to form the structures of FIGS. 25A-25B. The first and second drive-in anneal processes can be similar to the drive-in anneal process described in operation 220.

Figure 25A:
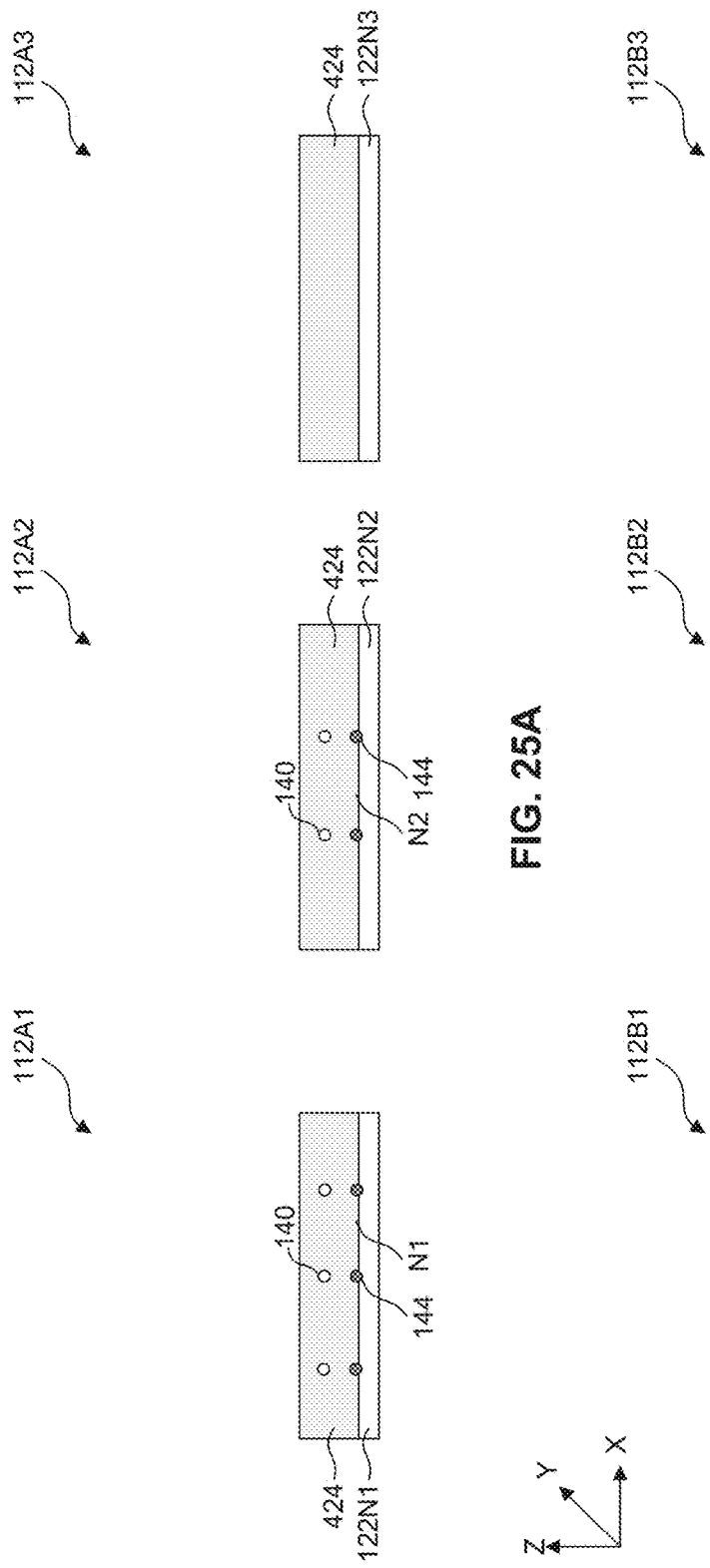
Figure 25B:
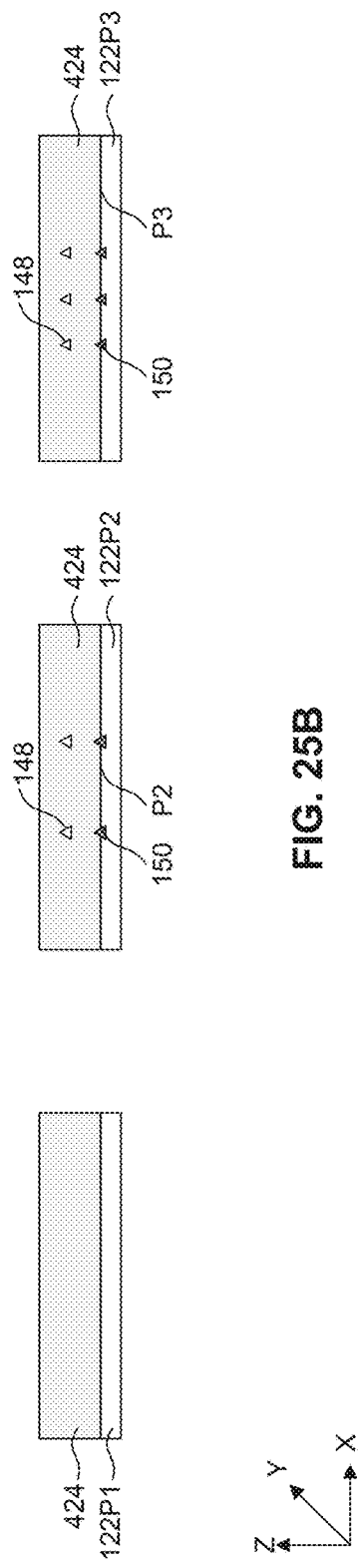

Referring to FIG. 16, operations 1630-1640 are similar to operations 230-240, respectively, of FIG. 2 and are performed on the structures of FIGS. 25A-25B to form the structures of FIGS. 1B-1C.

Figure 26:
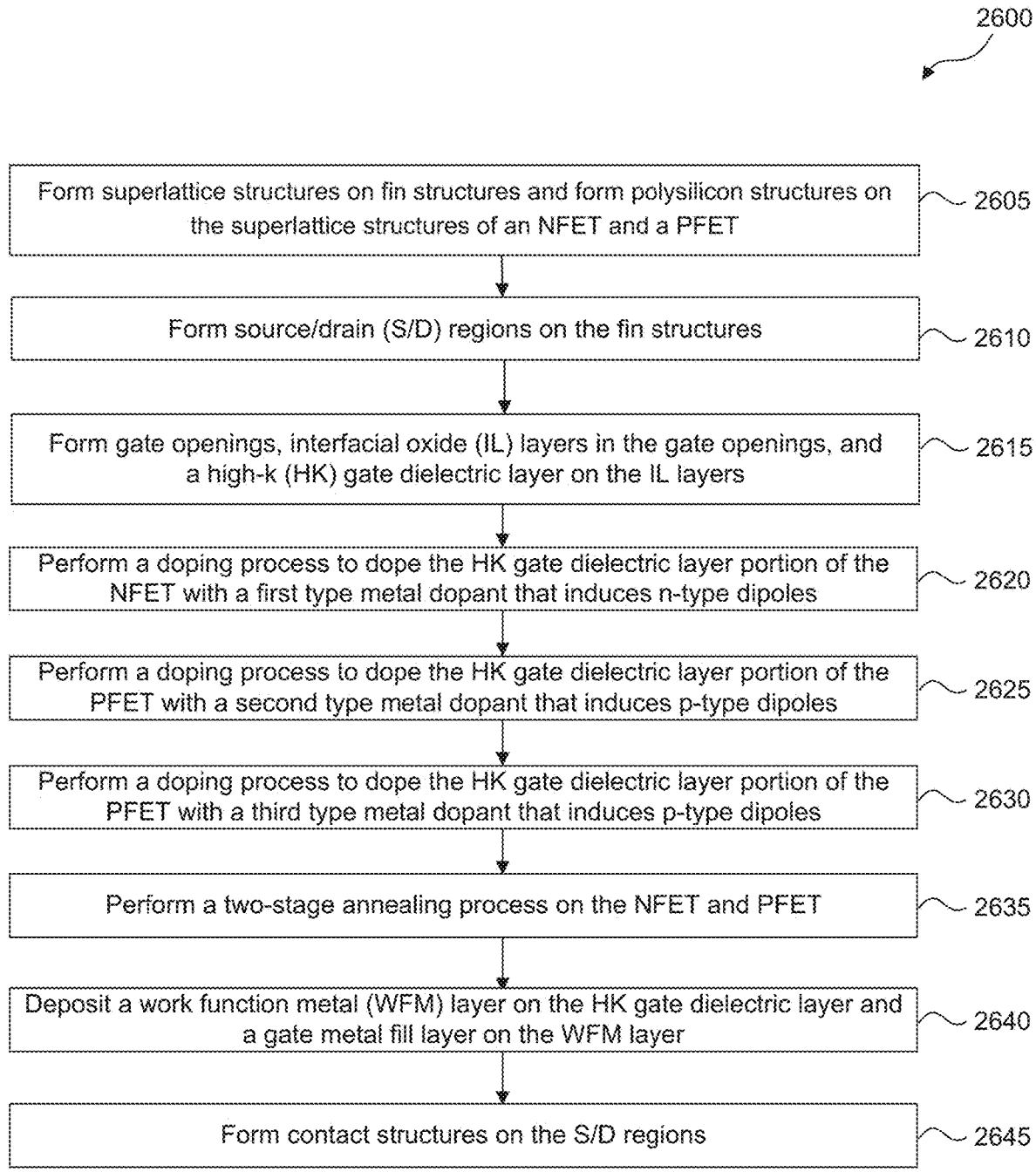
FIG. 26 is a flow diagram of another method for fabricating a semiconductor device with different gate structures, in accordance with some embodiments.

FIG. 26 is a flow diagram of an example method 2600 for fabricating NFET 102N and PFET 102P with cross-sectional views shown in FIGS. 1J and 1K, according to some embodiments. For illustrative purposes, the operations illustrated in FIG. 26 will be described with reference to the example fabrication process for fabricating NFET 102N and PFET 102P as illustrated in FIGS. 27A-30B. FIGS. 27A-30A are cross-sectional views of NFET 102N along line A-A of FIG. 1A, and FIGS. 27B-30B are cross-sectional views of PFET 102P along line B-B of FIG. 1A at various stages of fabrication, according to some embodiments. Operations can be performed in a different order or not performed depending on specific applications. It should be noted that method 2600 may not produce a complete NFET 102N and PFET 102P. Accordingly, it is understood that additional processes can be provided before, during, and after method 2600, and that some other processes may only be briefly described herein. Elements in FIGS. 27A-30B with the same annotations as elements in FIGS. 1A-1K are described above. FIGS. 27A-30A are enlarged views of gate regions 112A1-112A3 of FIG. 4A and FIGS. 27B-30B are enlarged views of gate regions 112B1-112B3 of FIG. 4B.

Referring to FIG. 26, operations 2605-2620 are similar to operations 1605-1620, respectively, of FIG. 16. After operation 1620, structures similar to the structures of FIGS. 20A-20B are formed.

Referring to FIG. 26, in operation 2625, a doping process is performed to dope the HK gate dielectric layer portion of the PFET with a second type metal dopant that induces P-dipoles. For example, as shown in FIG. 27B, a doping process is performed to dope a portion of HK gate dielectric layer 424 in gate region 112B3 with metal dopants 148 that induces P-dipoles 150. The doping process is similar to the doping process described in operation 1625 with reference to FIGS. 21A-22B.

Referring to FIG. 26, in operation 2630, a doping process is performed to dope the HK gate dielectric layer portion of the PFET with a third type metal dopant that induces P-dipoles. For example, as described with reference to FIGS. 28A-30B, a doping process is performed to dope portions of HK gate dielectric layer 424 in gate regions 112B2-112B3 with metal dopants 154 that induces P-dipoles 158. The doping process can include sequential operations of (i) depositing dopant source layer 2874 on HK gate dielectric layer 424, as shown in FIGS. 28A-28B, (ii) depositing capping layer 566 on dopant source layer 2874, as shown in FIGS. 28A-28B, (iii) selectively removing portions of dopant source layer 2874 and capping layer 566 from gate regions 112A1-112A3 and 112B1 by using lithographic patterning and etching processes to form the structures of FIGS. 29A-29B, (iv) performing a first drive-in anneal process on the structures of FIGS. 29A-29B to implant metal dopants 154 into portions of HK gate dielectric layer 424 in gate regions 112B2-112B3, as shown in FIG. 29B, and (iv) removing dopant source layer 2874 and capping layer 566 from the structures of FIG. 29B to form the structures of FIGS. 30A-30B.

In some embodiments, dopant source layer 2874 can include a layer of GTM oxide or TRM oxide that is different from the material of dopant source layer 564. The deposition of dopant source layer 2874 can include depositing a layer of GTM oxide or a layer of TRM oxide with a thickness of about 0.1 nm to about 5 nm to adequately perform the doping process without compromising manufacturing cost.

Referring to FIG. 26, operations 2635-2645 are similar to operations 230-240, respectively, of FIG. 2 and are performed on the structures of FIGS. 30A-30B to form the structures of FIGS. 1B-1C.

The present disclosure provides example structures of FETs (e.g., NFET 102N and PFET 102P) with different gate structures (e.g., gate structures 112N1-112N3 and 112P1-112P3) configured to provide different and/or low threshold voltages, and example methods of forming such multi-Vt FETs on the same substrate. The example methods form NFETs and PFETs with WFM layer of similar thicknesses, but with ultra-low, low, and/or different threshold voltages, on the same substrate. These example methods can be more cost-effective (e.g., reduce cost by about 20% to about 30%) and time-efficient (e.g., reduce time by about 15% to about 20%) in manufacturing reliable FET gate structures with different low and/or ultra-low threshold voltages than other methods of forming FETs with similar dimensions and threshold voltages on the same substrate. In addition, these example methods can form FET gate structures with much smaller dimensions (e.g., thinner gate stacks) than other methods of forming FETs with similar threshold voltages.

In some embodiments, NFETs and PFETs with different gate structure configurations, but with similar WFM layer thicknesses, can be selectively formed on the same substrate to achieve low, ultra-low and/or different threshold voltages. The different gate structures can have HK gate dielectric layers (e.g., HK gate dielectric layers 124N1-124N2 and 124P1-124P3) doped with metal dopants (e.g., metal dopants 140 and 148) of different types and/or concentrations. The different types and/or concentrations of metal dopants can induce dipoles (e.g., dipoles 144 and 150) of different polarities and/or concentrations at interfaces between the HK gate dielectric layers and IL layers. The dipoles of different polarities and/or concentrations result in gate structures with different EWF values. Since EWF values of gate structures correspond to threshold voltage of FETs, gate structures with different EWF values result in FETs with different threshold voltages on the same substrate. Thus, controlling the types and/or concentrations of metal dopants in the HK gate dielectric layers can tune the EWF values of the NFET and PFET gate structures, and as a result can adjust the threshold voltages of the NFETs and PFETs without varying the WFM layer thicknesses.

In some embodiments, a semiconductor device includes a first gate structure and a second gate structure. The first gate structure includes a first interfacial oxide (IO) layer, a first high-K (HK) dielectric layer disposed on the first interfacial oxide layer, and a first dipole layer disposed at an interface between the first IL layer and the first HK dielectric layer. The HK dielectric layer includes a rare-earth metal dopant or an alkaline metal dopant. The second gate structure includes a second IL layer, a second HK dielectric layer disposed on the second IL layer, and a second dipole layer disposed at an interface between the second IL layer and the second HK dielectric layer. The second HK dielectric layer includes a transition metal dopant and the rare-earth metal dopant or the alkaline metal dopant.

In some embodiments, a semiconductor device includes a substrate, a fin structure disposed on the substrate, first and second nanostructured channel regions disposed on the fin structure, a first gate structure disposed on the first nanostructured channel region, and a second gate structure disposed on the second nanostructured channel region. The first gate structure includes a first dielectric layer disposed on the first nanostructured channel region, and a p-type dipole layer disposed between the first dielectric layer and the first nanostructured channel region. The dielectric layer includes transition metal dopants. The second gate structure includes a second dielectric layer disposed on the second nanostructured channel region, and a dipole layer with n-type dipoles and p-type dipoles disposed between the second dielectric layer and the second nanostructured channel region. The dielectric layer includes the transition metal dopants and alkaline metal dopants.

In some embodiments, a method includes forming first and second fin structures on a substrate, forming first and second nanostructured channel regions on the first and second fin structures, respectively, depositing a gate dielectric layer with first and second portions surrounding the first and second nanostructured channel regions, respectively, depositing a transition metal-based layer on the gate dielectric layer, removing a portion of the transition metal-based layer on the first portion of the gate dielectric layer, performing a first anneal process on the transition metal-based layer, removing the transition metal-based layer, depositing an alkaline metal-based layer on the gate dielectric layer, performing a second anneal process on the alkaline metal-based layer, removing the alkaline metal-based layer, depositing a work function metal layer on the gate dielectric layer, and depositing a gate metal fill layer on the work function metal layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gate structure comprising:
      a first interfacial oxide (IL) layer;
      a first high-K (HK) dielectric layer disposed on the first IL layer, wherein the HK dielectric layer comprises a rare-earth metal dopant or an alkaline metal dopant; and
      a first dipole layer disposed at an interface between the first IL layer and the first HK dielectric layer; and
   a second gate structure comprising:
      a second IL layer,
      a second HK dielectric layer disposed on the second IL layer, wherein the second HK dielectric layer comprises:
         a transition metal dopant, and
         the rare-earth metal dopant or the alkaline metal dopant,
         wherein peak concentrations of the transition metal dopant and the rare-earth metal dopant or the alkaline metal dopant in the second HK dielectric layer is at the interface between the second IL layer and the second HK dielectric layer; and
      a second dipole layer disposed at an interface between the second IL layer and the second HK dielectric layer.

2. The semiconductor device of claim 1, wherein the first dipole layer comprises rare-earth metal-based dipoles or alkaline metal-based dipoles.

3. The semiconductor device of claim 1, wherein the first dipole layer comprises n-type dipoles.

4. The semiconductor device of claim 1, wherein the second dipole layer comprises transition metal-based dipoles and rare-earth metal-based dipoles or alkaline metal-based dipoles.

5. The semiconductor device of claim 1, wherein the second dipole layer comprises n-type dipoles and p-type dipoles.

6. The semiconductor device of claim 1, wherein a concentration of the rare-earth metal dopant in the first HK dielectric layer is substantially equal to a concentration of the rare-earth metal dopant in the second HK dielectric layer.

7. The semiconductor device of claim 1, wherein a concentration of the rare-earth metal dopant in the first HK dielectric layer is greater than a concentration of the transition metal dopant in the second HK dielectric layer.

8. The semiconductor device of claim 1, wherein a concentration of the rare-earth metal dopant in the second HK dielectric layer is greater than a concentration of the transition metal dopant in the second HK dielectric layer.

9. The semiconductor device of claim 1, wherein a peak concentration of the rare-earth metal dopant or the alkaline metal dopant in the first HK dielectric layer is at the interface between the first IL layer and the first HK dielectric layer.

10. The semiconductor device of claim 1, wherein the second dipole layer comprises zinc-based p-type dipoles and lanthanum-based n-type dipoles.

11. A semiconductor device, comprising:
    a substrate;
    a fin structure disposed on the substrate;
    first and second nanostructured channel regions disposed on the fin structure;
    a first gate structure disposed on the first nanostructured channel region, the first gate structure comprising:
       a first oxide layer disposed on the first nanostructured channel region;
       a first dielectric layer disposed on the first oxide layer, wherein the first dielectric layer comprises transition metal dopants, and wherein a peak concentration of the transition metal dopants is at an interface between the first oxide layer and the first dielectric layer; and
       a p-type dipole layer disposed between the first dielectric layer and the first nanostructured channel region; and
    a second gate structure disposed on the second nanostructured channel region, the second gate structure comprising:
       a second oxide layer disposed on the second nanostructured channel region;
       a second dielectric layer disposed on the second oxide layer, wherein the second dielectric layer comprises the transition metal dopants and alkaline metal dopants, and wherein peak concentrations of the transition metal dopants and alkaline metal dopants are at an interface between the second oxide layer and the second dielectric layer; and
       a dipole layer with n-type dipoles and p-type dipoles disposed between the second dielectric layer and the second nanostructured channel region.

12. The semiconductor device of claim 11, wherein a concentration of the transition metal dopants in the first dielectric layer is substantially equal to a concentration of the transition metal dopants in the second dielectric layer.

13. The semiconductor device of claim 11, wherein a concentration of the transition metal dopants in the first dielectric layer is greater than a concentration of the alkaline metal dopants in the second dielectric layer.

14. The semiconductor device of claim 11, wherein the dipole layer comprises zinc-based p-type dipoles and magnesium-based n-type dipoles.

15. The semiconductor device of claim 11, wherein a concentration of p-type dipoles in the p-type dipole layer is substantially equal to a concentration of the p-type dipoles in the dipole layer.

16. The semiconductor device of claim 11, wherein a concentration of the p-type dipoles in the dipole layer is greater than a concentration of the n-type dipoles in the dipole layer.

17. A semiconductor device, comprising:
a substrate;
a gate oxide layer disposed on the substrate;
a gate dielectric layer comprising gallium dopants and zinc dopants disposed on the gate oxide layer, wherein peak concentrations of the gallium dopants and the zinc dopants are at an interface between the gate oxide layer and the gate dielectric layer:
a dipole layer with first and second p-type dipoles disposed between the gate oxide layer and the gate dielectric layer,
a work function metal layer disposed on the gate dielectric layer; and
a gate metal fill layer disposed on the work function metal layer.

18. The semiconductor device of claim 17, wherein a concentration of the first p-type dipoles is equal to a concentration of the second p-type dipoles.

19. The semiconductor device of claim 17, wherein a total peak concentration of the gallium dopants and the zinc dopants in the gate dielectric layer is about 70 atomic % to about 80 atomic %.

20. The semiconductor device of claim 17, wherein concentrations of the metal gallium dopants and the zinc dopants are equal to each other.

* * * * *